United States Patent
Suzuki et al.

(10) Patent No.: US 11,004,523 B2
(45) Date of Patent: *May 11, 2021

(54) NONVOLATILE MEMORY AND MEMORY SYSTEM

(71) Applicant: Toshiba Memory Corporation, Minato-ku (JP)

(72) Inventors: Riki Suzuki, Yokohama (JP); Masanobu Shirakawa, Chigasaki (JP); Yoshihisa Kojima, Kawasaki (JP); Marie Takada, Yokohama (JP); Tsukasa Tokutomi, Kamakura (JP)

(73) Assignee: Toshiba Memory Coiporation, Minato-ku (JP)

( * ) Notice: Subject to any disclaimer, the term of this patent is extended or adjusted under 35 U.S.C. 154(b) by 0 days.

This patent is subject to a terminal disclaimer.

(21) Appl. No.: 17/007,596

(22) Filed: Aug. 31, 2020

(65) Prior Publication Data

US 2020/0402596 A1 Dec. 24, 2020

Related U.S. Application Data

(63) Continuation of application No. 16/429,588, filed on Jun. 3, 2019, now Pat. No. 10,796,776.

(30) Foreign Application Priority Data

Sep. 3, 2018 (JP) .............................. JP2018-164450

(51) Int. Cl.
*G11C 16/04* (2006.01)
*G11C 16/34* (2006.01)
(Continued)

(52) U.S. Cl.
CPC ............ *G11C 16/3431* (2013.01); *G11C 7/08* (2013.01); *G11C 7/106* (2013.01); *G11C 7/109* (2013.01);
(Continued)

(58) Field of Classification Search
CPC ... G11C 16/3431; G11C 7/08; G11C 16/3459; G11C 7/1087; G11C 16/08;
(Continued)

(56) References Cited

U.S. PATENT DOCUMENTS 8,654,590 B2   2/2014  Aritome et al.
9,502,129 B1 *  11/2016  Suzuki .................. G06F 3/0659
(Continued)

FOREIGN PATENT DOCUMENTS

WO    WO 2016/084497 A1    6/2016

*Primary Examiner* — Uyen Smet
(74) *Attorney, Agent, or Firm* — Oblon, McClelland, Maier & Neustadt, L.L.P.

(57) ABSTRACT

According to one embodiment, a nonvolatile memory includes: a memory cell array including memory cells; and a controller configured to execute a first refresh process on receiving a first command. The first refresh process includes reprogramming at least one second memory cell among first memory cells to which data has been programmed in a first group. In executing the first refresh process, the controller is configured to: select the second memory cell by verifying with a first voltage using a first amount in a case where the second memory cell has been programmed using the first voltage; and select the second memory cell by verifying with a second voltage using a second amount in a case where the second memory cell has been programmed using the second voltage.

23 Claims, 30 Drawing Sheets

(51) Int. Cl.
  *G11C 7/08* (2006.01)
  *G11C 7/10* (2006.01)
  *G11C 16/08* (2006.01)
  *G11C 16/16* (2006.01)
  *G11C 16/26* (2006.01)

(52) U.S. Cl.
  CPC .......... *G11C 7/1063* (2013.01); *G11C 7/1087* (2013.01); *G11C 16/08* (2013.01); *G11C 16/16* (2013.01); *G11C 16/26* (2013.01); *G11C 16/3404* (2013.01); *G11C 16/3459* (2013.01)

(58) Field of Classification Search
  CPC ..... G11C 16/3404; G11C 7/109; G11C 16/26; G11C 7/1063; G11C 16/16; G11C 7/106
  See application file for complete search history.

(56) References Cited

U.S. PATENT DOCUMENTS

| | | |
|---|---|---|
| 10,031,865 B2 | 7/2018 | Terada et al. |
| 2008/0068912 A1 | 3/2008 | Lee |
| 2009/0267128 A1 | 10/2009 | Maejima |
| 2009/0268522 A1 | 10/2009 | Maejima |
| 2010/0157671 A1 | 6/2010 | Mokhlesi |
| 2010/0207195 A1 | 8/2010 | Fukuzumi et al. |
| 2010/0214838 A1 | 8/2010 | Hishida et al. |
| 2011/0284946 A1 | 11/2011 | Kiyotoshi |
| 2012/0069663 A1 | 3/2012 | Itagaki et al. |
| 2012/0307557 A1 | 12/2012 | Itagaki |
| 2014/0059396 A1 | 2/2014 | Matsuyama et al. |

\* cited by examiner

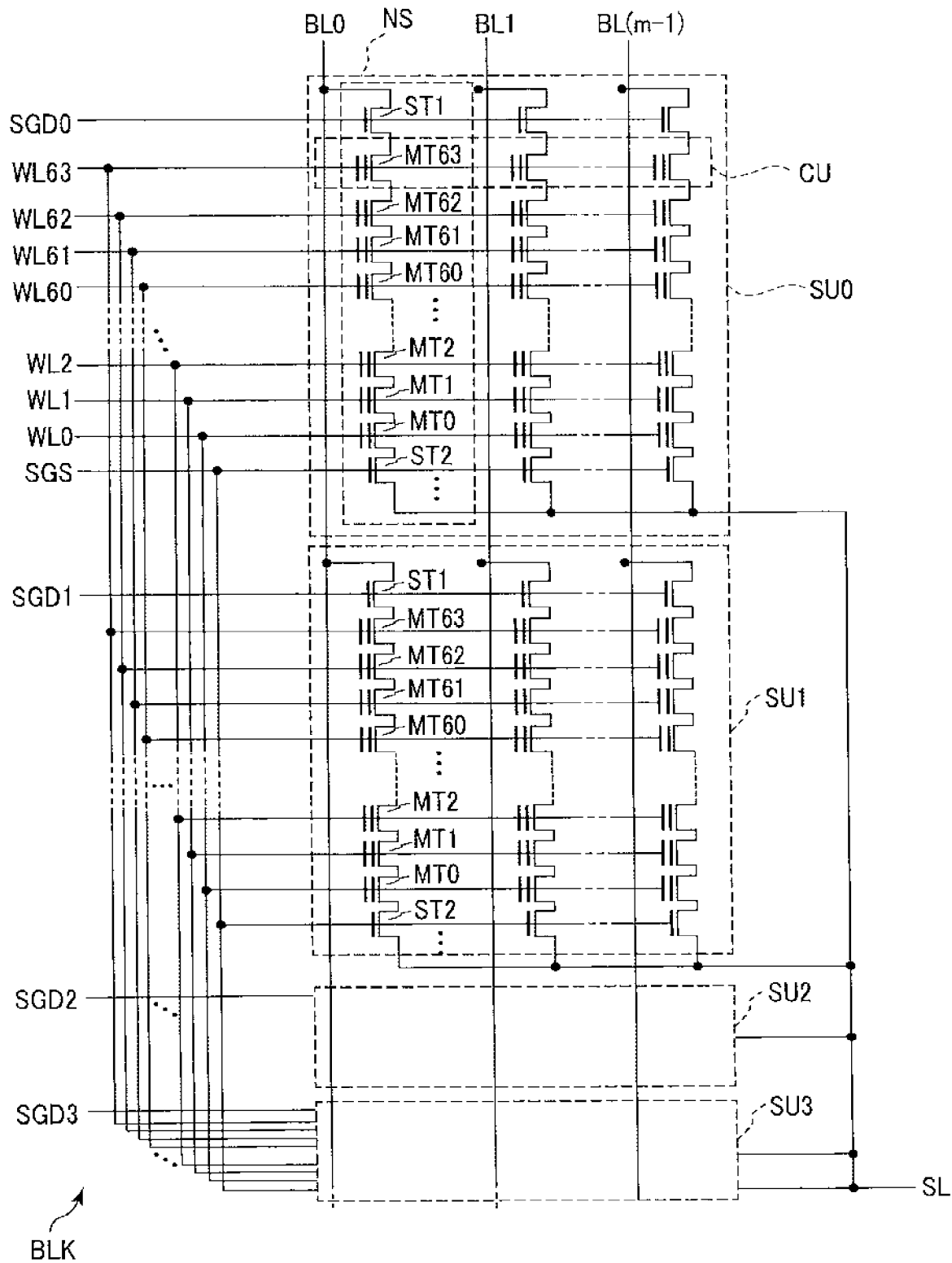
F I G. 2

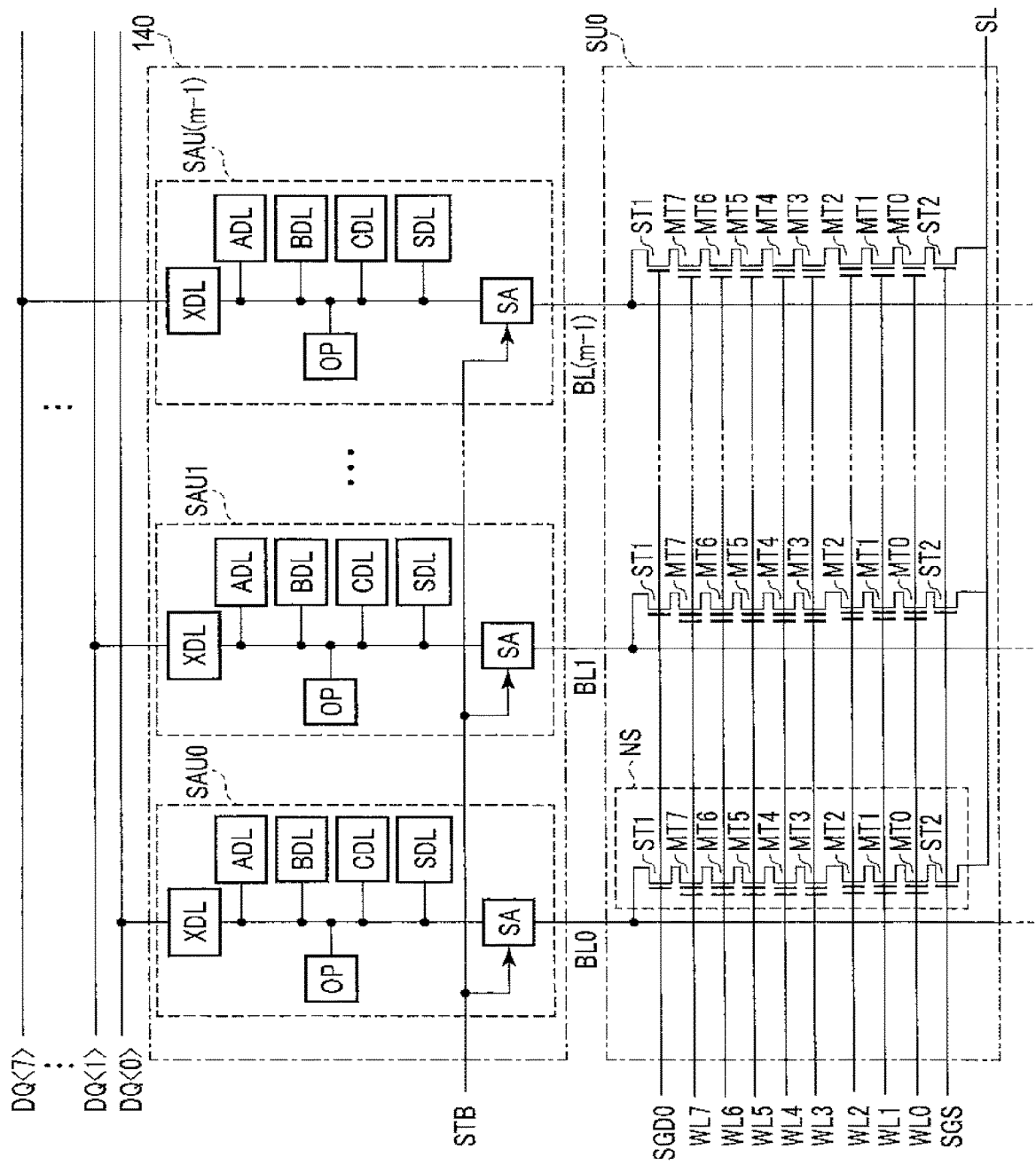
F I G. 5

| SHIFT INDEX | AMOUNT OF SHIFT | | | | | | |
|---|---|---|---|---|---|---|---|
| | AR | BR | CR | DR | ER | FR | GR |
| 0 | 0 | 0 | 0 | 0 | 0 | 0 | 0 |
| 1 | $\Delta VA1$ | $\Delta VB1$ | $\Delta VC1$ | $\Delta VD1$ | $\Delta VE1$ | $\Delta VF1$ | $\Delta VG1$ |
| 2 | $\Delta VA2$ | $\Delta VB2$ | $\Delta VC2$ | $\Delta VD2$ | $\Delta VE2$ | $\Delta VF2$ | $\Delta VG2$ |
| 3 | $\Delta VA3$ | $\Delta VB3$ | $\Delta VC3$ | $\Delta VD3$ | $\Delta VE3$ | $\Delta VF3$ | $\Delta VG3$ |
| 4 | $\Delta VA4$ | $\Delta VB4$ | $\Delta VC4$ | $\Delta VD4$ | $\Delta VE4$ | $\Delta VF4$ | $\Delta VG4$ |
| 5 | $\Delta VA5$ | $\Delta VB5$ | $\Delta VC5$ | $\Delta VD5$ | $\Delta VE5$ | $\Delta VF5$ | $\Delta VG5$ |

F I G. 6

| BLOCK/WORD LINE | | SHIFT INDEX |
|---|---|---|
| BLK0 | WL0 | 1 |
| | WL1-WL7 | 0 |
| | WL8-WL11 | 0 |
| | ⋮ | ⋮ |
| | WL55-WL62 | 2 |
| | WL63 | 3 |
| BLK1 | WL0 | 1 |
| | WL1-WL7 | 0 |
| | WL8-WL11 | 0 |
| | ⋮ | ⋮ |
| | WL55-WL62 | 1 |
| | WL63 | 2 |
| ⋮ | ⋮ | ⋮ |

F I G. 7

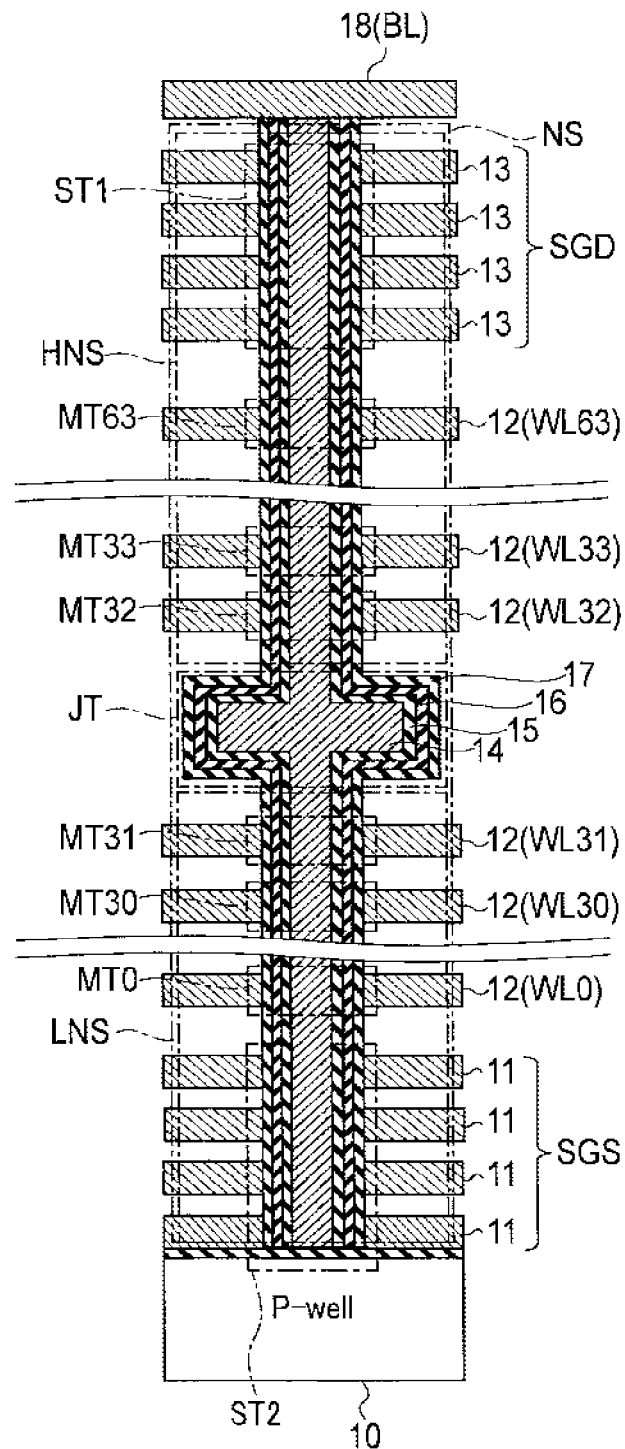
F I G. 8

| BLOCK/WORD LINE | | REPROGRAMMING REFRESH FLAG | BLOCK REFRESH FLAG |
|---|---|---|---|
| BLK0 | WL0 | — | — |
| | WL1–WL7 | — | |
| | WL8–WL11 | — | |
| | ⋮ | ⋮ | |
| | WL55–WL62 | — | |
| | WL63 | 1 | |
| BLK1 | WL0 | — | 1 |
| | WL1–WL7 | — | |
| | WL8–WL11 | — | |
| | ⋮ | ⋮ | |
| | WL55–WL62 | — | |
| | WL63 | — | |
| ⋮ | ⋮ | ⋮ | ⋮ |

FIG. 9

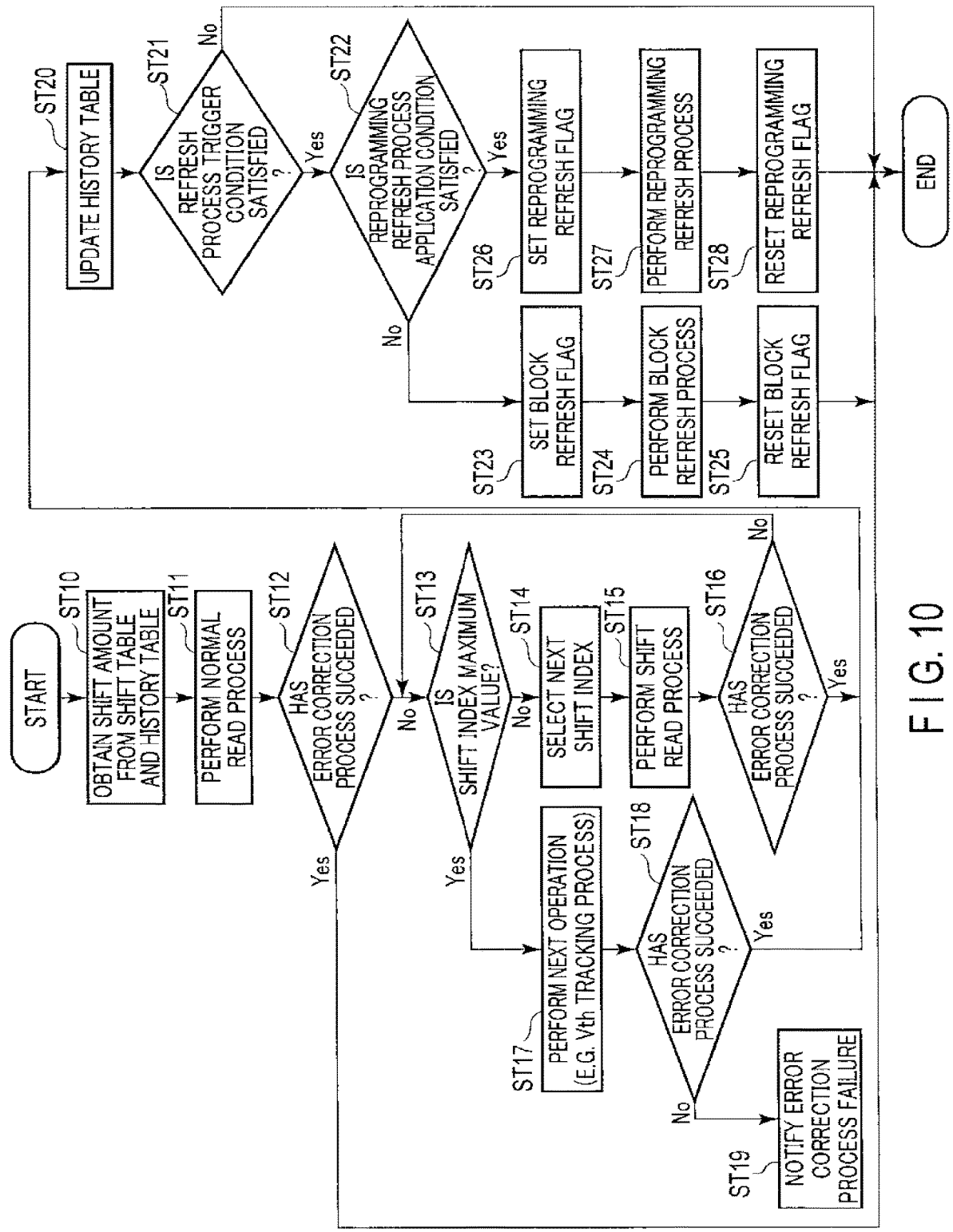
F I G. 10

| BLOCK/WORD LINE | | AMOUNT OF SHIFT | | | | | | |
|---|---|---|---|---|---|---|---|---|
| | | AR | BR | CR | DR | ER | FR | GR |
| BLK0 | WL0 | ΔVA1 | ΔVB1 | ΔVC1 | ΔVD1 | ΔVE1 | ΔVF1 | ΔVG1 |
| | WL1-WL7 | 0 | 0 | 0 | 0 | 0 | 0 | 0 |
| | WL8-WL11 | 0 | 0 | 0 | 0 | 0 | 0 | 0 |
| | ⋮ | ⋮ | | | | | | |
| | WL55-WL62 | ΔVA2 | ΔVB2 | ΔVC2 | ΔVD2 | ΔVE2 | ΔVF2 | ΔVG2 |
| | WL63 | ΔVA3 | ΔVB3 | ΔVC3 | ΔVD3 | ΔVE3 | ΔVF3 | ΔVG3 |

FIG. 11

| BLOCK/WORD LINE | | AMOUNT OF SHIFT | | | | | | |
|---|---|---|---|---|---|---|---|---|
| | | AR | BR | CR | DR | ER | FR | GR |
| BLK0 | WL0 | ΔVA1 | ΔVB1 | ΔVC1 | ΔVD1 | ΔVE1 | ΔVF1 | ΔVG1 |
| | WL1-WL7 | 0 | 0 | 0 | 0 | 0 | 0 | 0 |
| | WL8-WL11 | 0 | 0 | 0 | 0 | 0 | 0 | 0 |
| | ⋮ | ⋮ | | | | | | |
| | WL55-WL62 | ΔVA2 | ΔVB2 | ΔVC2 | ΔVD2 | ΔVE2 | ΔVF2 | ΔVG2 |
| | WL63 | ΔVA3→ΔVA4 | ΔVB3→ΔVB4 | ΔVC3→ΔVC4 | ΔVD3→ΔVD4 | ΔVE3→ΔVE4 | ΔVF3→ΔVF4 | ΔVG3→ΔVG4 |

FIG. 12

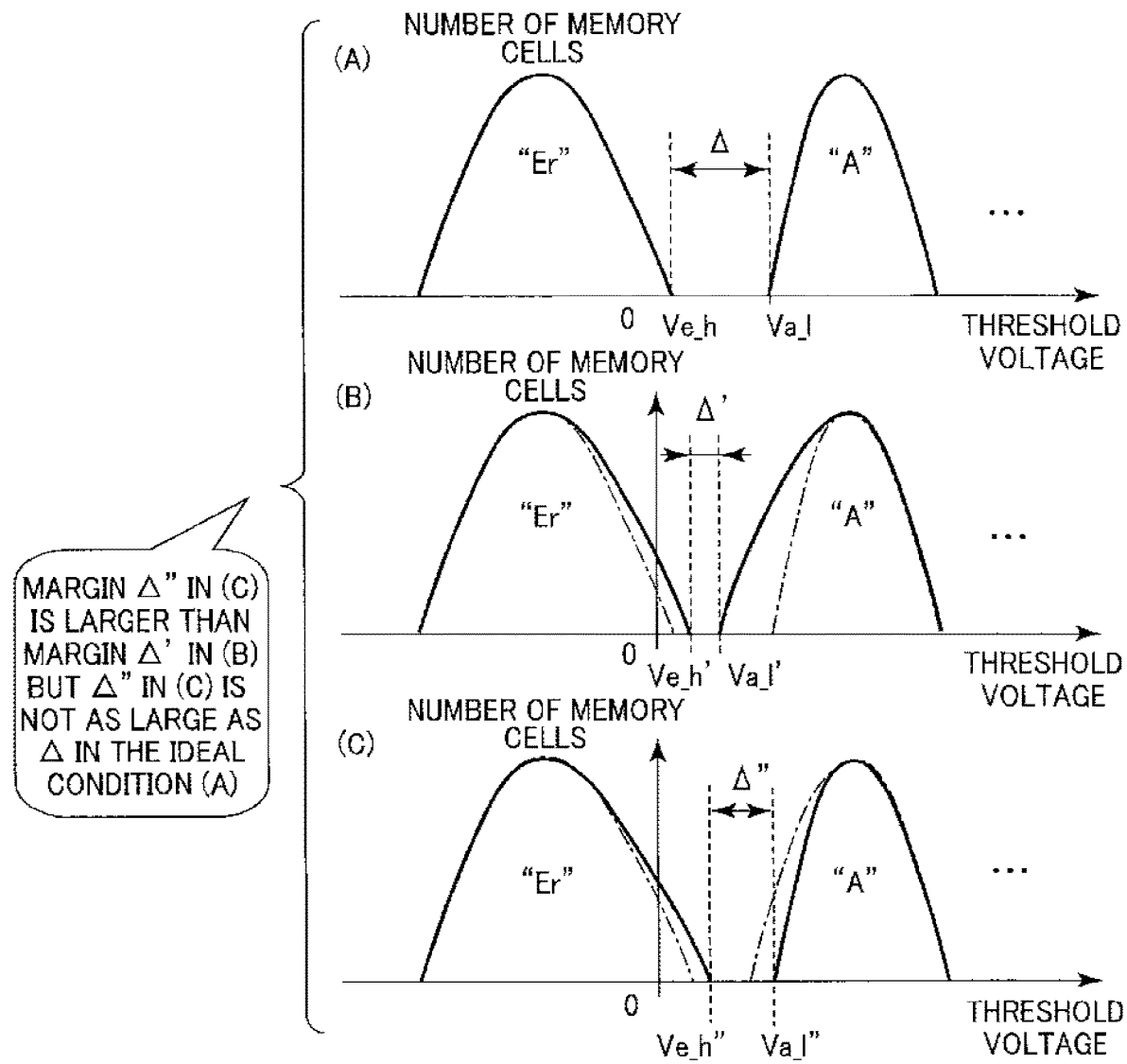
F I G. 13

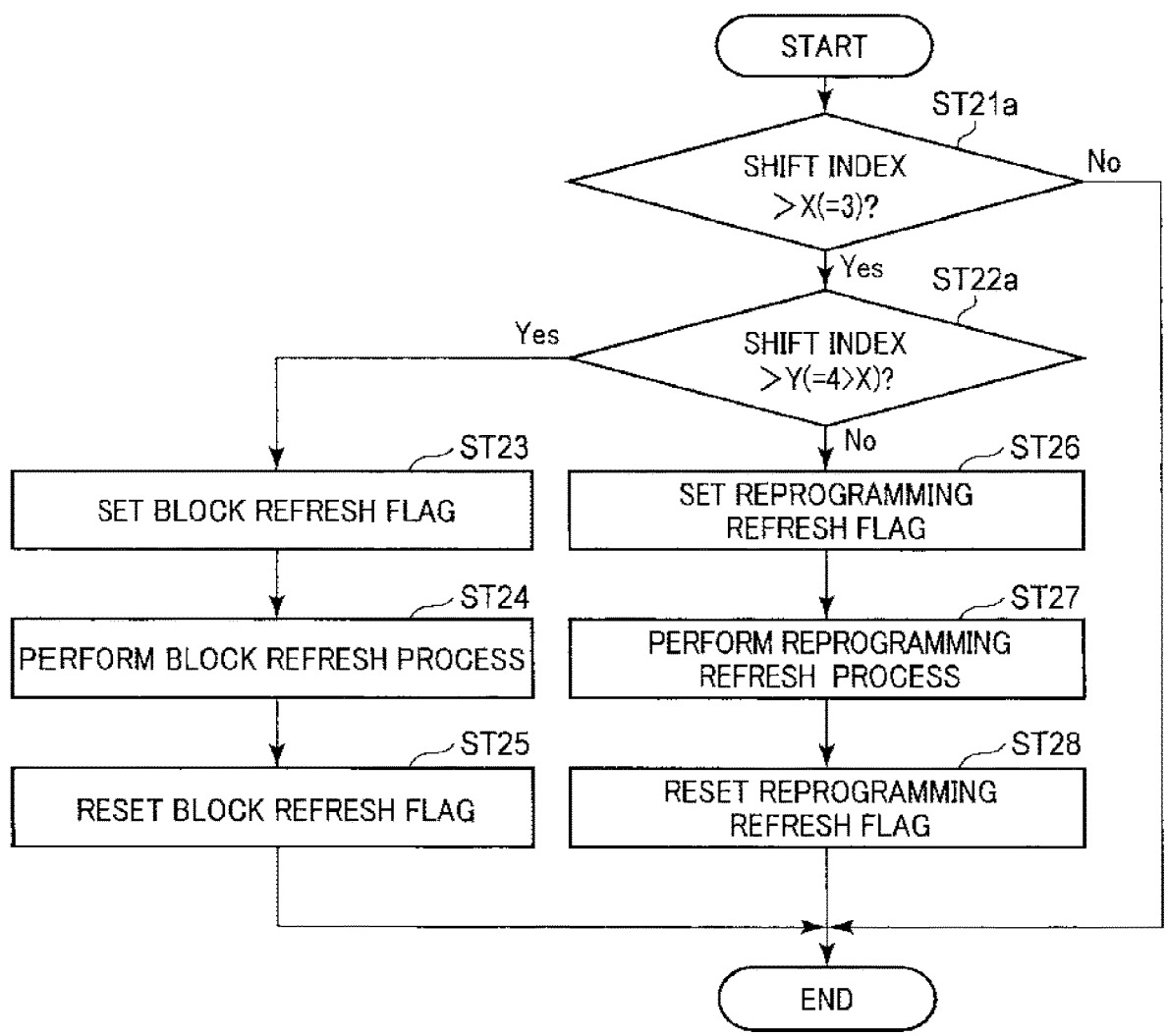
F I G. 14

| ADDRESS | | SET VALUE | ADDRESS | | SET VALUE |
|---|---|---|---|---|---|
| X1h | D0 | SHIFT AMOUNT ΔAvfy OF VERIFY VOLTAGE TO BE APPLIED TO PRE-VERIFY PROCESS FOR "A" STATE, FROM DEFAULT VALUE | X3h | D0 | SHIFT AMOUNT ΔApgm OF PROGRAM VOLTAGE TO BE APPLIED TO REPROGRAMMING PROCESS FOR "A" STATE, FROM DEFAULT VALUE |
| | D1 | SHIFT AMOUNT ΔBvfy OF VERIFY VOLTAGE TO BE APPLIED TO PRE-VERIFY PROCESS FOR "B" STATE, FROM DEFAULT VALUE | | D1 | SHIFT AMOUNT ΔBpgm OF PROGRAM VOLTAGE TO BE APPLIED TO REPROGRAMMING PROCESS FOR "B" STATE, FROM DEFAULT VALUE |
| | D2 | SHIFT AMOUNT ΔCvfy OF VERIFY VOLTAGE TO BE APPLIED TO PRE-VERIFY PROCESS FOR "C" STATE, FROM DEFAULT VALUE | | D2 | SHIFT AMOUNT ΔCpgm OF PROGRAM VOLTAGE TO BE APPLIED TO REPROGRAMMING PROCESS FOR "C" STATE, FROM DEFAULT VALUE |
| | D3 | SHIFT AMOUNT ΔDvfy OF VERIFY VOLTAGE TO BE APPLIED TO PRE-VERIFY FOR "D" STATE, FROM DEFAULT VALUE | | D3 | SHIFT AMOUNT ΔDpgm OF PROGRAM VOLTAGE TO BE APPLIED TO REPROGRAMMING PROCESS FOR "D" STATE, FROM DEFAULT VALUE |
| X2h | D0 | SHIFT AMOUNT ΔEvfy OF VERIFY VOLTAGE TO BE APPLIED TO PRE-VERIFY PROCESS FOR "E" STATE, FROM DEFAULT VALUE | X4h | D0 | SHIFT AMOUNT ΔEpgm OF PROGRAM VOLTAGE TO BE APPLIED TO REPROGRAMMING PROCESS FOR "E" STATE, FROM DEFAULT VALUE |
| | D1 | SHIFT AMOUNT ΔFvfy OF VERIFY VOLTAGE TO BE APPLIED TO PRE-VERIFY PROCESS FOR "F" STATE, FROM DEFAULT VALUE | | D1 | SHIFT AMOUNT ΔFpgm OF PROGRAM VOLTAGE TO BE APPLIED TO REPROGRAMMING PROCESS FOR "F" STATE, FROM DEFAULT VALUE |
| | D2 | SHIFT AMOUNT ΔGvfy OF VERIFY VOLTAGE TO BE APPLIED TO PRE-VERIFY PROCESS FOR "G" STATE, FROM DEFAULT VALUE | | D2 | SHIFT AMOUNT ΔGpgm OF PROGRAM VOLTAGE TO BE APPLIED TO REPROGRAMMING PROCESS FOR "G" STATE, FROM DEFAULT VALUE |
| | D3 | RESERVED | | D3 | RESERVED |

F I G. 21

| ADDRESS | | SET VALUE | ADDRESS | | SET VALUE |
|---|---|---|---|---|---|
| X1h | D0 | SHIFT AMOUNT ΔAvfy OF VERIFY VOLTAGE TO BE APPLIED TO PRE-VERIFY PROCESS FOR"A" STATE, FROM DEFAULT VALUE | X3h | D0 | SHIFT AMOUNT ΔApgm OF PROGRAM VOLTAGE TO BE APPLIED TO REPROGRAMMING PROCESS FOR"A"STATE, FROM DEFAULT VALUE |
| | D1 | SHIFT AMOUNT ΔBvfy OF VERIFY VOLTAGE TO BE APPLIED TO PRE-VERIFY PROCESS FOR"B" STATE, FROM DEFAULT VALUE | | D1 | SHIFT AMOUNT ΔBpgm OF PROGRAM VOLTAGE TO BE APPLIED TO REPROGRAMMING PROCESS FOR"B"STATE, FROM DEFAULT VALUE |
| | D2 | SHIFT AMOUNT ΔCvfy OF VERIFY VOLTAGE TO BE APPLIED TO PRE-VERIFY PROCESS FOR"C" STATE, FROM DEFAULT VALUE | | D2 | SHIFT AMOUNT ΔCpgm OF PROGRAM VOLTAGE TO BE APPLIED TO REPROGRAMMING PROCESS FOR"C"STATE, FROM DEFAULT VALUE |
| | D3 | SHIFT AMOUNT ΔDvfy OF VERIFY VOLTAGE TO BE APPLIED TO PRE-VERIFY FOR"D"STATE, FROM DEFAULT VALUE | | D3 | SHIFT AMOUNT ΔDpgm OF PROGRAM VOLTAGE TO BE APPLIED TO REPROGRAMMING PROCESS FOR"D"STATE, FROM DEFAULT VALUE |
| X2h | D0 | SHIFT AMOUNT ΔEvfy OF VERIFY VOLTAGE TO BE APPLIED TO PRE-VERIFY PROCESS FOR"E" STATE, FROM DEFAULT VALUE | X4h | D0 | SHIFT AMOUNT ΔEpgm OF PROGRAM VOLTAGE TO BE APPLIED TO REPROGRAMMING PROCESS FOR"E"STATE, FROM DEFAULT VALUE |
| | D1 | SHIFT AMOUNT ΔFvfy OF VERIFY VOLTAGE TO BE APPLIED TO PRE-VERIFY PROCESS FOR"F" STATE, FROM DEFAULT VALUE | | D1 | SHIFT AMOUNT ΔFpgm OF PROGRAM VOLTAGE TO BE APPLIED TO REPROGRAMMING PROCESS FOR"F"STATE, FROM DEFAULT VALUE |
| | D2 | SHIFT AMOUNT ΔGvfy OF VERIFY VOLTAGE TO BE APPLIED TO PRE-VERIFY PROCESS FOR"G" STATE, FROM DEFAULT VALUE | | D2 | SHIFT AMOUNT ΔGpgm OF PROGRAM VOLTAGE TO BE APPLIED TO REPROGRAMMING PROCESS FOR"G"STATE, FROM DEFAULT VALUE |
| | D3 | INFORMATION INDICATING WHETHER TO ALLOW PRE-VERIFY PROCESS IN EACH STATE | | D3 | RESERVED |

F I G. 25

| ADDRESS | | | SET VALUE |
|---|---|---|---|
| X2h | D3 | BIT0 | PRE-VERIFY PROCESS FOR "A" STATE IS (ALLOWED: 1, INHIBITED: 0) |
| | | BIT1 | PRE-VERIFY PROCESS FOR "B" STATE IS (ALLOWED: 1, INHIBITED: 0) |
| | | BIT2 | PRE-VERIFY PROCESS FOR "C" STATE IS (ALLOWED: 1, INHIBITED: 0) |
| | | BIT3 | PRE-VERIFY PROCESS FOR "D" STATE IS (ALLOWED: 1, INHIBITED: 0) |
| | | BIT4 | PRE-VERIFY PROCESS FOR "E" STATE IS (ALLOWED: 1, INHIBITED: 0) |
| | | BIT5 | PRE-VERIFY PROCESS FOR "F" STATE IS (ALLOWED: 1, INHIBITED: 0) |
| | | BIT6 | PRE-VERIFY PROCESS FOR "G" STATE IS (ALLOWED: 1, INHIBITED: 0) |
| | | BIT7 | RESERVED |

F I G. 26

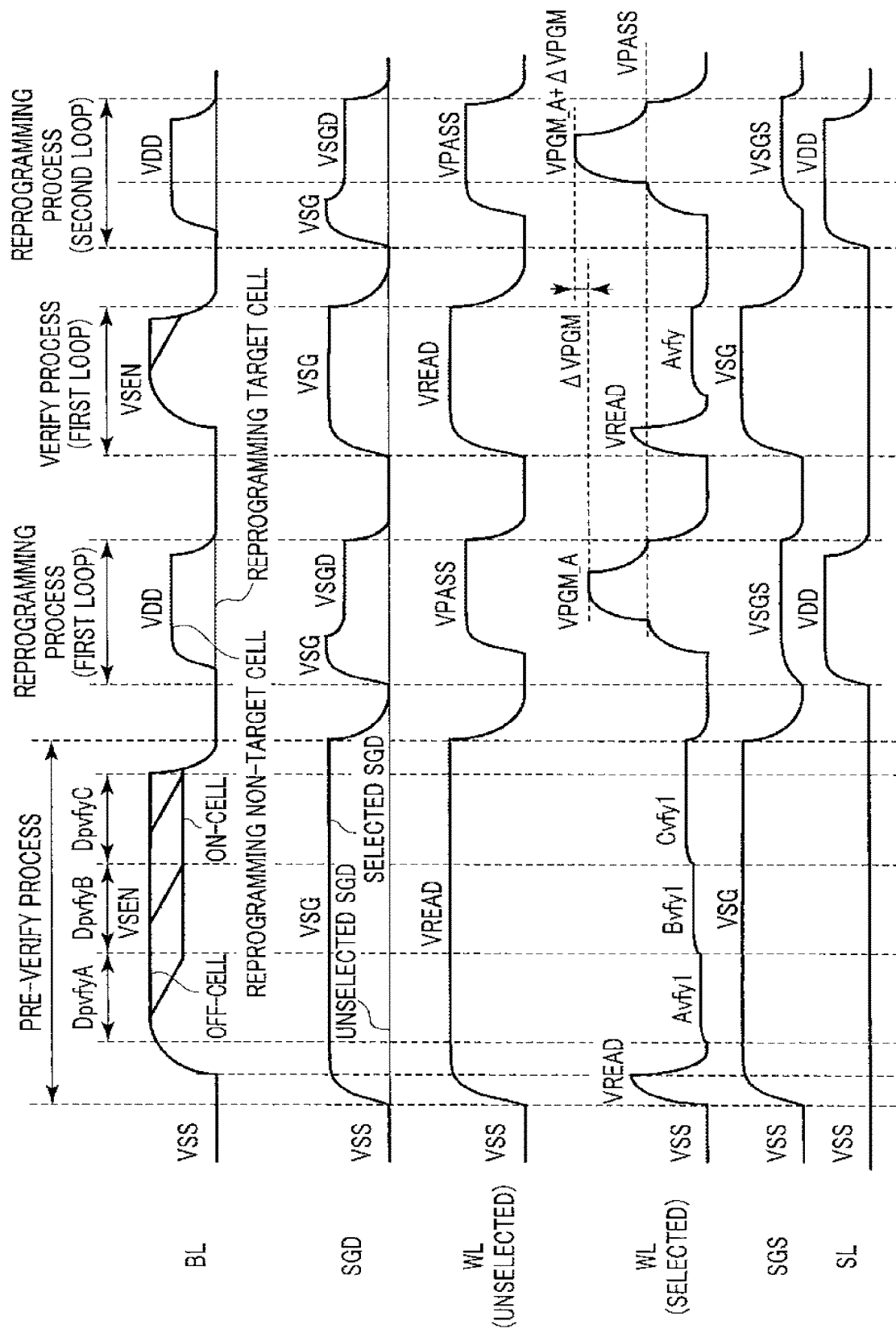
F I G. 32

BECAUSE ONLY "F" AND "G" STATES ARE
TARGETS FOR REPROGRAMMING PROCESS,
REPROGRAMMING INTO OTHER STATES
IS INHIBITED

| | | PRE-VERIFY PROCESS | NUMBER OF LOOPS (UPPER LIMIT OF NUMBER OF LOOPS = 4) | | | | | | | |
|---|---|---|---|---|---|---|---|---|---|---|
| | | | 1 | 2 | 3 | 4 | 5 | 6 | 7 | ... |
| ・PERFORM PRE-VERIFY PROCESS: ◇<br>・PERFORM VERIFY PROCESS: ◯<br>・NOT PERFORM VERIFY PROCESS (PERFORM REPROGRAMMING PROCESS ONLY): △ | "A" LEVEL | | | | | | (※) LOOP PROCESS OF WHICH NUMBER OF LOOPS EXCEEDS UPPER LIMIT IS NOT PERFORMED | | | |
| | "B" LEVEL | | | | | | | | | |
| | "C" LEVEL | | | | | | | | | |
| | "D" LEVEL | | | | | | | | | |
| | "E" LEVEL | | | | | | | | | |
| | "F" LEVEL | ◇ | ◯ | ◯ | ◯ | △ | | | | |
| | "G" LEVEL | ◇ | ◯ | ◯ | ◯ | △ | | | | |

F I G. 33

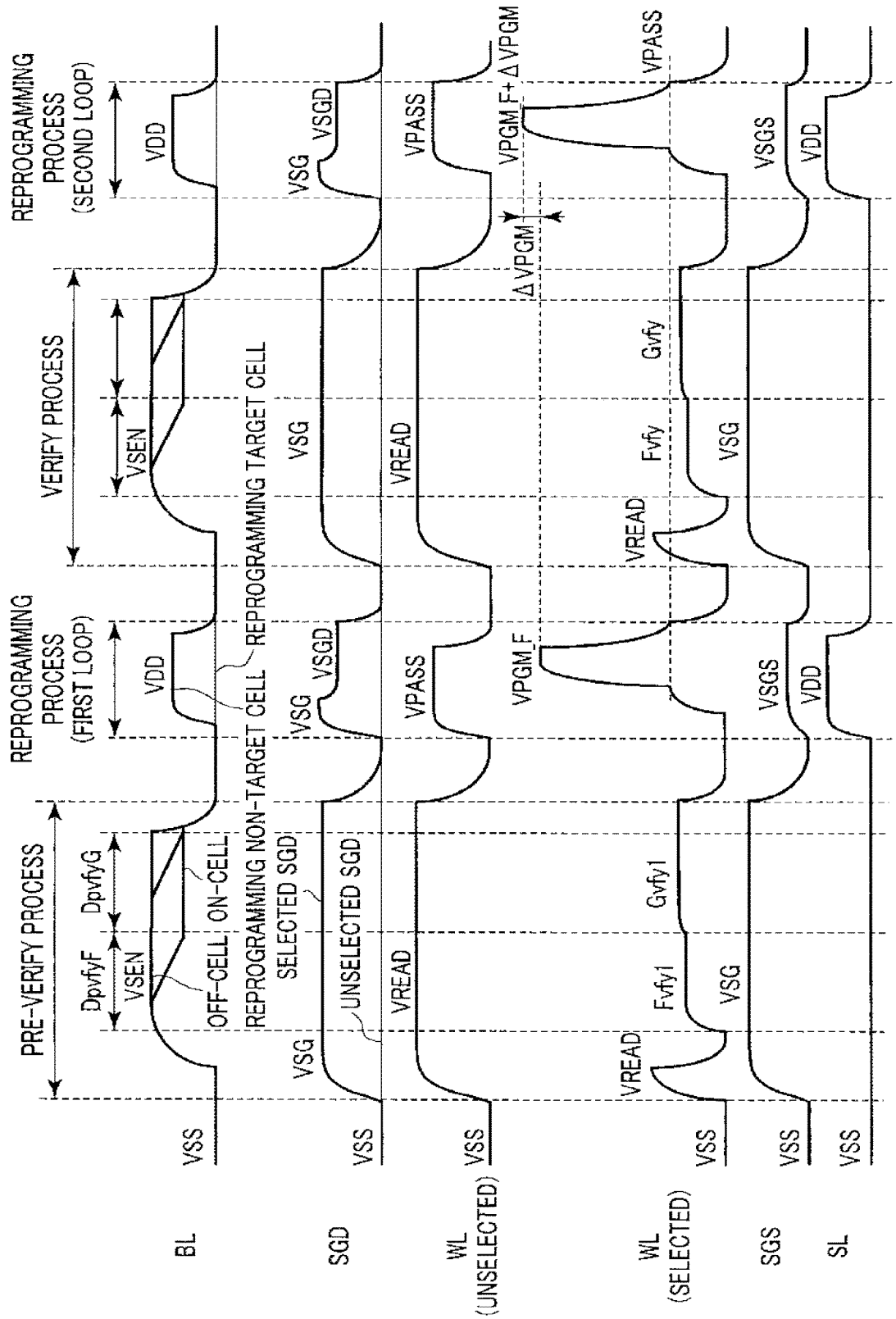
F I G. 34

NONVOLATILE MEMORY AND MEMORY SYSTEM

CROSS-REFERENCE TO RELATED APPLICATION

This application is a continuation of U.S. application Ser. No. 16/429,588 filed Jun. 3, 2019, which is based upon and claims the benefit of priority from Japanese Patent Application No. 2018-164450, filed Sep. 3, 2018, the entire contents of each of which are incorporated herein by reference.

FIELD

Embodiments described herein relate generally to a nonvolatile memory and a memory system.

BACKGROUND

A memory system including a NAND flash memory as a nonvolatile memory and a memory controller to control the NAND flash memory is known.

BRIEF DESCRIPTION OF THE DRAWINGS

FIG. 2 is a circuit diagram to explain a configuration of a memory cell array according to the first embodiment.

FIG. 5 is a block diagram to explain a configuration of a sense amplifier module according to the first embodiment.

FIG. 6 is a conceptual diagram to explain a shift table stored in a memory controller according to the first embodiment.

FIG. 7 is a conceptual diagram to explain a history table stored in the memory controller according to the first embodiment.

FIG. 8 is a sectional view to explain a configuration of a memory cell array according to a modification to the first embodiment.

FIG. 9 is a conceptual diagram to explain a flag table stored in the memory controller according to the first embodiment.

FIG. 10 is a flowchart to explain a read operation in the memory system according to the first embodiment.

FIG. 11 is a conceptual diagram to explain information in a register that stores parameters used in the read operation in the memory system according to the first embodiment.

FIG. 12 is a conceptual diagram to explain the information in the register that stores the parameters used in the read operation in the memory system according to the first embodiment.

FIG. 13 is a diagram to explain variations in threshold voltage distributions before and after the reprogramming refresh process in the memory system according to the first embodiment.

FIG. 14 is a flowchart to explain an example of an operation of determining whether each of a block refresh process and the reprogramming refresh process is to be reserved in the memory system according to the first embodiment.

FIG. 21 is a conceptual diagram to explain a feature table set when the reprogramming refresh process is executed in the memory system according to the first embodiment.

FIG. 25 is a conceptual diagram to explain a feature table set when a reprogramming refresh process is executed in a memory system according to a second embodiment.

FIG. 26 is a conceptual diagram to explain the feature table set when the reprogramming refresh process is executed in the memory system according to the second embodiment.

FIG. 32 is a timing chart to explain an example of the reprogramming refresh process in the memory system according to the third embodiment.

FIG. 33 is a conceptual diagram to explain an example of the sequence of the reprogramming refresh process in the memory system according to the third embodiment.

FIG. 34 is a timing chart to explain an example of the reprogramming refresh process in the memory system according to the third embodiment.

DETAILED DESCRIPTION

In general, according to one embodiment, a nonvolatile memory includes: a memory cell array including a plurality of memory cells; and a control circuit configured to execute a first refresh process upon receiving a first command set. The first refresh process includes reprogramming at least one second memory cell among a plurality of first memory cells to which data has been programmed. In executing the first refresh process, the control circuit is configured to: select the second memory cell from the plurality of first memory cells by verifying with a first voltage using a first correction amount in a case where the second memory cell has been programmed using the first voltage; and select the second memory cell from the plurality of first memory cells by verifying with a second voltage using a second correction amount in a case where the second memory cell has been programmed using the second voltage.

Hereinafter, embodiments will be described with reference to the drawings. In the following descriptions, the components having the same function and configuration are denoted by a common reference symbol. To distinguish these components, a subscript is added to the symbol. If the components need not be distinguished, they include only a common symbol and not a subscript.

1. First Embodiment

A memory system according to a first embodiment will be described. The memory system according to the first embodiment will be an example of a memory system that includes a NAND flash memory as a nonvolatile memory.

1.1. Configuration

A configuration of the memory system according to the first embodiment will be described.

1.1.1. Configuration of Memory System

An overview of the configuration of the memory system according to the first embodiment is initially described with reference to FIG. 1.

Figure 1:
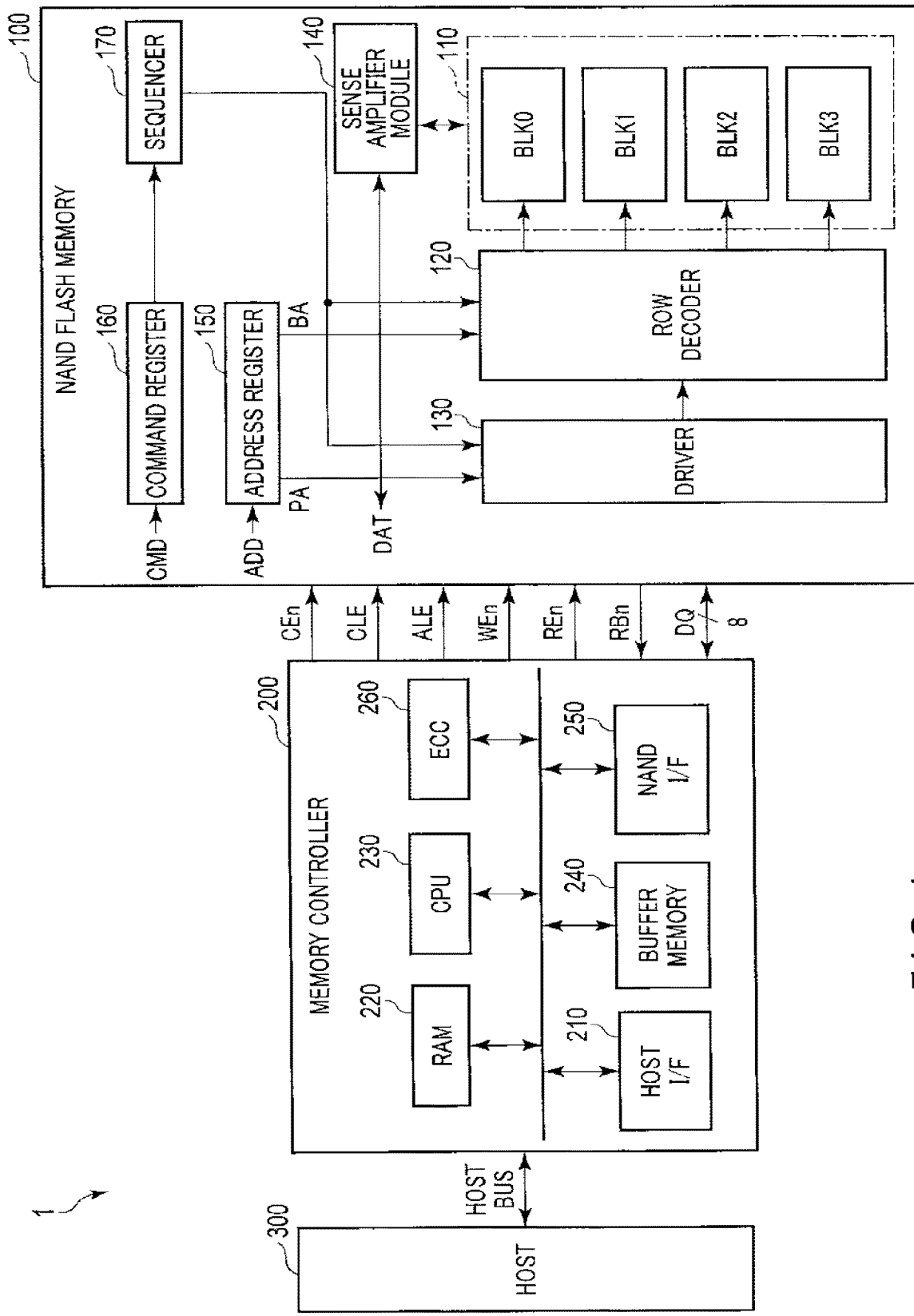
FIG. 1 is a block diagram to explain a configuration of a memory system according to a first embodiment.

As shown in FIG. 1, the memory system 1 includes a nonvolatile memory (NAND flash memory) 100 and a memory controller 200. The NAND flash memory 100 and the memory controller 200 may be, for example, integrated into one semiconductor device. An example of the semiconductor device is a memory card such as an SD™ card, a solid-state drive (SSD) and the like.

The NAND flash memory 100 includes a plurality of memory cells to store data non-volatilely. The memory controller 200 is connected to the NAND flash memory 100 via a NAND bus and also connected to a host device 300 via a host bus. The memory controller 200 controls the NAND flash memory 100 and accesses the NAND flash memory 100 in response to an instruction from the host device 300. The host device 300 is, for example, a digital camera and a personal computer, and the host bus is a bus that conforms to, for example, an SD™ interface, a serial attached SCSI (small computer system interface) (SAS), a serial ATA (advanced technology attachment) (SATA), a PCI (peripheral component interconnect) Express™ (PCIe) or an NVM (nonvolatile memory) Express™ (NVMe). The NAND bus is used to receive and transmit a signal that conforms to a NAND interface.

As specific examples of the NAND interface signal, there are a chip enable signal CEn, a command latch enable signal CLE, an address latch enable signal ALE, a write enable signal WEn, a read enable signal REn, a ready/busy signal RBn and an input/output signal DQ.

The signal CEn enables the NAND flash memory 100 and is asserted at a low level. The signals CLE and ALE notify the NAND flash memory 100 that the signal DQ input to the NAND flash memory 100 are a command and an address, respectively. The signal WEn is asserted at a low level and causes the input signal DQ to be fetched into the NAND flash memory 100. The signal REn is also asserted at a low level and used to read the output signal DQ from the NAND flash memory 100. The ready/busy signal RBn indicates whether the NAND flash memory 100 is in a ready state (where it can receive an instruction from the memory controller 200) or in a busy state (where it cannot receive an instruction from the memory controller 200). A low level thereof represents the busy state. The input/output signal DQ is, for example, an 8-bit signal. The input/output signal DQ is an entity of data to be exchanged between the NAND flash memory 100 and the memory controller 200, and a command CMD, an address ADD, and data DAT such as write data, read data and the like.

1.1.2. Configuration of Memory Controller

Continuously referring to FIG. 1, a configuration of the memory controller 200 will be described in detail.

The memory controller 200 is, for example, a system-on-a-chip (SoC) and includes a host interface circuit 210, a memory (RAM) 220, a processor (CPU) 230, a buffer memory 240, a NAND interface circuit 250 and an ECC circuit 260. The functions of the components 210, 220, 220, 230, 240, 250 and 260 of the memory controller 200 may be carried out by both a hardware configuration and a combination of hardware resources and firmware.

The host interface circuit 210 is connected to a host device 300 via a host bus to transfer instructions and data from the host device 300 to the processor 230 and the buffer memory 240, respectively.

The memory 220 is, for example, a semiconductor memory such as a DRAM and is used as a work area of the processor 230. The memory 220 stores firmware to manage the NAND flash memory 100, various management tables such as a shift table, a history table and a flag table, and the like.

The processor 230 controls the entire operation of the memory controller 200. For example, upon receipt of a write instruction from the host device 300, the processor 230 issues a write command to the NAND interface circuit 250. The same holds true for a read process and an erase process. The processor 230 also executes various processes to manage the NAND flash memory 100. For example, the processor 230 may execute processes including an erase process as part of an internal process of the memory system 1, such as a garbage collection (compaction) process, a refresh process and a wear-leveling process.

The buffer memory 240 temporarily stores the write data and the read data.

The NAND interface circuit 250 is connected to the NAND flash memory 100 via a NAND bus and serves to communicate with the NAND flash memory 100. Upon receipt of an instruction from the processor 230, the NAND interface circuit 250 outputs the signals CEn, ALE, CLE, WEn and REn to the NAND flash memory 100. During write processing, the write command issued from the processor 230 and write data in the buffer memory 240 are transferred to the NAND flash memory 100 as the input/ output signal DQ. During read processing, a read command issued from the processor 230 is transferred to the NAND flash memory 100 as the input/output signal DQ, and data read out of the NAND flash memory 100 is received and transferred to the buffer memory 240 as the input/output signal DQ.

The ECC circuit 260 executes an error detection process and an error correction process for data stored in the NAND flash memory 100. More specifically, during the data write processing, the ECC circuit 260 generates an error correction code and provides it for the write data and, during the data read processing, it decodes the error correction code and detects the presence or absence of an error bit. When the ECC circuit 260 detects an error bit, it specifies a location of the error bit and corrects the error. An error correction method includes, for example, a hard bit decoding and a soft bit decoding. As hard bit decoding codes for use in the hard bit decoding, for example, a Bose-Chaudhuri-Hocquenghem (BCH) code and a Reed-Solomon (RS) code can be used. As soft bit decoding codes for use in the soft bit decoding, for example, a Low Density Parity Check (LDPC) code can be used.

1.1.3. Configuration of NAND Flash Memory

A configuration of the NAND flash memory 100 will be described. As illustrated in FIG. 1, the NAND flash memory 100 includes a memory cell array 110, a row decoder 120, a driver 130, a sense amplifier module 140, an address register 150, a command register 160 and a sequencer 170.

The memory cell array 110 includes a plurality of blocks BLK including a plurality of nonvolatile memory cells associated with rows and columns. In FIG. 1, four blocks Blk0 to BLK3 are shown as one example. The memory cell array 110 stores data supplied from the memory controller 200.

The row decoder 120 selects one of the blocks BLK0 to BLK3 based upon a block address BA in the address register 150 and also selects a word line in the selected block BLK.

The driver 130 applies a voltage to the selected block BLK via the row decoder 120, based on a page address PA in the address register 150.

During the data read process, the sense amplifier module 140 senses the threshold voltage of a memory cell transistor in the memory cell array 110 to read data DAT. Then, the sense amplifier module 140 outputs this read data DAT to the memory controller 200. During the data write process, the sense amplifier module 140 transfers write data DAT received from the memory controller 200 to the memory cell array 110.

The address register 150 stores address ADD received from the memory controller 200. The address ADD includes the foregoing block address BA and page address PA. The command register 160 stores command CMD received from the memory controller 200.

The sequencer 170 controls the entire operation of the NAND flash memory 100 based on the command CMD stored in the command register 160.

The configuration of the block BLK will be described with reference to FIG. 2, which is a circuit diagram of one block BLK.

As shown in FIG. 2, the block BLK includes, for example, four string units SU (SU0 to SU3). Each of the string units SU includes a plurality of NAND strings NS. The number of blocks in the memory cell array 110 is optional, as is the number of string units in the block BLK.

Each of the NAND strings NS includes, for example, 64 memory cell transistors MT (MT0 to MT63) and selection transistors ST1 and ST2. Each of the memory cell transistors MT includes a control gate and a charge storage layer to store data non-volatilely. The memory cell transistors MT are connected in series between the source of the selection transistor ST1 and the drain of the selection transistor ST2.

The gates of selection transistors ST1 in the string units SU0 to SU3 are connected to select gate lines SGD0 to SGD3, respectively. The gates of selection transistors ST2 in the string units SU0 to SU3 are connected in common to, for example, a select gate line SGS. Alternatively, the gates of the selection transistors ST2 can be connected to their respective select gate lines SGS0 to SGS3 that vary from string unit to string unit. The control gates of the memory cell transistors MT0 to MT63 within the same block BLK are connected to word lines WL0 to WL63, respectively.

In the memory cell array 110, the drains of the selection transistors ST1 of the NAND strings NS in the same column are connected in common to their corresponding one of bit lines BL (BL0 to BL(m−1) where m is a natural number of two or more). That is, each of the bit lines BL allows the NAND strings NS in the same column among the blocks BLK to be connected to each other. The sources of the selection transistors ST2 are connected in common to the source line SL.

In other words, each of the string units SU is a set of NAND strings NS connected to different bit lines BL and connected to the same select gate line SGD. Of the string units SU, a set of memory cell transistors MT connected in common to the same word line WL is also referred to as a cell unit CU (or memory cell group). Each of the blocks BLK is a set of string units SU having word lines WL in common. The memory cell array 110 is a set of blocks BLK having bit lines BL in common.

Figure 3:
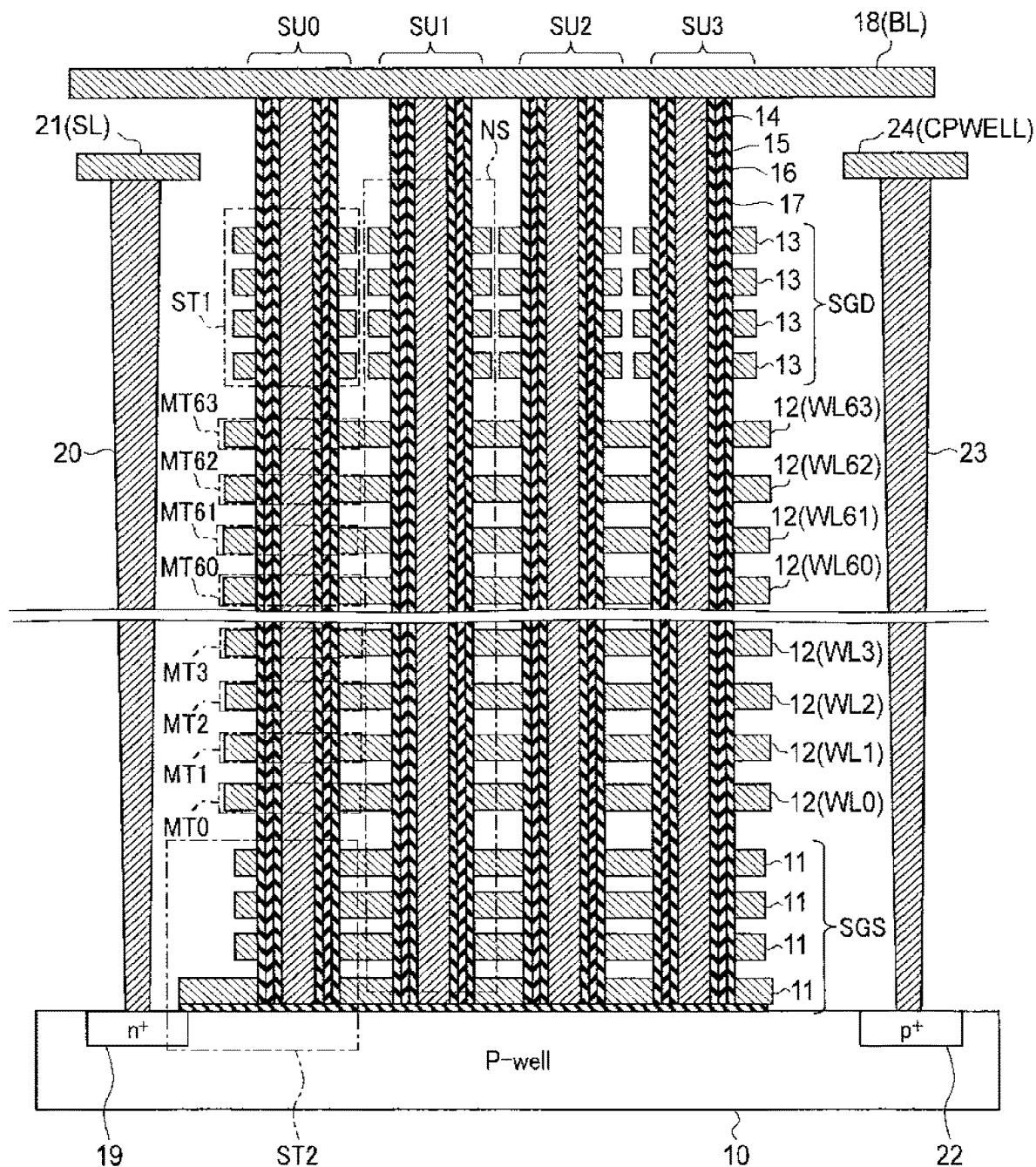
FIG. 3 is a sectional view to explain a configuration of the memory cell array according to the first embodiment.

FIG. 3 is a sectional view of a part of a region of one block BLK. As shown in FIG. 3, a plurality of NAND strings NS are formed on a p-type well region 10. In other words, for example, a 4-layer interconnect layer 11 serving as a select gate line SGS, a 64-layer interconnect layer 12 serving as word lines WL0 to WL63 and a 4-layer interconnect layer 13 serving as a select gate line SGD are stacked one on another. An insulation film (not shown) is formed between the stacked interconnect layers.

Then, a pillar-shaped conductor 14 is formed to reach the p-type well region 10 through the interconnect layers 13, 12 and 11. On outer side of the conductor 14, a gate insulation film 15 is formed, a charge storage layer (insulation film or conductive film) 16 is formed on the gate insulation film 15, and a block insulation film 17 is formed on the charge storage layer 16. With these films and layer, the memory cell transistors MT and selection transistors ST1 and ST2 are formed. The conductor 14 functions as a current path of its corresponding NAND string NS and serves as a region where the channel of each transistor is formed. The top end of the conductor 14 is connected to a metal interconnect layer 18 that functions as a bit line BL.

In the surface region of the p-type well region 10, an $n^+$-type impurity diffusion layer 19 is formed. On the $n^+$-type impurity diffusion layer 19, a contact plug 20 is formed, and the contact plug 20 is connected to a metal interconnect layer 21 that functions as a source line SL. In the surface region of the p-type well region 10, a $p^+$-type impurity diffusion layer 22 is also formed. On the $p^+$-type impurity diffusion layer 22, a contact plug 23 is formed, and the contact plug 23 is connected to a metal interconnect layer 24 that functions as well interconnect CPWELL. The well interconnect CPWELL is interconnect to apply a potential to the conductor 14 via the p-type well region 10.

A plurality of configurations corresponding to the above are arranged in a depth direction of a sheet of FIG. 3. A set of a plurality of NAND strings NS arranged in the depth direction is one string unit SU.

In the first embodiment, one memory cell transistor MT can store, for example, data of three bits. The three bits are called a lower bit, a middle bit and an upper bit in sequence from the lower bit. A set of lower bits stored in the memory cells belonging to the same cell unit CU is called a lower page, a set of middle bits stored therein is called a middle page, and a set of upper bits stored therein is called an upper page. In other words, three pages are assigned to one single word line WL (i.e., one cell unit CU) in one string unit SU and thus the string unit SU including 64 word lines WL has a capacity of 192 pages. Alternatively, the "page" can also be defined as part of memory space formed in the cell unit CU. Data can be written or read for each page or for each cell unit CU, whereas data is erased for each block BLK.

Figure 4:
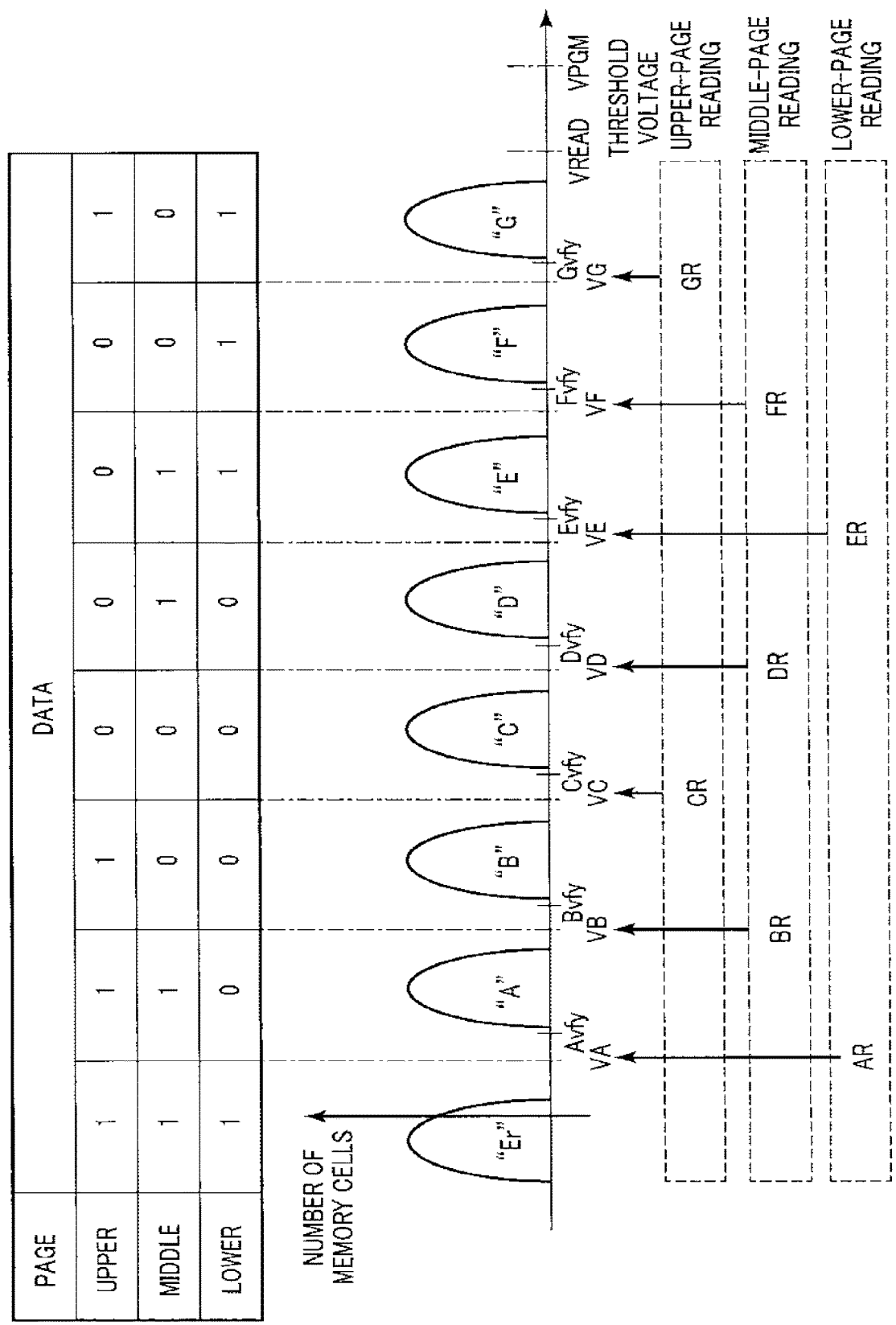
FIG. 4 is a schematic view to explain a threshold voltage distribution of memory cell transistors according to the first embodiment.

FIG. 4 is a diagram showing data that is obtainable by each memory cell transistor MT, a threshold voltage distribution and voltages used during read process and write process.

As described above, each memory cell transistor MT can store 3-bit data. In other words, eight states are available according to threshold voltages in each memory cell transistor MT. The eight states will be referred to as an "Er" state, an "A" state, a "B" state, a "C" state, . . . , and a "G" state in ascending order of threshold voltages.

The threshold voltage of a memory cell transistor MT in the "Er" state is lower than a voltage VA and corresponds to a data erased state. The threshold voltage of a memory cell transistor MT in the "A" state is not lower than the voltage VA and lower than a voltage VB (>VA). The threshold voltage of a memory cell transistor MT in the "B" state is not lower than the voltage VB and lower than a voltage VC (>VB). The threshold voltage of a memory cell transistor MT in the "C" state is not lower than the voltage VC and lower than a voltage VD (>VC). The threshold voltage of a memory cell transistor MT in the "D" state is not lower than the voltage VD and lower than a voltage VE (>VD). The threshold voltage of a memory cell transistor MT in the "E" state is not lower than the voltage VE and lower than a voltage VF (>VE). The threshold voltage of a memory cell transistor MT in the "F" state is not lower than the voltage VF and lower than a voltage VG (>VF). The threshold voltage of a memory cell transistor MT in the "G" state is not lower than the voltage VG and lower than a voltage VREAD. Among the eight states distributed in this way, the "G" state is the state of the highest threshold voltage. The voltages VA to VG are collectively called a voltage VCGR. The voltage VREAD is applied to, for example, word lines WL that are not targeted for read during the read operation, and turns on a memory cell transistor MT irrespective of stored data. The voltage VREAD is lower than a voltage VPGM. The voltage VPGM is a general term of a voltage to be applied to a word line WL to which data is written during the write operation.

The threshold voltage of a memory cell transistor MT is likely to shift to a low-voltage side immediately after data is written. During the write operation (more specifically, verify operation), thus, the threshold voltages of memory cell transistors MT in the "A" to "G" states can be set to voltages Avfy to Gvfy that are higher than voltages VA to VG, respectively.

The foregoing threshold voltage distribution is achieved by data of three bits (three pages) of the lower, middle and higher bits. That is, the relationship between the "Er" to "G" states and the lower, middle and higher bits is as follows.

"Er" state: "111" (represented in the order of "upper/middle/lower")
"A" state: "110"
"B" state: "100"
"C" state: "000"
"D" state: "010"
"E" state: "011"
"F" state: "001"
"G" state: "101"

As described above, only one bit of the three bits varies between data items corresponding to adjacent two states in the threshold voltage distribution.

Thus, when a lower bit is read, a voltage corresponding to a boundary where the value ("0" or "1") of the lower bit varies has only to be used. The same holds true for the middle and upper bits.

In other words, as shown in FIG. 4, in lower page reading, the voltage VA to distinguish the "Er" and "A" states and the voltage VE to distinguish the "D" and "E" states are each used as read levels. Read operations using the voltages VA and VE will be referred to as read operations AR and ER, respectively.

The read operation AR determines whether the threshold voltage of a memory cell transistor MT is lower than the voltage VA. In other words, the read operation AR specifies a memory cell transistor MT in the erased state. The read operation ER determines whether the threshold voltage of a memory cell transistor MT is lower than the voltage VE.

In middle page reading, the voltage VB to distinguish the "A" and "B" states, the voltage VD to distinguish the "C" and "D" states and the voltage VF to distinguish the "E" and "F" states are each used as read levels. Read operations using the voltages VB, VD and VF will be referred to as read operations BR, DR and FR, respectively.

The read operation BR determines whether the threshold voltage of a memory cell transistor MT is lower than the voltage VB. The read operation DR determines whether the threshold voltage of a memory cell transistor MT is lower than the voltage VD. The read operation FR determines whether the threshold voltage of a memory cell transistor MT is lower than the voltage VF.

In upper page reading, the voltage VC to distinguish the "B" and "C" states and the voltage VG to distinguish the "F" and "G" states are each used as read levels. Read operations using the voltages VC and VG will be referred to as read operations CR and GR, respectively.

The read operation CR determines whether the threshold voltage of a memory cell transistor MT is lower than the voltage VC. The read operation GR determines whether the threshold voltage of a memory cell transistor MT is lower than the voltage VG.

Data can be erased in a unit of a block BLK or in smaller units. A data erase method is disclosed in U.S. patent application Ser. No. 13/235,389 filed on Sep. 18, 2011 and entitled "NONVOLATILE SEMICONDUCTOR MEMORY DEVICE." It is also disclosed in U.S. patent application Ser. No. 12/694,690 filed on Jan. 27, 2010 and entitled "NON-VOLATILE SEMICONDUCTOR STORAGE DEVICE" and U.S. patent application Ser. No. 13/483,610 filed on May 30, 2012 and entitled NONVOLATILE SEMICONDUCTOR MEMORY DEVICE AND DATA ERASE METHOD THEREOF". The entire contents of these patent applications are incorporated herein by reference.

The memory cell array 110 may have another configuration. That is, a configuration of the memory cell array 110 is disclosed in U.S. patent application Ser. No. 12/407,403 filed on Mar. 19, 2009 and entitled "THREE DIMENSIONAL STACKED NONVOLATILE SEMICONDUCTOR MEMORY." It is also disclosed in U.S. patent application Ser. No. 12/406,524 filed on Mar. 18, 2009 and entitled "THREE DIMENSIONAL STACKED NON-VOLATILE SEMICONDUCTOR MEMORY," U.S. patent application Ser. No. 12/679,991 filed on Mar. 25, 2010 and entitled "NON-VOLATILE SEMICONDUCTOR STORAGE DEVICE and METHOD OF MANUFACTURING THE SAME and U.S. patent application Ser. No. 12/532,030 filed on Mar. 23, 2009 and entitled and "SEMICONDUCTOR MEMORY AND METHOD FOR MANUFACTURING SAME." The entire contents of these patent applications are incorporated herein by reference.

1.1.4. Configuration of Sense Amplifier Module

A configuration of the sense amplifier module of the nonvolatile memory according to the first embodiment will be described. FIG. 5 is a circuit diagram to explain an example of the configuration of the sense amplifier module of the nonvolatile memory according to the first embodiment. As shown in FIG. 5, the sense amplifier module 140 includes sense amplifier units SAU (SAU0, SAU1, . . . SAU(m−1)) each provided for a corresponding bit line BL.

Each of the sense amplifier units SAU includes a sense amplifier SA, an operation unit OP and, for example, five latch circuits ADL, BDL, CDL, SDL and XDL.

The sense amplifier SA senses a voltage or current of a corresponding bit line BL to read data or apply a voltage to the bit line BL in accordance with write data. That is, the sense amplifier SA is a module to control the bit line BL directly. The sense amplifier SA is supplied with, for example, a strobe signal STB by the sequencer 170. The sense amplifier SA determines read data when the strobe signal STB is asserted. Then, the sense amplifier SA stores the data in a latch circuit (not shown) included therein and transfers it to one of the latch circuits ADL, BDL, CDL, SDL and XDL.

The latch circuits ADL, BDL, CDL and SDL temporarily store read data and write data. The operation unit OP performs various logical operations such as NOT, OR, AND, NAND, NOR and XOR operations for the data stored in the sense amplifier SA, latch circuits ADL, BDL, CDL, SDL and XDL.

The sense amplifier SA, latch circuits ADL, BDL, CDL and SDL and operation unit OP are connected via a bus such that they can exchange data with each other. The bus is also connected to the latch circuit XDL.

Data is input to and output from the sense amplifier module 140 through the latch circuit XDL. That is, data received from the memory controller 200 is transferred to the latch circuits ADL, BDL, CDL and SDL or the sense amplifier SA via the latch circuit XDL. Data of the latch circuits ADL, BDL, CDL and SDL or the sense amplifier SA is transmitted to the memory controller 200 as one of the signals DQ<7:0> via the latch circuit XDL. The latch circuit XDL functions as a cache memory of the NAND flash memory 100. Thus, even though the latch circuits ADL, BDL, CDL and SDL store data, if the latch circuit XDL is empty, the NAND flash memory 100 can be put into a ready state.

In the example of FIG. 5, a bit line BL0 is connected to a signal line that communicates signal DQ<0>, a bit line BL1 is connected to a signal line that communicates signal DQ<1>, and the latch circuit XDL connected to the bit line BL(m−1) is connected to a signal line that communicates signal DQ<7>. A signal line through which the bit line BL and the memory controller 200 are connected to each other corresponds to one of the signals DQ<7:0>. That is, the NAND string NS connected to a bit line BL is associated with one of the signals DQ<7:0>.

1.1.5. Shift Table

A shift table will be described below. As described above, the memory controller 200 stores a shift table in, for example, the memory 220. The concept of the shift table will be described with reference to FIG. 6, which is a conceptual diagram showing an example of the shift table.

As shown in FIG. 6, the shift table includes a plurality of entries (six entries in the example of FIG. 6). Shift indexes "0" to "5" are assigned in sequence to the entries. Each of the entries stores information indicating amount of shift in read voltage that is to be applied to a read target word line WL in read operations AR, BR, CR, . . . GR.

The amount of shift will be described below. The threshold voltage distributions corresponding to the "Er," "A," . . . and "G" states described with reference to FIG. 4 are isolated from one other. The states can thus be distinguished by the voltages VA, VB, . . . and VG. However, after data is written, the threshold voltage distributions may be shifted to a low-voltage side or a high-voltage side by, for example, interference with adjacent cells (which is referred to as "data retention error"). Specifically, the threshold voltage distributions corresponding to the "A" to "G" states may be shifted to the low-voltage side when the charges stored in the charge storage layer 16 leak with time. The threshold voltage distribution corresponding to the "Er" state may be shifted to the high-voltage side with time when the charges leaked from adjacent memory cell transistors MT are stored in the charge storage layer 16. The threshold voltage distributions may vary even with a write process and a read process (which are referred to as "program disturb" and "read disturb," respectively). The amount of shift of the threshold voltage distributions due to these different variation factors increases with the length of time elapsed from the completion of write process and also increases with the number of times data is read out of the block BLK. Then, the distribution width of the threshold voltage distribution of each state may increase and adjacent threshold voltage distributions may overlap each other.

When the threshold voltage distributions vary as described above, data can not be read correctly by the foregoing voltages VA, VB, . . . and VG. That is, the number of error bits contained in read data might exceed the number of correctable bits of the ECC circuit 260, and the memory controller 200 fails to read correct data from the NAND flash memory 100.

In the above case, the memory controller 200 shifts read voltages from read voltages VA, VB, . . . and VG in a normal read process (hereinafter also referred to as "default read voltages") to try to read data again. This is called shift read process. It is the shift table shown in FIG. 6 that stores information indicating the amount $\Delta V$ of shift from the default read voltages.

In the shift table in this example, a state in which a shift index is 0 corresponds to the default read voltages. Shift amounts $\Delta VAj$, $\Delta VBj$, . . . and $\Delta VGj$ are provided for the read operations AR, BR, . . . and GR, respectively (j is a shift index, namely, a natural number of one of 1 to 5 and if they are not distinguished, they are collectively referred to as $\Delta V$). The shift amounts $\Delta VAj$, $\Delta VBj$, . . . and $\Delta VGj$ corresponding to a shift index j may have different values, or some of them may have the same value, or all of them may have the same value. These shift amounts ΔV are set to appropriate values by, for example, the memory controller 200.

In the shift table in this example, as the value of a shift index is small, the influence of the variation factor is small. That is, the shift amount ΔV (namely, shift amounts ΔVA1, ΔVB1, . . . and ΔVG1) which corresponds to a shift index of "1" corresponds to a case where the influence of the variation factors is small next to the state of a shift index of "0". In contrast, the shift amount ΔV (namely, shift amounts ΔVA5, ΔVB5, . . . and ΔVG5) which corresponds to a shift index of "5" corresponds to the case where the influence of the variation factors is the largest.

The degree of influence by the variable factors may vary depending on the states (i.e., which of "Er" to "G" states) of the threshold voltage distributions. For example, in the variation factor in which the threshold voltage distribution is shifted to a low-voltage side, which is focused in this embodiment, the degree of influence may increase as the threshold voltage increases. That is, the variation factors may have a relatively great influence on the read operations GR and FR. On the other hand, the degree of influence tends to be not so high in the read operations CR and DR. Therefore, for example, the following relationship can be built.

|ΔVG5|>|ΔVG1|

|ΔVG5|>|ΔVC5|, |ΔVD5|

The above relationship is merely one example and not limited to such a case. The relationship is expressed by absolute values because the shift amount ΔV has a negative value if the influence of a variation factor is a variation in threshold value to a negative-voltage side. Of course, the shift amount ΔV may have a negative value or a positive value, and has only to have a value suitable for the shift read process.

The shift table configured as described above is stored, for example, in one of the blocks BLK of the NAND flash memory 100. Then, it is read by the memory controller 200 and stored in the memory 220 or the like, for example, immediately after power is turned on.

1.1.6. History Table

The memory controller 200 also stores a history table. The history table will be described with reference to FIG. 7, which is a conceptual diagram showing an example of the history table.

As shown in FIG. 7, the history table stores a relationship between word lines WL0 to WL63 in each block BLK and shift indexes of the shift table which are to be applied to the word lines WL0 to WL63.

The history table stores information about the shift amount ΔV of read voltage, which is to be applied to the word lines WL of the block BLK, using, for example, the shift indexes. The memory controller 200 refers to the history table to determine a read voltage to be applied to a read target word line WL.

In the example of FIG. 7, the shift index 1 is assigned to the word line WL0 of the block BLK0. This means that when a read voltage is applied to the word line WL0 of the block BLK0, the shift amount ΔV (ΔVA1, ΔVB1, . . . and ΔVG1) corresponding to the shift index 1 of the shift table shown in FIG. 6 is applied to a default value. The shift index 0 is assigned in common to the word lines WL1 to WL7 of the block BLK0. This means that a default read voltage is applied when a read voltage is applied to the word lines WL1 to WL7 of the block BLK0. The shift index may thus be assigned to a single word line WL or a group of word lines WL.

The memory controller 200 sets the shift amount ΔV designated in the history table to the NAND flash memory 100 using a set feature command or the like. It is thus unnecessary to designate the shift amount ΔV for each read operation. However, when the shift index is updated in the history table, the memory controller 200 resets the shift amount ΔV for the NAND flash memory 100. The set feature command is a command capable of changing various settings of a voltage applied to the NAND flash memory 100, timing when the voltage is applied, etc.

The degree of influence from the variation factors may vary depending on which word line WL corresponds to the memory cell transistor MT. For example, the influence of the variation factors is large especially for the memory cell transistor MT located at either end portion of the NAND string NS. In other words, the variation factors have a relatively large influence upon the memory cell transistors MT corresponding to the word lines WL0 and WL63 and several word lines WL relatively close to the word lines WL0 and WL63 (hereinafter simply referred to "end-portion word line WL" for convenience of description). The influence tends to be not so large for the memory cell transistors MT corresponding to the other word lines WL. In most cases, thus, for example, the following relationship can be built.

(Shift indexes of word lines WL located at end portions of NAND string NS) ? (Shift indexes of the other word lines WL)

The above relationship is merely an example and is not limited to the foregoing case. For example, as shown in FIG. 8, when a low-stage portion LNS and a high-stage portion HNS of one NAND string NS are joined together via a junction JT in a stacked direction of conductors 11-13, the end-portion word lines WL may include word lines WL close to the junction JT. That is, in the example shown in FIG. 8, the end-portion word lines WL may include word lines WL31 and WL32 and several word lines WL relatively close to the word lines WL31 and WL32 as well as word lines WL0 and WL63.

The history table so configured is stored in the memory 220 or the like. During power interrupt of the memory system 1, the history table may be stored in, for example, the NAND flash memory 100 or another nonvolatile memory such as an electrically erasable programmable ROM (EEPROM)™ which is not shown. Immediately after power-up of the memory system 1, the history table may be read by the memory controller 200.

1.1.7. Flag Table

The memory controller 200 further stores a flag table. The flag table will be described with reference to FIG. 9, which is a conceptual diagram to explain an example of the flag table.

As illustrated in FIG. 9, the flag table stores a block refresh flag for each block BLK and also stores a reprogramming refresh flag for each word line WL. The reprogramming refresh flag and block refresh flag are each set to, for example, "1" when a reprogramming refresh process and a block refresh process are reserved by the memory controller 200, respectively. The reprogramming refresh flag may be reset when the block refresh flag of the corresponding block BLK is, for example "1."

The reprogramming refresh process is a process to reduce the influence of the foregoing variation factors. More specifically, in the reprogramming refresh process, for example, a further write process (a reprogramming process) is executed for one or more memory cell transistors MT corresponding to a word line WL to which data has been written, which is determined as a refresh target, in a block BLK in which data is written to some of the word lines WL. In the reprogramming refresh process, furthermore, the same process can be executed for a block BLK in which data is written to all of the word lines WL. This reprogramming refresh process is executed without performing an erase process. Thus, the threshold voltage distribution of memory cell transistors MT corresponding to a specific word line WL (e.g. a word line WL at an end portion) which has been greatly influenced by the variation factors can be shifted to a high-voltage side and brought close to ideal threshold voltage distributions. This is the reprogramming refresh process.

The block refresh process (which is also called a relocating refresh process) is a process to relocate valid data in a block BLK to another block BLK for which an erase process has been completed, when correct data is difficult to be read even through the reprogramming refresh process or another process. The block refresh process may involve an erase process and include a process to write valid data in a refresh target block BLK back to the same block BLK.

Thus, the reprogramming refresh process and the block refresh process are common to each other in that the varied threshold voltage distribution is brought close to the ideal threshold voltage distributions. The reprogramming refresh process and the block refresh process can be generally referred to as, for example, a refresh process.

The flag table configured as described above is stored in a block BLK of the NAND flash memory 100. Like the history table, for example, the flag table is read out by the memory controller 200, for example, immediately after the memory system 1 is turned on and stored in the memory 220 or the like. When the power of the memory system 1 is cut off, the flag table stored in the memory 220 or the like is written to any block BLK of the NAND flash memory 100.

1.2. Operation

An operation of the memory system according to the first embodiment will be described below.

1.2.1. Read Operation

First, a flow of a read operation to be performed in the memory controller 200 will be described with reference to FIG. 10, which is a flowchart to explain an example of a read operation in the memory system according to the first embodiment. The operation of the memory controller 200 shown in FIG. 10 may be performed according to, for example, an instruction from the host device 300 or regularly performed under the control of the processor 230. For example, the following read operation is regularly performed to allow a history table stored in the memory 220 to be kept in the latest condition.

First, in step ST10, the memory controller 200 refers to a shift table and a history table in the memory 220 to specify a shift amount ΔV of a read target word line WL in a read target block BLK from information as shown in FIG. 11. Then, when or before a read command is issued to the NAND flash memory 100, the memory controller 200 sets the shift amount ΔV of the read target word line WL in the NAND flash memory 100 by, for example, a set feature command.

Thus, the driver 130 of the NAND flash memory 100 applies voltages, which are generated by adding the shift amount ΔV to default voltages VA, VB, . . . and VG during read process, to the read target word line WL as read voltage VCGR via the row decoder 120. In other words, instead of the original voltages VA, VB, . . . and VG, voltages (VA+ΔVA), (VB+ΔVB), . . . and (VG+ΔVG) are applied as read voltage VCGR.

Return to FIG. 10. In step ST11, upon receiving a data request instruction from the host device 300, the memory controller 200 issues a normal read command. The normal read command does not include information on the shift amount ΔV of the read voltage. Therefore, the NAND flash memory 100 reads data using a default read voltage and transmits it to the memory controller 200. In other words, for example, when a word line WL63 of the block BLK0 is selected, (VA+ΔVA3), (VB+ΔVB3), . . . and (VG+ΔVG3) are used as read voltage VCGR.

In step ST12, in the memory controller 200 that has received read data from the NAND flash memory 100, the ECC circuit 260 detects an error. When the read data includes no error or the ECC circuit 260 can correct an error (by a hard decision decoding) (Yes in step ST12), data read operation finishes. On the other hand, when the number of error bits included in the read data exceeds the number of bits that can be corrected by the ECC circuit 260 and the ECC circuit 260 cannot correct the errors (No in step ST12), the process advances to step ST13.

In step ST13, the memory controller 200 refers to the history table to determine whether a shift index corresponding to the read target word line WL reaches a maximum value of the shift index set in the shift table. (The shift index with the maximum value is also referred to as a final shift index. In the example of FIG. 6, the final shift index is equal to 5).

When the shift index corresponding to the read target word line WL does not reach the final shift index (No in step ST13), the process proceeds to step ST14. In step ST14, the memory controller 200 selects a next shift index in the shift table. Subsequently, in step ST15, the memory controller 200 issues a shift read command based on the selected shift index. In this case, for example, the command sequence issued by the memory controller 200 includes information indicating the shift amount ΔV and based on this information, the NAND flash memory 100 determines a read voltage VCGR. In the foregoing example, when the word line WL63 of the Block BLK0 is selected, (VA+ΔVA4), (VB+ΔVB4), . . . and (VG+ΔVG4) are used as read voltage VCGR. Then, in step ST16, in the memory controller 200, the ECC circuit 260 detects an error again for the data read through the shift read process. When the read data includes no errors or when the ECC circuit 260 can correct an error (Yes in step ST16), the process proceeds to step ST20. When the ECC circuit 260 cannot correct an error (No in step ST16), the process proceeds to step ST13. That is, the memory controller 200 repeats the shift read while incrementing the shift index until the selected shift index reaches the final value (Yes in step ST13) or the ECC circuit 260 succeeds in error correction (Yes in step ST16).

When a shift index corresponding to the read target word line WL reaches the final shift index (Yes in step ST13), the process advances to step ST17. In step ST17, the memory controller 200 executes a process to read data correctly. One example is a Vth tracking process. The Vth tracking process is a process of counting the number of on-cells (or off-cells) while finely varying a voltage applied to the read target word line WL to search for the intersection of the overlapping threshold voltage distributions and determine a voltage corresponding to a point that is expected to be close to the intersection (an optimal read voltage to be expected). Then, the read operation is performed using the optimal read voltage to be expected. In step ST18, in the memory controller 200, the ECC circuit 260 detects an error again. Specifically, for example, when the Vth tracking process is carried out, the hard decision decoding is performed for the data read using the optimal read voltage to be expected. When the ECC circuit 260 can correct an error (Yes in step ST18), the process advances to step ST20. When the ECC circuit 260 cannot correct an error (No in step ST18), the process advances to step ST19. In step ST19, the memory controller 200, for example, determines that it cannot correct data correctly based on the ECC result (ECC fail) and notifies the ECC circuit of error correction failure.

When the ECC circuit 260 can correct an error in one of steps ST16 and ST18, the memory controller 200 updates the history table in the memory 220 in step ST20. In other words, in the history table, a shift index regarding the read target word line WL in the block BLK is changed to a value selected in the last step ST16. FIG. 12 shows an example in which the shift read process for the word line WL63 fails in error correction when the shift index is equal to 3 and succeeds therein when the shift index is equal to 4. As shown in FIG. 12, the shift amounts ΔVA3, ΔVB3, ..., and ΔVG3 for the word line WL63 are updated to shift amounts ΔVA4, ΔVB4, ..., and ΔVG4, respectively.

In step ST21, the memory controller 200 determines whether the read target word line WL satisfies the trigger conditions of a refresh process. When the memory controller 200 determines that the read target word line WL does not satisfy the trigger conditions of the refresh process (No in step ST21), the read operation finishes without reserving the refresh process for the word line WL. More specifically, the memory controller 200 terminates the read operation without reserving a reprogramming refresh process for the read target word line WL or a block refresh process for the block BLK including the read target word line WL. When the memory controller 200 determines that the read target word line WL satisfies the trigger conditions of the refresh process (Yes in step ST21), the memory controller 200 determines execution of the refresh process for the word line WL, and the process proceeds to step ST22.

In step ST22, the memory controller 200 determines whether the word line WL for which the refresh process is to be executed satisfies the application conditions for the reprogramming refresh process. When the memory controller 200 determines that the read target word line WL does not satisfy the application conditions for the reprogramming refresh process (No in step ST22), the memory controller 200 determines execution of the block refresh process for the block BLK including the read target word line WL, and the process proceeds to step ST23. In step ST23, the memory controller 200 reserves the block refresh process. That is, the processor 230 sets a block refresh flag in of block BLK for which it is determined that the block refresh process is to be executed in step ST22 in, for example, the flag table in the memory 220. The read operation is thus finished, and the process advances to step ST24 in order to execute a subsequent block refresh process.

In step ST24, the memory controller 200 refers to the flag table to execute the block refresh process for the block BLK of which the block refresh flag is set.

In step ST25, the memory controller 200 updates the flag table by resetting the block refresh flag set for the block BLK in which the block refresh process is finished.

The processes in steps ST24 and ST25 need not be executed immediately after the reservation process in step ST23 but have only to be executed with appropriate timing on the background.

When the memory controller 200 determines that the read target word line WL satisfies the application conditions for the reprogramming refresh process (Yes in step ST22), it determines to execute the reprogramming refresh process for the word line WL, and the process advances to step ST26. In step ST26, the memory controller 200 reserves the reprogramming refresh process. That is, for example, in the flag table in the memory 220, the processor 230 sets a reprogramming refresh flag of the word line WL for which the memory controller 200 determines to execute the reprogramming refresh process in step ST22. The read operation is thus finished, and the process advances to step ST27 in order to perform a subsequent reprogramming refresh process.

In step ST27, the memory controller 200 refers to the flag table to perform the reprogramming refresh process for the word line WL of which the reprogramming refresh flag is set.

In step ST28, the memory controller 200 updates the flag table by resetting the reprogramming refresh flag set for the word line WL in which the reprogramming refresh process is finished.

The processes in steps ST27 and ST28 need not be performed immediately after the reservation process in step ST26 but have only to be performed with appropriate timing on the background.

The foregoing read operation makes it possible to determine based upon different conditions whether to perform the refresh process and whether to apply the reprogramming refresh process.

1.2.2. Trigger Conditions of Refresh Process

The trigger conditions of the refresh process will specifically be described below.

As described above, the refresh process is performed to make varied threshold voltage distribution close to the ideal state. It is thus desirable to set the trigger conditions and application conditions such that the refresh process is performed when the width of variation from the current threshold voltage distribution to the ideal threshold voltage distribution reaches a predetermined value.

1.2.2.1. Error Correction Conditions

For example, the variation width of the threshold voltage distribution can be evaluated based upon conditions (error correction conditions) that error bits included in the read data can be corrected. The error correction conditions include, for example, correction capability of the ECC circuit 260 including a type of error-correcting code applied to the ECC circuit 260 and a code rate, and read conditions for read data input to the ECC circuit 260. The error correction conditions need not always include both of the correction capability and read conditions for the read data but may include at least one of them or any other conditions.

Any hard decision decoding code including BCH and RS codes and any soft decision decoding code including an LDPC code can be applied to the error correction code. Any read conditions such as a shift read process and a Vth tracking process can be applied to the read conditions. When the shift read process is applied to the read conditions, a shift index may be added further as the read condition.

The following conditions are specific examples of the trigger conditions of the refresh process to be set based on the error correction conditions.

(Example 1-1a) "When an error correction process based upon data read by the shift read process of a shift index and a BCH code fails, the refresh process is triggered."

(Example 1-1b) "When an error correction process based upon data read by an optimum read voltage determined by the Vth tracking process and the BCH code fails, the refresh process is triggered."

1.2.2.2. Number of Error Bits

For example, the width of variations in threshold voltage distribution can be evaluated by the number of error bits contained in data read at a certain read voltage. That is, the trigger conditions of the refresh process may be set based upon the number of error bits (or error bit ratio) in the case of success in error correction. The error bit ratio is, for example, the ratio of the number of error bits to the number of bits in read data that has been subjected to the error correction process.

The following condition is a specific example of the trigger conditions of the refresh process to be set based on the number of error bits.

(Example 1-2) "When the number of error bits exceeds a threshold value, the refresh process is triggered."

The number of error bits varies according to the level of a read voltage. For example, the number of error bits can be decreased when data is read at the optimum read voltage determined by the Vth tracking process and the shift read process to which the shift amount ΔV of a larger shift index is applied than when data is read at a default read voltage (read voltage when shift index is equal to 0). For this reason, when the number of error bits is applied to the trigger conditions of the refresh process, a threshold value of the number of error bits to determine whether the refresh process may be reserved such that it varies according to the level of the read voltage.

1.2.2.3. Shift Amount

For example, the width of variations in threshold voltage can be evaluated by the shift indexes in the history table or the shift amount ΔV of the optimum read voltage determined by the Vth tracking process from the default read voltage. That is, the trigger conditions of the refresh process may be set based on the shift index of the shift read process or the shift amount ΔV determined by the Vth tracking process. The shift amount ΔV in the Vth tracking process can be calculated on either side of the memory controller 200 and the NAND flash memory 100.

The following conditions are specific examples of the trigger conditions of the refresh process to be set based on the shift amount ΔV.

(Example 1-3a) "When the shift index in the history table exceeds a threshold value, the refresh process is triggered."

(Example 1-3b) "When the shift amount ΔV of the optimum read voltage determined by the Vth tracking process from the default read voltage exceeds a threshold value, the refresh process is triggered."

As threshold values for the shift amount ΔV, for example, different values may be set to the voltages VA to VG to distinguish the respective states. In this case, it may be determined that the refresh process is triggered when one of the voltages VA to VG exceeds a threshold voltage.

1.2.2.4. Elapsed Time

For example, the width of variations in threshold voltage may be increased with the increase of the length of time elapsed from the completion of data write. The trigger conditions of the refresh process may thus be set based on time elapsed from when data is written to the memory cell transistor MT connected to a read target word line WL. The time elapsed from the completion of data write is stored and managed in, for example, the memory 220 in the memory controller 200.

The following condition is a specific example of the trigger conditions of the refresh process to be set based on the time elapsed from the completion of data write.

(Example 1-4) "When the time elapsed from the completion of data write exceeds a threshold value, the refresh process is triggered."

The memory controller 200 can manage the time elapsed from the completion of data write in any unit such as a unit of a block BLK as well as a unit of a word line WL, and the like.

1.2.2.5. Number of Read Operations

For example, the width of variations in threshold voltage may be increased with the increase of the number of read operations. The trigger conditions of the refresh process may thus be set based on the number of read operations on any word line WL in a read target block BLK. The number of read operations is counted for data written after the last erase operation for the block BLK and stored and managed in the memory 220 in the memory controller 200.

The following condition is a specific example of the trigger conditions of the refresh process to be set based on the number of read operations.

(Example 1-5) "When the number of read operations exceeds a threshold value, the refresh process is triggered."

The memory controller 200 can manage the number of read operations in any unit such as a unit of a word line WL as well as a unit of a block BLK, and the like.

By setting the trigger conditions of the refresh process as described above, it can properly be determined whether the refresh process needs to be performed.

1.2.3. Application Conditions for Reprogramming Refresh Process

Application conditions for the reprogramming refresh process will be described below.

1.2.3.1. Variations in Threshold Voltage Distribution with Reprogramming Refresh Process As described above, the reprogramming refresh process is a process of shifting a threshold voltage distribution to a high-voltage side by performing a reprogramming process for a memory cell transistor MT to which data has already been written. In the reprogramming refresh process, therefore, it is likely that the process of reprogramming data to a reprogramming target memory cell transistor MT will cause an unexpected charge injection into its adjacent transistors MT to increase the threshold voltage. Accordingly, even though the reprogramming refresh process is performed, the width (or overlap) between adjacent threshold voltage distributions may not improve to the same extent as at just after the completion of write.

FIG. 13 is a diagram to explain variations in threshold voltage distribution before and after the reprogramming refresh process. In FIG. 13, threshold voltage distributions corresponding to the "Er" and "A" states before and after the reprogramming refresh process is shown as one example, and threshold voltage distributions corresponding to the "B" to "G" states are omitted for convenience sake. Specifically, FIG. 13(A) shows threshold voltage distributions immediately after a write process, FIG. 13(B) shows threshold voltage distributions after a predetermined time has elapsed from the state of FIG. 13(A), and FIG. 13(C) shows threshold voltage distributions after the reprogramming refresh process has been executed.

As shown in FIG. 13(A), the threshold voltage distributions corresponding to the "Er" and "A" states are separated from each other (or the overlapped portion is very small) immediately after the write process. Specifically, the lowest voltage Va_1 of the threshold voltage distribution corresponding to the "A" state and the highest voltage Ve_h of the threshold voltage distribution corresponding to the "Er" state are separated by a difference Δ (=Va_l−Ve_h).

As time elapses from the write process, the threshold voltage distributions are influenced by variation factors. Specifically, as shown in FIG. 13(B), the lowest voltage of the threshold voltage distribution corresponding to the "A" state is shifted to a low-voltage side by variation factors as time passes, and becomes a voltage Va_l'. The highest voltage of the threshold voltage distribution corresponding to the "Er" state is shifted to a high-voltage side by variation factors as time passes, and becomes a voltage Ve_h'.

Therefore, as time elapses from a write process, a difference Δ'(=Va_l'−Ve_h') between the lowest voltage Va_l' of the threshold voltage distribution corresponding to the "A" state and the highest voltage Ve_h' of the threshold voltage distribution corresponding to the "Er" state becomes smaller than the difference Δ (Δ'<Δ). That is, the difference (i.e., margin) Δ' deteriorates with time.

Then, the reprogramming refresh process is performed for a word line WL corresponding to a voltage close to the lowest voltage of the threshold voltage distribution that has shifted to the low-voltage side. As shown in FIG. 13(C), the lowest voltage of the threshold voltage distribution corresponding to the "A" state is shifted again to the high-voltage side by the reprogramming refresh process, and becomes a voltage Va_l". Accordingly, the threshold voltage distribution corresponding to the "A" state is brought close to a state immediately after the write process.

Since the reprogramming refresh process is a process to shift a voltage, which has been close to the lowest voltage of the threshold voltage distribution, to the high-voltage side, a voltage close to the highest voltage of the threshold voltage distribution corresponding to the "Er" state cannot be shifted to the low-voltage side. In addition, the threshold voltage of the memory cell transistor MT in the "Er" state might be increased by performing the reprogramming refresh process for its adjacent memory cell transistors MT. Accordingly, the highest voltage of the threshold voltage distribution corresponding to the "Er" state is further shifted to the high-voltage side, and becomes a voltage Ve_h".

After the reprogramming refresh process, therefore, a difference Δ"(=Va_l"−Ve_h") between the lowest voltage Va_l" of the threshold voltage distribution corresponding to the "A" state and the highest voltage Ve_h" of the threshold voltage distribution corresponding to the "Er" state becomes larger than the difference Δ' (Δ">Δ'). That is, the reprogramming refresh process allows the influence of variation factors to be reduced. Since, however, a voltage close to the highest voltage of the threshold voltage distribution corresponding to the "Er" state is still shifted to the high-voltage side, the difference Δ" is smaller than the difference Δ (Δ"<Δ). After that, similarly, the difference Δ" is likely to become smaller gradually than the difference Δ" immediately after the last reprogramming refresh process is performed, each time the reprogramming refresh process is performed. If the difference Δ" decreases (for example, it is asymptotic to the difference Δ'), the distinction of adjacent two states cannot be improved even by performing the reprogramming refresh process again. This is undesirable. It is thus desirable that the application conditions for the reprogramming refresh process be set based upon an index (referred to as a "margin" hereinafter) which quantitatively indicates whether adjacent two states such as the difference Δ" can be distinguished.

In the example of FIG. 13, the "Er" and "A" states have been described. However, the application conditions for the reprogramming refresh process are not limited to a margin between the "Er" and "A" states but can be set based on a margin between adjacent any two states. Giving a supplementary description, as described above, in the "Er" state, a high-voltage side tail of the threshold voltage distribution tends to shift to the high-voltage side as time passes and in the other states, the high-voltage side tail of the threshold voltage distribution tends to shift to a low voltage side as time passes. Therefore, it may be between the "Er" and "A" states that the margin deteriorates the most significantly when its variations are evaluated.

In either case, the following condition may be set if, for example, a margin is used to determine whether to perform the reprogramming refresh process.

"When the margin exceeds a threshold value, it is determined to apply the reprogramming refresh process and when the margin is not larger than the threshold value, it is determined to apply the block refresh process because no significant advantage is obtained from the reprogramming refresh process."

In fact, instead of directly calculating the difference Δ", the margin is quantitatively evaluated using a variety of methods. Below is a description of specific examples of the margin and the application conditions for the reprogramming refresh process based upon the margin. It should be noted that the application conditions for the reprogramming refresh process described below are based upon the premise that they satisfy the trigger conditions of the foregoing refresh process.

1.2.3.2. Number of Memory Cells Having Threshold Voltage within Predetermined Range For example, the margin may be evaluated based on the number of memory cells having a threshold voltage within a predetermined range. The predetermined range is set, for example, between the peaks of threshold voltage distributions corresponding to adjacent two states. More specifically, for example, when the predetermined range is defined as a range from a voltage Vs1 to a voltage Vs2 (Vs1<Vs2), it is set to a range with the relationship of VP1<Vs1<Vs2<VP2 where the voltage VP1 corresponds to a peak of one threshold voltage distribution and the voltage VP2 corresponds to a peak of another threshold voltage distribution. The predetermined range is also set, for example, to include a range in which one threshold voltage distribution and another threshold voltage distribution can intersect. The increase in the number of memory cells having a threshold voltage within the predetermined range can thus be associated with the decrease in the margin.

The following condition is a specific example of the application conditions for the reprogramming refresh process to be set based on the number of memory cells having a threshold voltage within the predetermined range.

(Example 2-1) "When the number of memory cells having a threshold voltage within a predetermined range is not larger than a threshold value, it is determined to apply the reprogramming refresh process and when it exceeds the threshold value, it is determined to apply the block refresh process."

1.2.3.3. Number of Error Bits on High-Voltage Side

For example, the margin can be evaluated based upon the number of bits in which a predetermined state is read erroneously as a higher-voltage state (hereinafter, also referred to as "the number of high-voltage side error bits" for convenience sake). For example, if the number of bits in which the "Er" state is read erroneously as the "A" state increases, it is considered that a voltage close to the highest voltage of the threshold voltage distribution corresponding to the "Er" state is shifted to the much higher-voltage side than a voltage close to the lowest voltage of the threshold voltage distribution corresponding to the "A" state. The increase in the number of high-voltage side error bits, can thus be associated with the decrease in the margin.

The following condition is a specific example of the application conditions for the reprogramming refresh process to be set based on the number of high-voltage side error bits.

(Example 2-2) "When the number of high-voltage side error bits in a predetermined state is not larger than a threshold value, it is determined to apply the reprogramming refresh process and when it exceeds the threshold value, it is determined to apply the block refresh process."

The number of high-voltage side error bits can be specified, for example, by comparing data including an error read in step ST15 in FIG. 10 and data whose error has been corrected in step ST16. More specifically, for example, when the number of high-voltage side error bits generated in the "Er" state is specified, the memory controller 200 first extracts memory cell transistors MT which are determined to be in the "Er" state in the data whose error has been corrected (which are expected to be in the "Er" state). Then, the memory controller 200 extracts memory cell transistors MT, which are determined to be not in the "Er" state in the data including the error, from the memory cell transistors MT which are expected to be in the "Er" state, and counted. The memory controller 200 can thus specify the number of high-voltage side error bits in the "Er" state.

1.2.3.4. Shift Amount

For example, the margin may be evaluated based upon the shift amount ΔV for a predetermined one of the voltages VA to VG applied during the shift read process or Vth tracking process. That is, the increase in the shift amount ΔV and the decrease in the margin can be associated with each other. The shift amount ΔV of the shift read process may be replaced with the shift index stored in the history table.

The following conditions are specific examples of the application conditions for the reprogramming refresh process to be set based on the shift amount ΔV.

(Example 2-3a) "When the shift index in the history table is not larger than a threshold value, it is determined to apply the reprogramming refresh process and when it exceeds the threshold value, it is determined to apply the block refresh process."

(Example 2-3b) "When the amount of shift of a read voltage determined by the Vth tracking process from the default read voltage is not larger than a threshold value, it is determined to apply the reprogramming refresh process and when it exceeds the threshold value, it is determined to apply the block refresh process."

1.2.3.5. Error Correction Conditions

For example, the margin may be evaluated based upon error correction conditions. That is, the degree of the error correction conditions under which error correction succeeds is associated with a decrease in the margin. The error correction conditions may be employed for the application conditions for the reprogramming refresh process.

The following condition is a specific example of the application conditions for the reprogramming refresh process to be set based on the error correction conditions.

(Example 2-4) "When an error correction process has succeeded based on read data through the shift read process to which any shift index that is not larger than a predetermined shift index is applied, it is determined to apply the reprogramming refresh process. When the error correction process has failed even through the shift read process, it is determined to apply the block refresh process."

The value of "any shift index that is not larger than a predetermined shift index" in the above condition of (Example 2-4) can correspond to, for example, the values indicated below.

1) In the retry read sequence to continue to try error correction until it succeeds while changing the shift amount ΔV, a value corresponding to the number of retry read processes performed until the error correction succeeds.

2) A value corresponding to the shift amount ΔV when error correction has succeeded by the retry read sequence.

1.2.3.6. Number of Executions of Reprogramming Refresh Processes

As described above, in the reprogramming refresh process, the margin may decrease with the increase of the number of executions of the reprogramming refresh processes. The margin may thus be evaluated based upon the number of reprogramming refresh processes. That is, the increase of the number of reprogramming refresh processes performed for the same block BLK or the same word line WL from the last-performed block refresh process is associated with a decrease in the margin. The number of reprogramming refresh processes may be employed as the application conditions for the reprogramming refresh process.

The following conditions are specific examples of the application conditions for the reprogramming refresh process to be set based on the number of reprogramming refresh processes.

(Example 2-5a) "When the number of reprogramming refresh processes performed for the same block BLK from the last-performed block refresh process is not larger than a threshold value, it is determined to apply the reprogramming refresh process and when it exceeds the threshold value, it is determined to apply the block refresh process."

(Example 2-5b) "When the number of reprogramming refresh processes performed for the same word line WL from the last-performed block refresh process is not larger than a threshold value, it is determined to apply the reprogramming refresh process and when it exceeds the threshold value, it is determined to apply the block refresh process."

When the block refresh process is performed, the threshold voltage distribution is reset to a state that is equivalent to the state immediately after a data write process (for example, the state in which the number of reprogramming refresh processes is "0"). Accordingly, the number of reprogramming refresh processes is also reset to "0."

1.2.3.7. Improvement Rate of Threshold voltage distribution by Reprogramming Refresh Process As described above, as the number of reprogramming refresh processes increases, the improvement rate of the margin may be lowered. The application conditions for the reprogramming refresh process may thus be set based on the improvement rate of the margin through the last reprogramming refresh process. The improvement rate of the margin is, for example, a result of comparison between a margin immediately before the execution of the reprogramming refresh process and a margin immediately thereafter (corresponding to, for example, (Δ"-Δ') in the example of FIG. 13). That is, the decrease in the improvement rate of the margin and the decrease in the margin are associated with each other.

The following conditions are specific examples of the application conditions for the reprogramming refresh process to be set based on the improvement rate of the margin.

(Example 2-6a) "When a difference between shift indexes in the history table before and after the last reprogramming refresh process exceeds a threshold value, it is determined to apply the reprogramming refresh process and when it is not larger than the threshold value, it is determined to apply the block refresh process."

(Example 2-6b) "When a difference between the number of error bits before and after the last reprogramming refresh process exceeds a threshold value, it is determined to apply the reprogramming refresh process and when it is not larger than the threshold value, it is determined to apply the block refresh process."

(Example 2-6c) "When the decrease rate of the number of error bits before and after the last reprogramming refresh process exceeds a threshold value, it is determined to apply the reprogramming refresh process and when it is not larger than the threshold value, it is determined to apply the block refresh process."

1.2.3.8. Frequency of Reprogramming Refresh Process

As described above, as the number of reprogramming refresh processes increases, the margin tends to decrease. Accordingly, time required until the trigger conditions of the refresh process are satisfied may be shortened. That is, as the number of reprogramming refresh processes increases, the frequency of the refresh process may be increased. Therefore, the number of reprogramming refresh processes and the decrease in the margin are associated with each other.

The following conditions are specific examples of the application conditions for the reprogramming refresh process to be set based on the frequency of the reprogramming refresh process.

(Example 2-7a) "When the number of reprogramming refresh processes performed per unit time is not higher than a threshold value, it is determined to apply the reprogramming refresh process and when it exceeds the threshold value, it is determined to apply the block refresh process."

(Example 2-7b) "When the number of reprogramming refresh processes performed per the number of executions of a predetermined process is not larger than a threshold value, it is determined to apply the reprogramming refresh process and when it exceeds the threshold value, it is determined to apply the block refresh process."

The "predetermined process" in "Example 2-7b" is a process that is repeated regularly or irregularly and includes, for example, a determination process of refresh process trigger condition and a history table update process.

1.2.3.9. Address of Word Line

As described above, the variation factors to degrade the margin may depend on a word line WL. Specifically, the margin is likely to decrease in the threshold voltage distribution of memory cell transistors MT corresponding to several word lines WL located at either end portion of the NAND string NS, whereas the margin is unlikely to decrease in the threshold voltage distribution of memory cell transistors MT corresponding to the other word lines WL. That is, when the margin corresponding to several word lines WL located at either end portion lowers, a reprogramming refresh process to be performed for each of the word lines WL is effective. When the margin corresponding to the other word lines WL lowers, a block refresh process to be performed for each of the blocks BLK is may be more effective. The application conditions for the reprogramming refresh process can thus be set based on the address of the word line WL.

The following conditions are specific examples of the application conditions for the reprogramming refresh process to be set based on the address of the word line WL.

(Example 2-8) "When the word line WL satisfying the trigger conditions of the refresh process is located at an end portion of the NAND string NS, it is determined to apply the reprogramming refresh process and when it is not located at the end portion, it is determined to apply the block refresh process."

If the application conditions for the reprogramming refresh process are set as described above, it can appropriately be determined which of the reprogramming refresh process to be performed for each of the word lines WL and the block refresh process to be performed for each of the blocks BLK is more effective.

The foregoing application conditions for the reprogramming refresh process can independently be set to the trigger conditions of any refresh process. The application conditions for the reprogramming refresh process may be used in combination of a plurality of conditions.

1.2.4. Flowchart of Reservation Conditions

Below are some specific examples of a flowchart showing a case where the trigger conditions of the refresh process and the application conditions for the reprogramming refresh process described above are employed.

1.2.4.1. First Example

FIG. 14 is a flowchart showing a case where the condition based on the shift amount $\Delta V$ (example 1-3a) is applied as the trigger condition of the refresh process and the condition based on the shift amount $\Delta V$ (example 2-3a) is applied as the application condition for the reprogramming refresh process. The steps of the flowchart shown in FIG. 14 correspond to steps ST21 to ST28 in FIG. 10.

As shown in FIG. 14, in step ST21a, the memory controller 200 refers to the history table updated in step ST20 to determine whether a shift index corresponding to a read target word line WL exceeds a threshold value X (e.g. "3"). When the shift index is not larger than the threshold value X (No in step ST21a), the memory controller 200 finishes the read operation without reserving the reprogramming refresh process or the block refresh process. When the shift index exceeds the threshold value X (Yes in step ST21a), the memory controller 200 determines the execution of the refresh process for the read target word line WL, and the process proceeds to step ST22a.

In step ST22a, the memory controller 200 refers to the history table again to determine whether a shift index corresponding to the word line WL for which the execution of the refresh process is determined exceeds another threshold value Y (e.g. "4"). When the shift index exceeds the threshold value Y (Yes in step ST22a), the process proceeds to steps ST23 to ST25, in which the block refresh process is reserved and performed, the block refresh flag is reset, and the like, as described with reference to FIG. 10. When the shift index is not larger than the threshold value Y (No in step ST22a), the process proceeds to steps ST26 to ST28, in which the reprogramming refresh process is reserved and performed, the reprogramming refresh flag is reset, and the like, as described with reference to FIG. 10.

As described above with reference to FIG. 10, steps ST24 and ST25 need not be performed immediately after step ST23, or steps ST27 and ST28 need not be performed immediately after step ST26, but these steps may be performed with appropriate timing on the background.

When the trigger conditions of the refresh process and the application conditions for the reprogramming refresh process are the same evaluation target (shift index in the example of FIG. 14), the threshold value Y in step ST22a is set larger than the threshold value X in step ST21a.

With the foregoing operations, first, it can be determined whether to perform the refresh process based upon the shift index of the history table. Then, when it is determined to perform the refresh process, it can be further determined which of the reprogramming refresh process and the block refresh process is to be performed based upon the shift index.

1.2.4.2. Second Example

Figure 15:
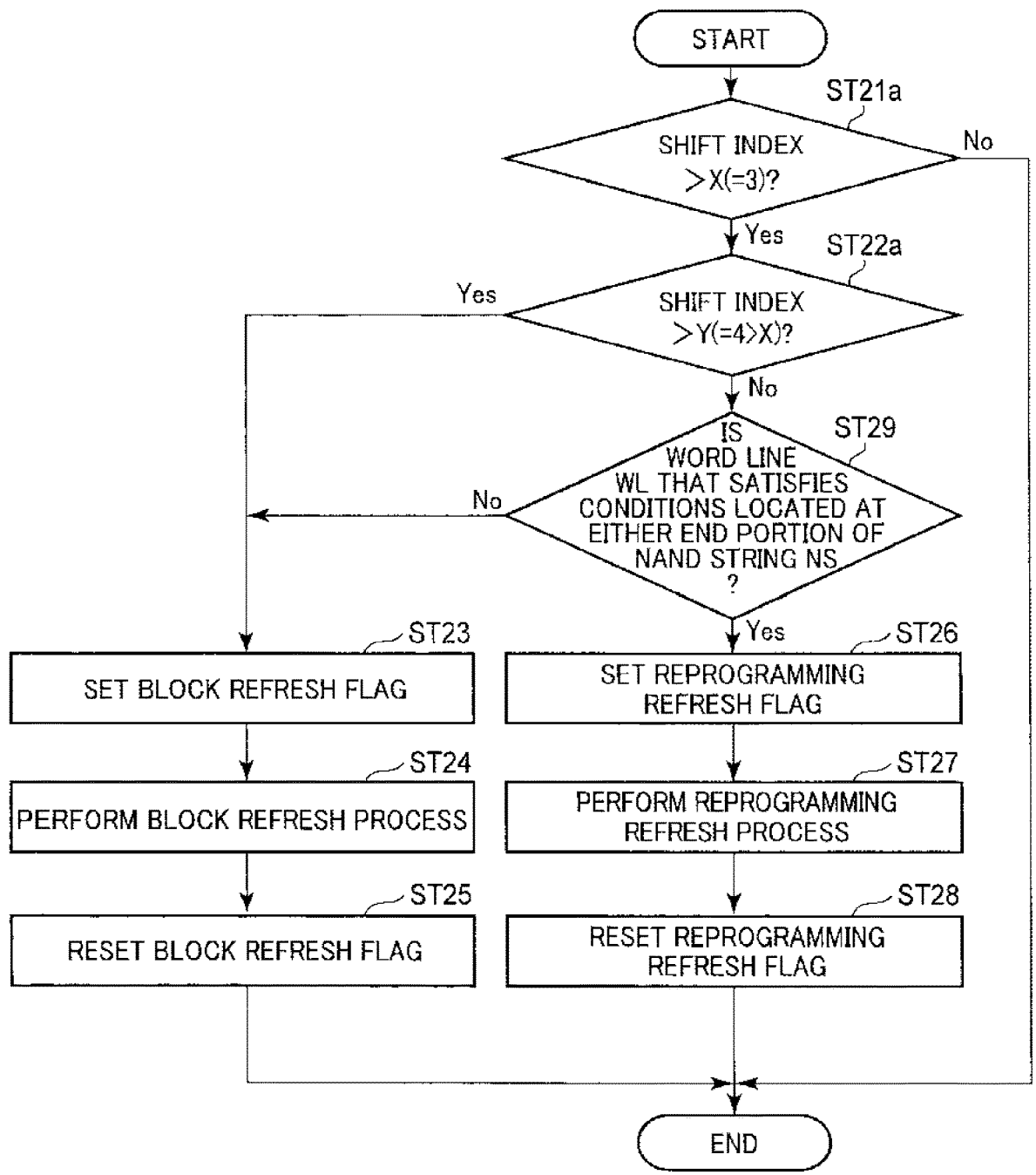
FIG. 15 is a flowchart to explain an example of the operation of determining whether each of the block refresh process and the reprogramming refresh process is to be reserved in the memory system according to the first embodiment.

FIG. 15 is a flowchart showing a case where the condition based on the shift amount ΔV (example 1-3a) is applied as the trigger condition of the refresh process, the condition based on the shift amount ΔV (example 2-3a) and the condition based on the address of the word line WL (example 2-8) is applied as the application condition for the reprogramming refresh process. The flowchart shown in FIG. 15 includes step ST29 in addition to the steps of the flowchart shown in FIG. 14.

As shown in FIG. 15, since the operation in step ST21a is the same as that in FIG. 14, its description will be omitted.

In step ST22a, the memory controller 200 determines whether a shift index corresponding to the word line WL for which the execution of the refresh process is determined exceeds a threshold value Y (e.g. "4"). When the shift index exceeds the threshold value Y (Yes in step ST22a), the process proceeds to step ST23. When the shift index is not larger than the threshold value Y (No in step ST22a), the process proceeds to step ST29.

In step ST29, according to a result of the determination in steps ST21a and ST22a, the memory controller 200 determines whether the word line WL corresponding to the shift index which exceeds the threshold value X and is not larger than the threshold value Y is a word line WL at either end portion of the NAND string NS (e.g. word line WL close to selection transistors ST1 and ST2 or the junction JT). When the word line WL is not the end-portion word line WL (No in step ST29), the process proceeds to step ST23 and the block refresh process is reserved. When it is the end-portion word line WL (Yes in step ST25), the process proceeds to step ST26, in which the reprogramming refresh process is reserved.

Since the processes in steps ST23 to ST25 and ST26 to ST28 are the same as those in FIG. 14, their descriptions will be omitted.

With the foregoing operations, the condition that "a target word line WL is located at either end portion of the NAND string NS" can be imposed to the case where it is determined to perform the reprogramming refresh process in FIG. 14. Therefore, the reprogramming refresh process can be performed when the margin of only either end portion of the NAND string NS decreases, and the block refresh process can be performed when the margin of the entire NAND string NS decreases.

1.2.4.3. Third Example

Figure 16:
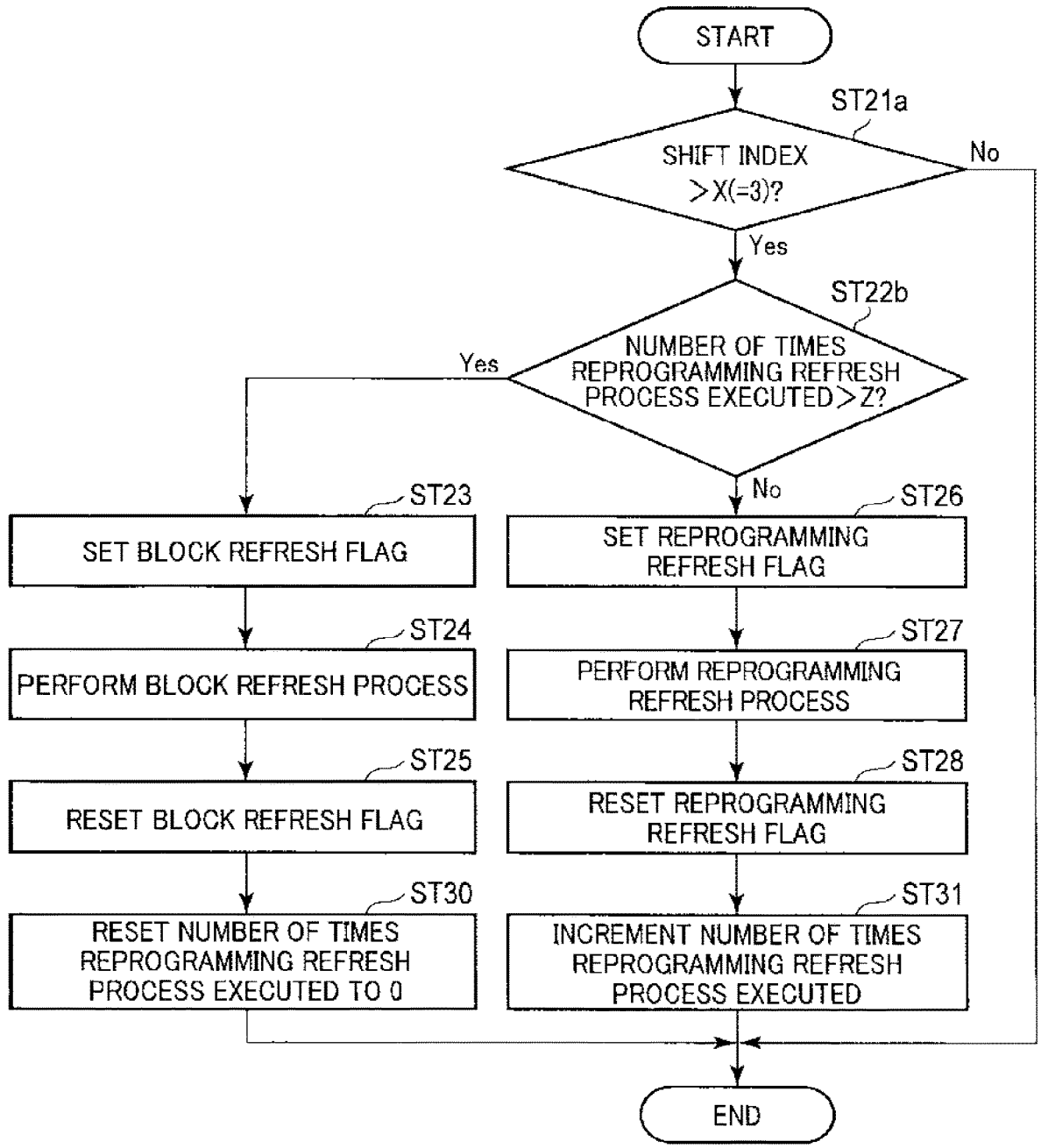
FIG. 16 is a flowchart to explain an example of the operation of determining whether each of the block refresh process and the reprogramming refresh process is to be reserved in the memory system according to the first embodiment.

FIG. 16 is a flowchart showing a case where the condition based on the shift amount ΔV (example 1-3a) is applied as the trigger condition of the refresh process and the condition based on the number of reprogramming refresh processes to be performed (example 2-5) is applied as the application condition for the reprogramming refresh process. The flowchart shown in FIG. 16 includes step ST22b in place of step ST22a in the flowchart shown in FIG. 14 and also includes steps ST30 and ST31.

As shown in FIG. 16, since the operation in step ST21a is the same as that in FIG. 14, its description will be omitted.

In step ST22b, the memory controller 200 determines whether the number of reprogramming refresh processes performed for the word line WL for which the execution of the refresh process is determined exceeds a threshold value Z.

When the number of reprogramming refresh processes exceeds the threshold value Z (Yes in step ST22b) as a result of the determination, the process proceeds to steps ST23 to ST25. Since the processes of steps ST23 to ST25 are the same as those in FIG. 14, their descriptions will be omitted. Subsequently, in step ST30, the memory controller 200 resets to "0" the number of reprogramming refresh processes stored in association with the word line WL in the block BLK for which the execution of the block refresh process is completed, and finishes the read operation.

When the number of reprogramming refresh processes is not larger than the threshold value Z (No in step ST22b), the process proceeds to step ST26. Since the processes in steps ST26 to ST28 are the same as those in FIG. 14, their descriptions will be omitted. Subsequently, in step ST31, the memory controller 200 increments the number of reprogramming refresh processes for the target word line WL, and finishes the read operation.

The foregoing operations make it possible to determine whether the reprogramming refresh process can be performed or not based upon how many times the reprogramming refresh process has been performed since the last block refresh process.

1.2.4.4. Fourth Example

Figure 17:
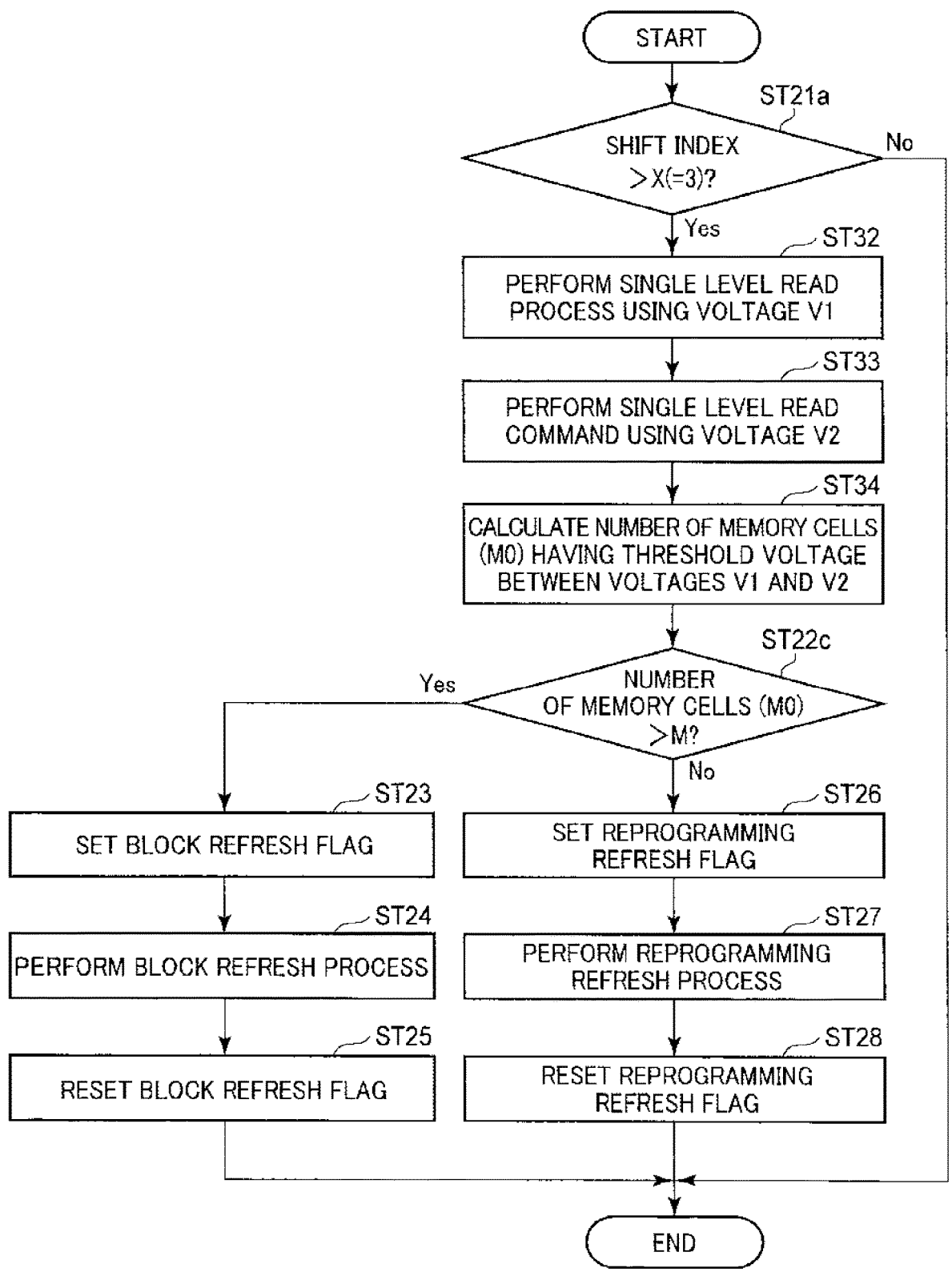
FIG. 17 is a flowchart to explain an example of the operation of determining whether each of the block refresh process and the reprogramming refresh process is to be reserved in the memory system according to the first embodiment.

FIG. 17 is a flowchart showing a case where the condition based on the shift amount ΔV (example 1-3a) is applied as the trigger condition of the refresh process and the condition based on the number of memory cells having a threshold voltage within a predetermined range (example 2-1) is applied as the application condition for the reprogramming refresh process. The flowchart shown in FIG. 17 includes step ST22c in place of step ST22a in the flowchart shown in FIG. 14 and also includes steps ST32, ST33 and ST34.

As shown in FIG. 17, since the operation in step ST21a is the same as that in FIG. 14, its description will be omitted.

In step ST32, the memory controller 200 issues a single level read command using a voltage V1 to the word line WL for which the execution of the refresh process is determined in step ST21a. A single level read process is a process of reading data using only a designated single read level, unlike the normal read process of reading data using a plurality of read levels (e.g. the voltages VA and VE are used if lower page data is read). The NAND flash memory 100 reads data using the voltage V1 and transmits it to the memory controller 200.

In step ST33, the memory controller 200 issues a single level read command using a voltage V2 to the word line WL for which the execution of the refresh process is determined in step ST21a. The NAND flash memory 100 reads data using the voltage V2 and transmits it to the memory controller 200.

When a margin between the "Er" and "A" states is evaluated, the voltages V1 and V2 are set between a peak of the threshold voltage distribution corresponding to the "Er" state and a peak of the threshold voltage distribution corresponding to the "A" state. More specifically, the voltages V1 and V2 may be set to sandwich read voltages ΔV+ΔV when an error was corrected in step ST16 or ST18 in FIG. 10. For example, the voltages V1 and V2 may be set to 0V and default read voltage VA, respectively. In either case, the voltages V1 and V2 are set such that the number of memory cell transistors MT significantly shifted to a high-voltage side from the "Er" state can be evaluated.

In step ST34, the memory controller 200 performs a logical operation (e.g. exclusive OR (XOR)) for two items of read data read out in steps ST32 and ST33 to specify memory cells having a threshold voltage between the voltages V1 and V2. Furthermore, the memory controller 200 counts the number of bits of "1" included in the result of the XOR to calculate the number of the specified memory cells (M0).

Note that in steps ST32 and ST33, the NAND flash memory 100 may not transmit the read data to the memory controller 200 but may store it in the latch circuits ADL to SDL in the sense amplifier module 140. In step ST34, the NAND flash memory 100 may perform the foregoing logical operation (XOR) with an operation unit OP in the sense amplifier module 140 and transmit the result to the memory controller 200.

In step ST22c, the memory controller 200 determines whether the number of memory cells (M0) calculated in step ST34 exceeds a threshold value M.

When the number of memory cells (M0) having a threshold voltage between the voltages V1 and V2 exceeds the threshold value M (Yes in step ST22c), the process advances to step ST23, in which the block refresh process is reserved. When the number of memory cells (M0) is not larger than the threshold value M (No in step ST22c), the process advances to step ST24, in which the reprogramming refresh process is reserved.

The foregoing operations make it possible to evaluate a margin using results of the two single level read processes and determine appropriately whether to perform the reprogramming refresh process or the block refresh process.

1.2.5. Reprogramming Refresh Process

The reprogramming refresh process in the memory system according to the first embodiment will be described below.

1.2.5.1. Overview of Reprogramming Refresh Process

First, an overview of the reprogramming refresh process in the memory system according to the first embodiment will be described with reference to a flowchart shown in FIG. 18. Hereinafter, a reprogramming refresh process target word line WL will be referred to as a selected word line WL and the other word lines WL will be referred to as unselected word lines WL.

The reprogramming refresh process includes two operations of a verify process and the reprogramming process. The verify process is a process of specifying one of the memory cell transistors MT connected to the selected word line WL, the threshold voltage of which decreases to such a degree that the reprogramming refresh process should be performed. The verify process may also be referred to as "a pre-verify process" because it is performed prior to the reprogramming process. The reprogramming process is a process of performing program processing for a memory cell transistor MT detected by the pre-verify process (namely, a process of trapping electric charges in a charge storage layer) to increase the threshold voltage.

Figure 18:
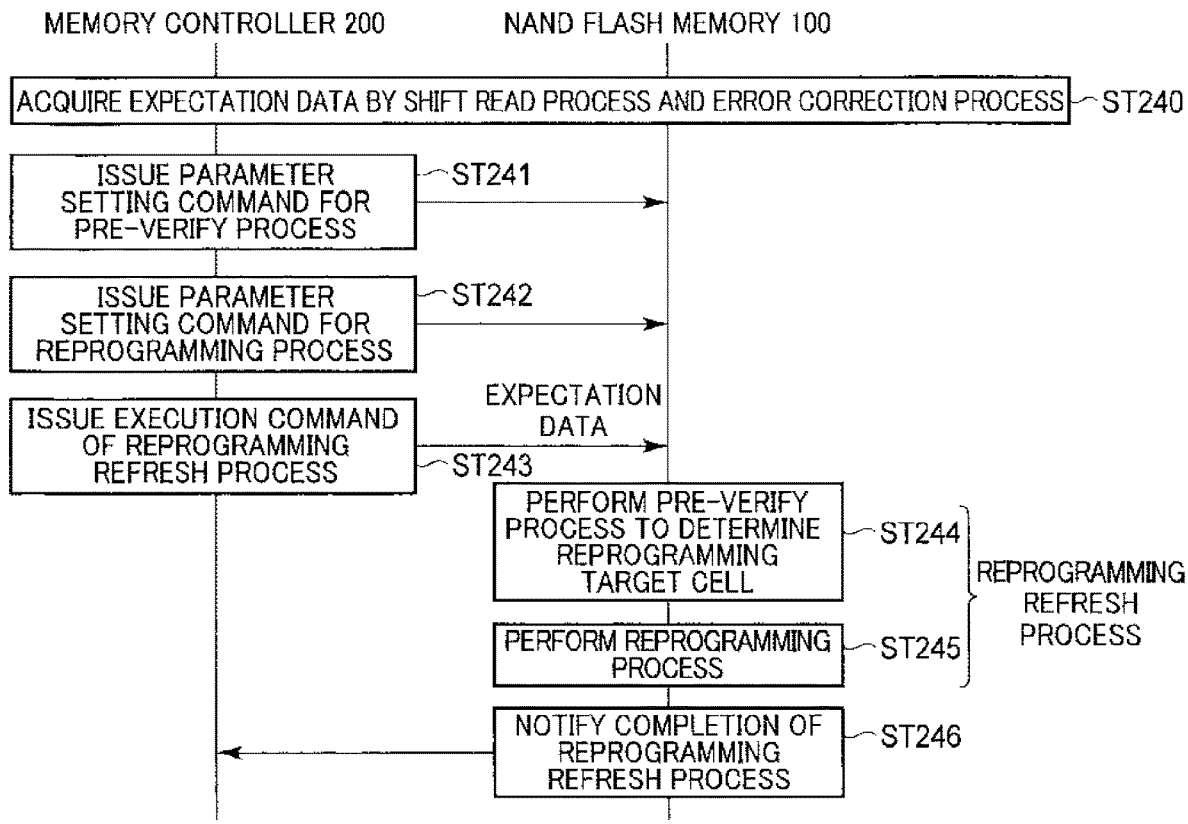
FIG. 18 is a flowchart to explain an overview of the reprogramming refresh process in the memory system according to the first embodiment.

As shown in FIG. 18, in step ST240, the memory controller 200 performs a read process for the memory cell transistor MT connected to a reprogramming refresh process target word line WL in the NAND flash memory 100, and correct an error. The memory controller thus acquires data that is expected to be stored in the memory cell transistor MT connected to the reprogramming refresh process target word line WL (which is also called expectation data). Note that the error-corrected data in step ST16 described with reference to FIG. 10 may be appropriated as the expectation data in step ST240.

In step ST241, the memory controller 200 issues a setting command of parameters applied to the pre-verify process to the NAND flash memory 100. Accordingly, the parameters applied to the pre-verify process are set to the NAND flash memory 100. The parameters applied to the pre-verify process include, for example, a verify voltage.

In step ST242, the memory controller 200 issues a setting command of parameters applied to the reprogramming process to the NAND flash memory 100. Accordingly, the parameters applied to the reprogramming process are set to the NAND flash memory 100. The parameters applied to the reprogramming process include, for example, a program voltage.

In step ST243, the memory controller 200 issues an execution command of the reprogramming refresh process to the NAND flash memory 100 and in this case it transfers the expectation data to the NAND flash memory 100. Upon receiving the execution command, the NAND flash memory 100 executes the reprogramming refresh process.

Specifically, in step ST244, the NAND flash memory 100 executes the pre-verify process for the memory cell transistors MT connected to the selected word line WL in accordance with the parameters in step ST241. Thus, memory cell transistors MT for which the reprogramming process should be executed, namely, memory cell transistors MT each of whose threshold voltage is lower than the verify voltage are specified.

In step ST245, the NAND flash memory 100 executes the reprogramming process for the memory cell transistor MT specified in step ST244 in accordance with the parameters set in step ST242. Thus, a low-voltage side tail of the threshold voltage distribution can be shifted to a high-voltage side.

In step ST246, the NAND flash memory 100 notifies the memory controller 200 of the completion of the reprogramming refresh process.

The reprogramming refresh process can thus be finished.

1.2.5.2. Command Sequence

The command sequence of the reprogramming refresh process issued from the memory controller 200 will be described below.

Figure 19:
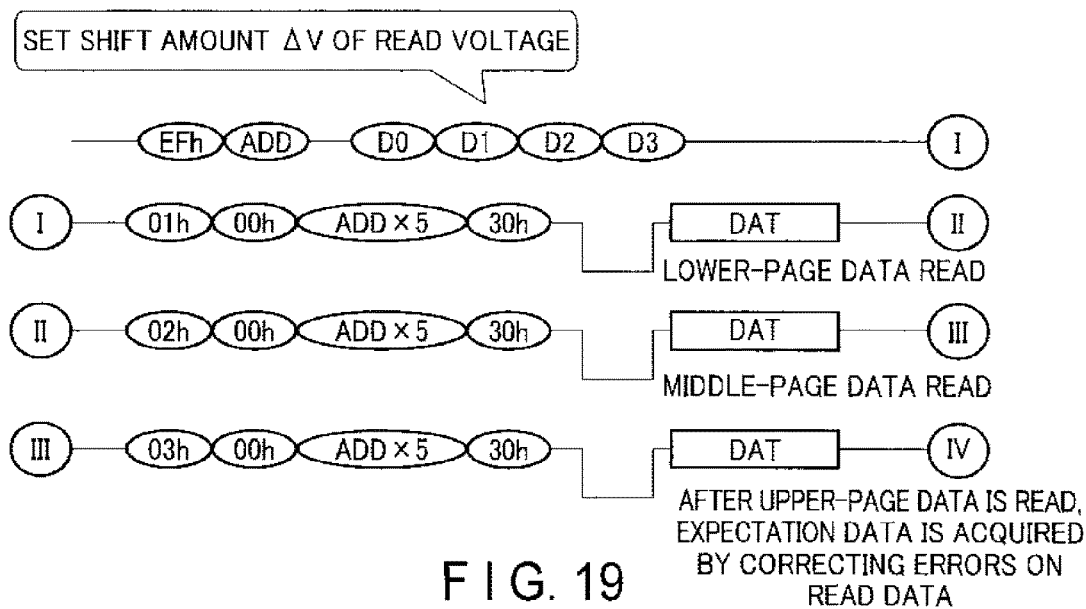
FIG. 19 is a command sequence to explain a read process to acquire expectation data in the reprogramming refresh process in the memory system according to the first embodiment.

First, a command sequence to acquire expectation data in the reprogramming refresh process of the memory system according to the first embodiment will be described with reference to FIG. 19. Specifically, FIG. 19 shows a command sequence to read data through the shift read process in order to acquire expectation data from a word line WL targeted at executing the reprogramming refresh process. In the command sequences shown in FIG. 19 and its subsequent figures, a series of command sequences may be shown over a plurality of rows. In this case, assume that the command sequences are executed continuously from a command sequence shown in a certain row toward a command sequence in a row whose head has the same Roman numeral (I, II, etc.) as that attached to the end of a former row.

As shown in FIG. 19, first, the memory controller 200 transmits a command "EFh" to the NAND flash memory 100. The command "EFh" is a set feature command to introduce a change in setting on the NAND flash memory 100. The memory controller 200 transmits an address ADD over one cycle, and it transmits data over four cycles ("D0" to "D3"). The data "D0" to "D3" is information on the set value to be changed in response to the set feature command and includes shift amounts ΔVA to ΔVG to be applied to the shift read process. In the NAND flash memory 100, accordingly, the shift amounts ΔVA to ΔVG are set to the address ADD and applied to the subsequent shift read process.

Then, the memory controller 200 issues a command "01h" and a read command "00h" and transmits them to the NAND flash memory 100. The read command "00h" is an instruction command to read data out of the NAND flash memory 100. Upon receipt of the series of commands "01h" and "00h," the NAND flash memory 100 recognizes them to be lower-page data read instructions.

The memory controller 200 issues an address ADD over, for example, five cycles and transmits it to the NAND flash memory 100. Then, the memory controller 200 issues a command "30h" and transmits it to the NAND flash memory 100. In response to the command "30h," the sequencer 170 starts to execute a read process and sets the signal RBn at an "L" level to notify the memory controller 200 that the NAND flash memory 100 is in a busy state. When the lower-page data read is completed, the sequencer 170 sets the signal RBn at an "H" level to notify the memory controller 200 that the NAND flash memory 100 is in a ready state. The NAND flash memory 100 transfers the read lower-page data to the memory controller 200. In the following descriptions, it is assumed that the "read" of data includes read of data in the NAND flash memory 100 and transfer of the read data to the memory controller 200.

Then, the memory controller 200 reads middle-page data and upper-page data. In reading the middle and upper-page data, commands "02h" and "03h" are each issued in place of the command "01h." Accordingly, upon receipt of the series of commands "02h" and "00h," the NAND flash memory 100 recognizes them to be middle-page data read instructions. Upon receipt of the series of command "03h" and "00h," it recognizes them to be upper-page data read instructions.

When the data read process is finished, the ECC circuit 260 corrects an error of the read data to obtain the expectation data. Note that when the read of each data is finished, the ECC circuit 260 may correct an error of the data. The shift read process for acquiring expectation data is thus finished.

A command sequence to set parameters, which is executed in the reprogramming refresh process in the memory system according to the first embodiment, will be described with reference to FIG. 20. Specifically, FIG. 20 shows a command sequence to set voltages to be applied to a word line WL targeted at executing the reprogramming refresh process.

Figure 20:
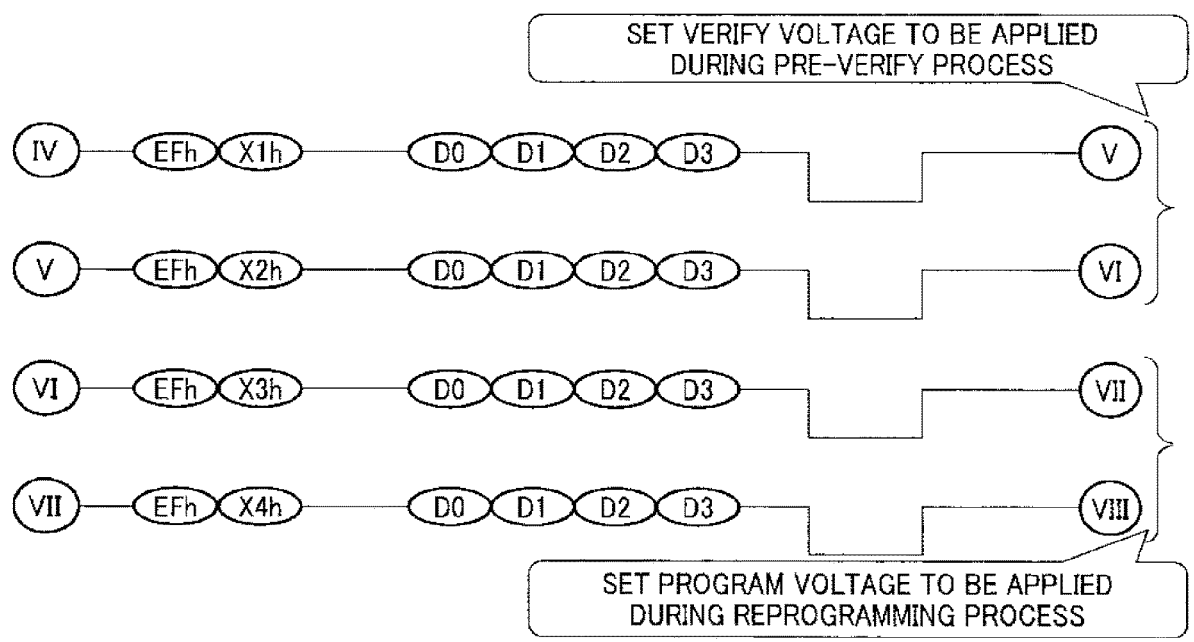
FIG. 20 is a command sequence to explain a setting process for the reprogramming refresh process in the memory system according to the first embodiment.

As shown in FIG. 20, the memory controller 200 issues a set feature command set, for example, four times. In the example of FIG. 20, the set feature command set includes a set of command "EFh," an address ("X1h," "X2h," "X3h," or "X4h") and data "D0" to "D3" over four cycles.

Specifically, first, the memory controller 200 transmits the command "EFh" to the NAND flash memory 100. The command "EFh" is a set feature command to declare a change in setting to the NAND flash memory 100. Then, the memory controller 200 transmits an address "X1h." The address "X1h" is an address to designate a register in a feature table that stores a set value to be changed in response to the set feature command in the NAND flash memory 100. After that, the memory controller 200 transmits data over four cycles ("D0" to "D3"). The data "D0" to "D3" includes information on the set value to be changed in response to the set feature command. In the NAND flash memory 100, accordingly, the information included in the data "D0" to "D3" is set to the address "X1h" and is applied to the subsequent reprogramming refresh process. Then, the same operation as described above is also performed for addresses "X2h," "X3h" and "X4h."

FIG. 21 is a schematic diagram to explain an example of a feature table in the memory system according to the first embodiment. FIG. 21 shows an example of set values stored in the addresses "X1h," "X2h," "X3h" and "X4h" shown in FIG. 20.

As shown in FIG. 21, for example, each of the shift amounts of a verify voltage to be applied to the pre-verify process is stored in the addresses "X1h" and "X2h" as a correction amount. More specifically, the address "X1h" stores the shift amounts ΔAvfy, ΔBvfy, ΔCvfy and ΔDvfy of verify voltages to be applied to the memory cell transistors MT in the "A," "B," "C" and "D" states as information corresponding to data "D0" to "D3." The address "X2h" stores the shift amounts ΔEvfy, ΔFvfy and ΔGvfy of verify voltages to be applied to the memory cell transistors MT in the "E," "F" and "G" states as information corresponding to data "D0" to "D2." The shift amounts ΔAvfy, ΔBvfy, . . . and ΔGvfy are defined as, for example, the amounts of shift to the negative side from verify voltages Avfy, Bvfy, . . . and Gvfy (of default values) to be applied to the respective states during normal write operation. That is, voltages Avfy–ΔAvfy, Bvfy–ΔBvfy, . . . and Gvfy–ΔGvfy are respectively applied to as verify voltages Avfy1, Bvfy1, . . . and Gvfy1 at the time of the pre-verify process through the set feature process. The reason is as follows. As described above, the threshold voltage is likely shifted to a low-voltage side immediately after data is written from the erase state, but it is considered unlikely to shift the threshold voltage to the low-voltage side during the reprogramming process. Thus, the verify voltage at the time of the pre-verify process can be set lower than the verify voltage of the default value. Furthermore, even when it is determined that the threshold voltage need not be brought so close to the ideal threshold voltage distribution, which is a state immediately after the initial write, through the reprogramming refresh process, the verify voltage at the time of pre-verification may be set lower than the verify voltage of the default value.

Note that the foregoing setting is one example and the shift amounts ΔAvfy to ΔGvfy of the verify voltages may be defined as the shift amounts on the positive side. Though some of the shift amounts ΔAvfy to ΔGvfy may have the same value, different values may be set to these shift amounts.

Similarly, each of the shift amounts of a program voltage to be applied to the reprogramming process is stored in the addresses "X3h" and "X4h" as a corrected amount. More specifically, the address "X3h" stores the shift amounts ΔApgm, ΔBpgm, ΔCpgm and ΔDpgm of program voltages to be applied to the memory cell transistors MT in the "A," "B," "C" and "D" states as information corresponding to data "D0" to "D3." The address "X4h" stores the shift amounts ΔEpgm, ΔFpgm and ΔGpgm of program voltages to be applied to the memory cell transistors MT in the "E," "F" and "G" states as information corresponding to data "D0" to "D2." The shift amounts ΔApgm, ΔBpgm, . . . and ΔGpgm are defined as, for example, the amounts of shift from a program voltage VPGM0 to be applied to a first loop during normal program process. That is, voltages VPGM0+ΔApgm, VPGM0+ΔBpgm, . . . and VPGM0+ΔGpgm are respectively applied to program voltages VPGM_A, VPGM_B, . . . and VPGM_G at the time of reprogramming process. The program voltages VPGM_A to VPGM_G at the time of reprogramming process are, for example, set to be higher with the increase of a threshold voltage corresponding to a state (VPGM_A≤VPGM_B≤ . . . ≤VPGM_G). Though some of the shift amounts ΔApgm, ΔBpgm, . . . , and ΔGpgm may have the same value, different values may be set to these shift amounts.

A command sequence to cause the NAND flash memory to execute the reprogramming refresh process in the memory system according to the first embodiment will be described with reference to FIG. 22. The command sequence shown in FIG. 22 is issued following the command sequence for the change in setting shown in FIG. 20.

Figure 22:
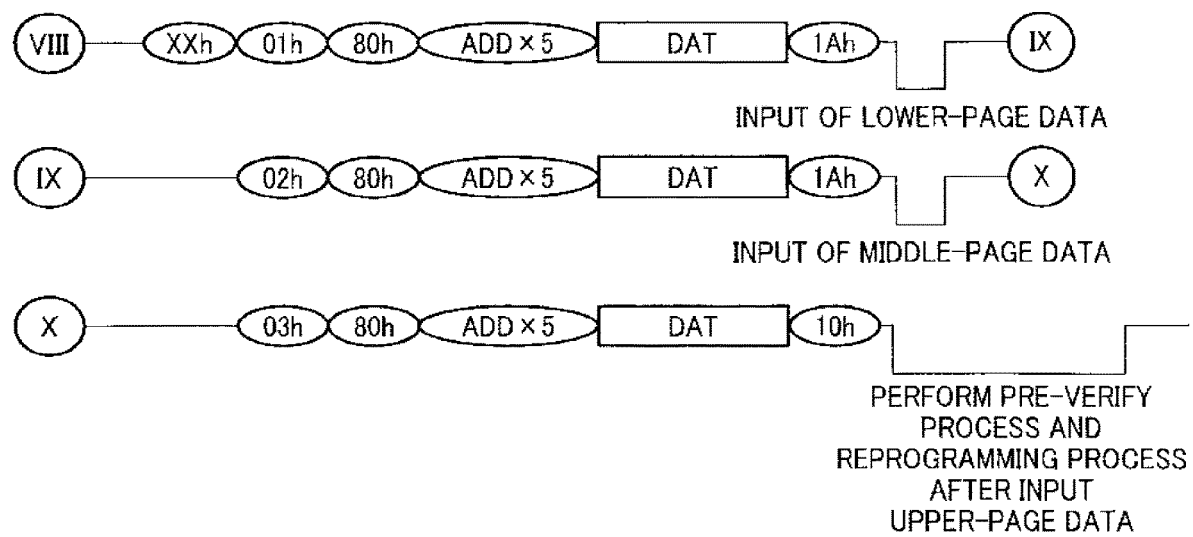
FIG. 22 is a command sequence to explain the reprogramming refresh process in the memory system according to the first embodiment.

As shown in FIG. 22, the memory controller 200 first issues a prefix command "XXh." The command "XXh" is a command by which the memory controller 200 declares the execution of a reprogramming refresh process on the NAND flash memory 100. Then, the memory controller 200 issues, for example, a command "01h" and a write command "80h" and transmits them to the NAND flash memory 100. The command "80h" is an instruction command to write data into the NAND flash memory 100. Upon receipt of the series of commands "01h" and "80h," the NAND flash memory 100 recognizes that the subsequent write data DAT is lower-page data.

The memory controller 200 issues an address ADD over, for example, 5 cycles, and transmits it to the NAND flash memory 100. The address ADD is an address (e.g. an address of a specific cell unit CU in the string unit SU) to designate a memory cell transistor MT connected to a specific word line WL in the block BLK that is determined to be a reprogramming refresh process target in, for example, steps ST21 and ST22 of FIG. 10. Then, the memory controller 200 transmits the write data DAT corresponding to the lower-page data to the NAND flash memory 100. As the write data DAT, data whose error has been corrected in, for example, step ST16 or ST18 shown in FIG. 10 (i.e. expectation data) is used.

The memory controller 200 issues a command "1Ah" and transmits it to the NAND flash memory 100. In response to the command "1Ah," the sequencer 170 sets the signal RBn at an "L" level to input the last received data DAT (i.e. expectation data corresponding to the lower-page data) to a latch circuit (e.g. latch circuit ADL) in the selected sense amplifier unit SAU. When the input of the lower-page data is completed, the sequencer 170 sets the signal RBn at an "H" level to notify the memory controller 200 that the NAND flash memory 100 is in a ready state.

Then, the memory controller 200 issues commands "02h" and "80h" and transmits them to the NAND flash memory 100. Upon receipt of the series of commands "02h" and "80h," the NAND flash memory 100 recognizes the subsequent write data DAT to be middle-page data. When the memory controller 200 issues an address ADD over 5 cycles, it transmits the write data DAT corresponding to the middle-page data to the NAND flash memory 100.

The memory controller 200 issues a command "1Ah" and transmits it to the NAND flash memory 100. In response to the command "1Ah," the sequencer 170 sets the signal RBn at the "L" level to input the last received data DAT (i.e. expectation data corresponding to the middle-page data) to a latch circuit (e.g. latch circuit BDL) in the selected sense amplifier unit SAU. When the input of the middle-page data is completed, the sequencer 170 sets the signal RBn at the "H" level to notify the memory controller 200 that the NAND flash memory 100 is in the ready state.

Then, the memory controller 200 issues commands "03h" and "80h" and transmits them to the NAND flash memory 100. Upon receipt of the series of commands "03h" and "80h," the NAND flash memory 100 recognizes the subsequent write data DAT to be upper-page data. When the memory controller 200 issues an address ADD over 5 cycles, it transmits the write data DAT corresponding to the upper-page data to the NAND flash memory 100.

The memory controller 200 issues a command "10h" and transmits it to the NAND flash memory 100. In response to the command "10h," the sequencer 170 sets the signal RBn at the "L" level to input the last received data DAT (i.e. expectation data corresponding to the upper-page data) to a latch circuit (e.g. latch circuit CDL) in the selected sense amplifier unit SAU. When the input of the upper-page data is completed, the NAND flash memory 100 executes a reprogramming refresh process (i.e. a pre-verify process and a reprogramming process) according to the input data. When the reprogramming refresh process is finished, the sequencer 170 sets the signal RBn at the "H" level to notify the memory controller 200 that the reprogramming refresh process is finished.

The reprogramming refresh process is therefore finished.

1.2.5.3. Timing Chart

A timing chart in the execution of a reprogramming refresh process will be described below.

Figure 23:
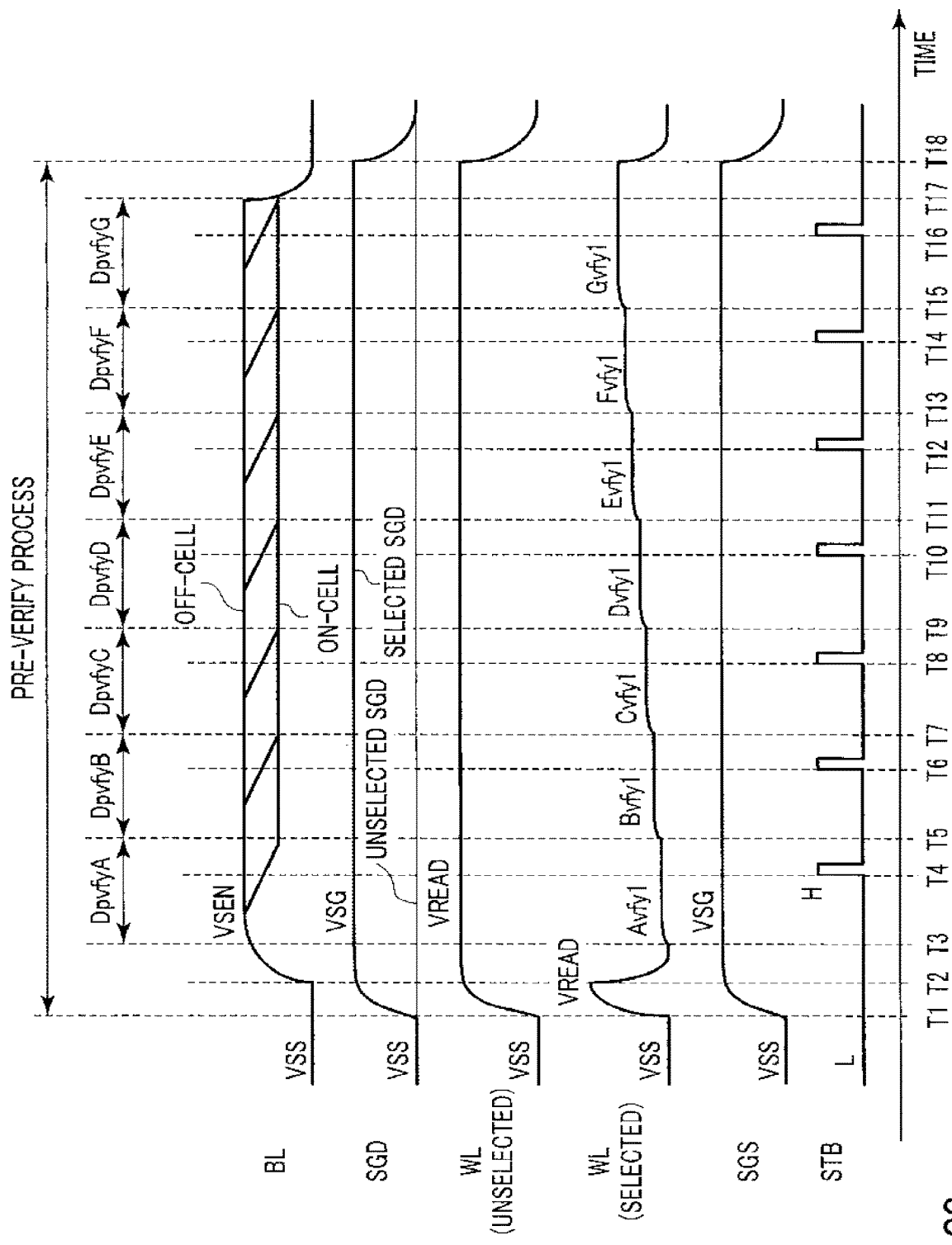
FIG. 23 is a timing chart to explain a pre-verify process in the reprogramming refresh process in the memory system according to the first embodiment.

First, a timing chart of a pre-verify process to be executed when the reprogramming refresh process is performed in the memory system according to the first embodiment will be described with reference to FIG. 23. That is, FIG. 23 corresponds to step ST244 shown in FIG. 18. FIG. 23 shows a transition of voltages to be applied to the bit line BL, select gate lines SGD and SGS, a selected word line WL, unselected word lines WL and a signal STB in the NAND flash memory 100 during the pre-verify process.

The voltage of the bit line BL is transferred to, for example, a sense node (not shown) included in the sense amplifier SA. Accordingly, the voltage of the sense node varies according to whether a memory cell transistor MT connected to the selected word line WL turns into an on-state or an off-state. It is then determined whether data is "0" or "1" according to an amount of variation of the voltage of the sense node. In this example, when the voltage of the sense node is lower than a threshold value, the sense amplifier SA determines that the memory cell transistor MT is turned into the on-state to store data "0" in the internal latch circuit. When the voltage of the sense node is maintained at the threshold value or higher, the sense amplifier SA determines that the memory cell transistor MT is maintained at the off-state to store data "1."

As shown in FIG. 23, the NAND flash memory 100 performs a process to specify memory cell transistors MT to execute a reprogramming process in the pre-verify process with respect to each of the "A" to "G" states. Specifically, time T1 to T18 is a whole period of the pre-verify process, and a period DpvfyA of time T3 to T5, a period DpvfyB of time T5 to T7, a period DpvfyC of time T7 to T9, a period DpvfyD of time T9 to T11, a period DpvfyE of time T11 to T13, a period DpvfyF of time T13 to T15, and a period DpvfyG of time T15 to T17 correspond to their respective pre-verify processes in the "A" to "G" states.

At time T1, the row decoder 120 applies a voltage VREAD to the word lines WL and apples a voltage VSG to the select gate line SGS and the select gate line SGD (select SGD) corresponding to the selected string unit SU. The voltage VSG is a voltage to turn on the selection transistors ST1 and ST2. Note that a voltage VSS (e.g. 0 V) is applied to a select gate line SGD corresponding to a non-selected string unit SU (non-selected SGD). Accordingly, the string unit SU is selected.

At time T2, the row decoder 120 applies a voltage VSS to the selected word line WL and the sense amplifier SA applies a voltage VSEN that is higher than the voltage VSS, to the bit lines BL.

At time T3, the row decoder 120 applies a voltage Avfy1 to the selected word line WL. Then, the sequencer 170 asserts the signal STB ("H" level in the example of FIG. 23,) at time T4 when the voltage Avfy1 is applied to the selected word line WL.

For example, when a memory cell transistor MT is turned on by the voltage Avfy1 applied to the selected word line WL, current flows from the bit line BL to the source line SL. As a result, the sense node is discharged and its potential is lowered. At time T4, the sequencer 170 asserts the signal STB to latch the state of the sense node into the latch circuit (e.g. latch circuit SDL). In other words, if the memory cell transistor MT turns on, data "0" is stored in the latch circuit SDL as failing in the pre-verify process. If it turns off, data "1" is stored in the latch circuit SDL passing the pre-verify process. Accordingly, the latch circuit SDL stores a result of the pre-verify process by the voltage Avfy1.

The sequencer 170 extracts a memory cell transistor MT whose expectation data is in the "A" state and which is turned off by the voltage Avfy1 (which has passed the pre-verify process for the "A" state). Then, the sequencer 170 performs a mask process for the latch circuit such that a bit line BL connected to the memory cell transistor MT that has passed the pre-verify process for the "A" state is brought into a reprogramming inhibition state in the subsequent reprogramming process. Specifically, the operation unit OP in the sense amplifier SA changes data "110" corresponding to the "A" state that is stored as expectation data in the latch circuits ADL to CDL corresponding to the extracted memory cell transistor MT, to data "111" corresponding to the "Er" state. Thus, when the threshold voltage of the memory cell transistor MT whose expectation data is in the "A" state is not lower than the voltage Avfy1, the reprogramming process is inhibited. When it is lower than the voltage Avfy1, the reprogramming process is allowed.

At time T5, the row decoder 120 applies a voltage Bvfy1 to the selected word line WL. Then, the sequencer 170 asserts the signal STB at time T6 when the voltage Bvfy1 is applied to the selected word line WL and latches a state of the sense node in the latch circuit SDL. Accordingly, the latch circuit SDL stores a result of the pre-verify process by the voltage Bvfy1.

The sequencer 170 extracts a memory cell transistor MT whose expectation data is in the "B" state and which is turned off by the voltage Bvfy1 (which has passed the pre-verify process for the "B" state). Then, the sequencer 170 performs a mask process for the latch circuit such that a bit line BL connected to the memory cell transistor MT that has passed the pre-verify process for the "B" state is brought into a reprogramming inhibition state in the subsequent reprogramming process. Specifically, the operation unit OP in the sense amplifier SA changes data "100" corresponding to the "B" state that is stored as expectation data in the latch circuits ADL to CDL corresponding to the extracted memory cell transistor MT, to data "111" corresponding to the "Er" state. Thus, when the threshold voltage of the memory cell transistor MT whose expectation data is in the "B" state is not lower than the voltage Bvfy1, the reprogramming process is inhibited. When it is lower than the voltage Bvfy1, the reprogramming process is allowed.

Like in the above, when the threshold voltages of the memory cell transistors MT whose expectation data are in the "C" to "G" states are each not lower than its corresponding one of the voltages Cvfy1 to Gvfy1, respectively, the sequencer inhibits the reprogramming process. When the threshold voltages are each lower than its corresponding one of the voltages Cvfy1 to Gvfy1, respectively, the sequencer 170 allows the reprogramming process.

When the pre-verify process for all of the "A" to "G" states is finished, the bit line BL is discharged to the voltage VSS at time T17. At time T18, the row decoder 120 applies the voltage VSS to the word lines WL and the select gate lines SGS and SGD, and the pre-verify process is finished.

With the foregoing operations, a memory cell transistor MT for which a reprogramming process is executed through the pre-verify process is specified.

A timing chart of a reprogramming process to be executed when the reprogramming refresh process is performed in the memory system according to the first embodiment will be described with reference to FIG. 24.

Figure 24:
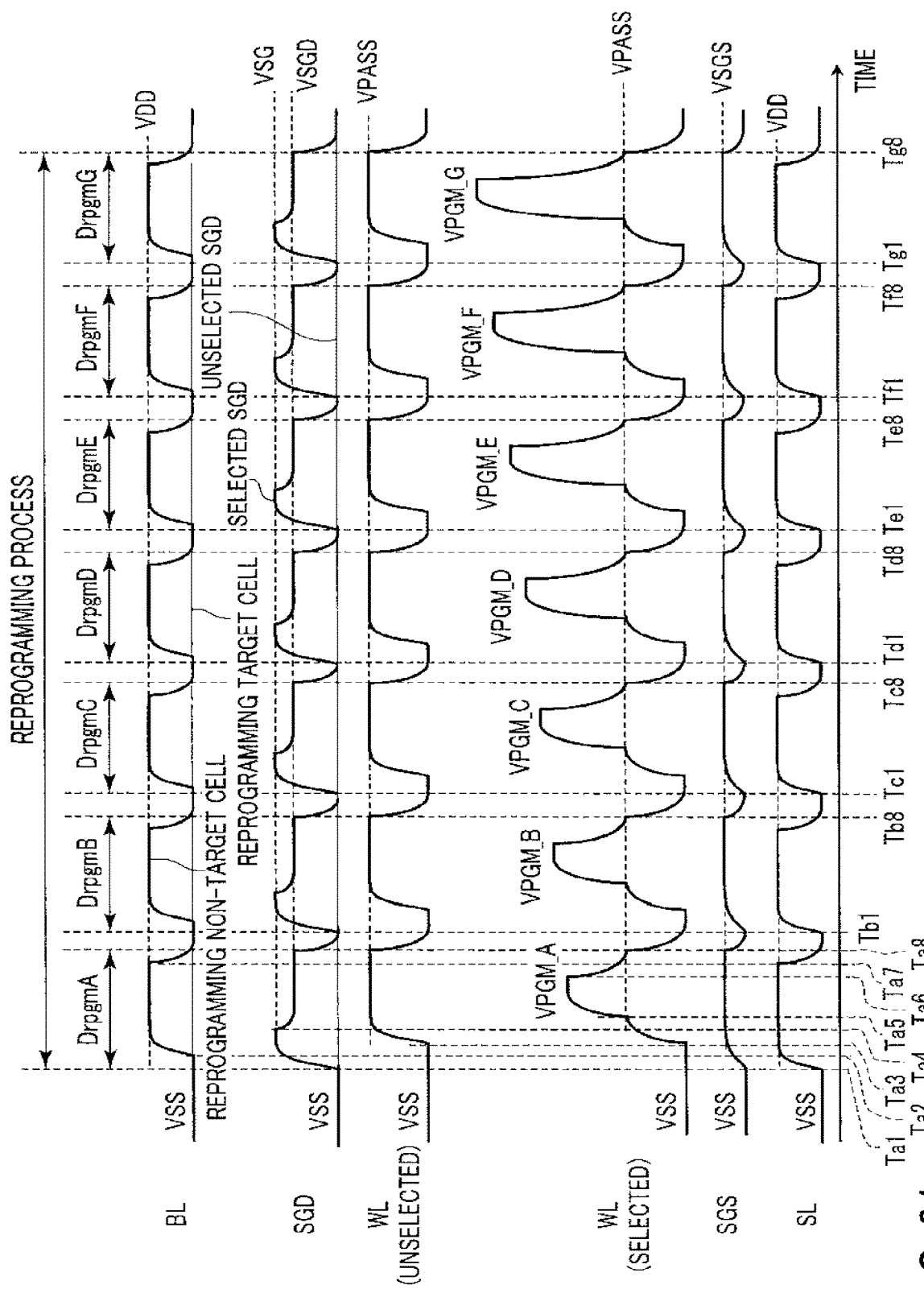
FIG. 24 is a timing chart to explain a reprogramming process in the reprogramming refresh process in the memory system according to the first embodiment.

That is, FIG. 24 corresponds to step ST245 shown in FIG. 18. FIG. 24 shows a transition of voltages to be applied to the bit lines BL, the select gate lines SGD and SGS, the selected word line WL, the unselected word lines WL and a source line SL in the NAND flash memory 100 during the reprogramming process.

As shown in FIG. 24, the NAND flash memory 100 employs one program voltage for reprogramming process for each of the "A" to "G" states in the reprogramming process. Specifically, a period DrpgmA between time Ta1 and time Ta8, a period DrpgmB between time Tb1 and time Tb8, a period DrpgmC between time Tc1 and time Tc8, a period DrpgmD between time Td1 and time Td8, a period DrpgmE between time Te1 and time Te8, a period DrpgmF between time Tf1 and time Tf8 and a period DrpgmG between time Tg1 and time Tg8 correspond to reprogramming processes for the "A," "B," "C," "D," "E," "F" and "G" state, respectively.

At time Ta1, the row decoder 120 applies a voltage VSG to the selected SGD and applies a voltage VSGS to the select gate line SGS. The row decoder 120 also applies a voltage VDD to the source line SL. The voltage VSGS is a voltage which is higher than the voltage VSS and turns off the selection transistor ST2. Note that the voltage VSS is applied to an unselected SGD. Accordingly, the string unit SU is selected.

At time Ta2, the sense amplifier SA extracts memory cell transistors MT in which data "110" corresponding to the "A" state is stored in the latch circuits ADL to CDL (a memory cell transistor MT whose expectation data correspond to the "A" state and which has failed in the pre-verify process corresponding to the "A" state). Then, the sense amplifier SA determines the extracted memory cell transistors MT to be a reprogramming target and applies the voltage VSS to the bit lines BL connected to the reprogramming target memory cell transistors MT to bring the reprogramming target memory cell transistors MT into a reprogrammable state. The sense amplifier SA determines the other memory cell transistors MT as not being a reprogramming target and applies the voltage VDD to the bit lines BL connected to the non-reprogramming target memory cell transistors MT to bring the non-reprogramming target memory cell transistors MT into a reprogramming inhibition state.

At time Ta3, the row decoder 120 applies a voltage VPASS to the word lines WL. The voltage VPASS can suppress an increase in the threshold voltage of the memory cell transistors Mt connected to the unselected word lines WL in the NAND string NS in which the reprogramming process is allowed, and can increase a voltage of a channel by coupling, to the extent of suppressing an increase in the threshold of the memory cell transistors MT in the NAND string NS in which the reprogramming process is inhibited.

At time Ta4, the row decoder 120 applies a voltage VSGD to the selected SGD. The voltage VSGD is a voltage to turn on the selection transistor ST1 in each of the NAND strings NS in which the reprogramming process is allowed and turn off the selection transistor ST1 in each of the NAND strings NS in which the reprogramming process is inhibited.

At time Ta5, the row decoder 120 applies a voltage VPGM_A to the selected word line WL and also applies the voltage VPASS to the unselected word lines WL. Of the memory cell transistors MT connected to the selected word line WL, the memory cell transistors MT targeted for the reprogramming process for the "A" state at time Ta2 increases in their threshold voltage.

At time Ta6, the row decoder 120 applies a voltage VPASS to the selected word line WL. At time Ta7, the row decoder 120 applies a voltage VSS to the selected SGD and the sense amplifier SA applies a voltage VSS to the bit lines BL. At time Ta8, the row decoder 120 applies a voltage VSS to the word lines WL.

The reprogramming process targeted for the "A" state is thus finished.

In the subsequent periods DrpgmB, DrpgmC, . . . and DrpgmG, too, the select gate lines SGD and SGS and the source line SL are operated in the same manner as in the period DrpgmA. In the periods DrpgmB to DrpgmG, the sense amplifier SA extracts memory cell transistors MT (whose expectation data corresponds to the "B" to "G" states and which have failed in the pre-verify process corresponding to the "B" to "G" states) in which data corresponding to the "B" to "G" states are stored in their respective latch circuits ADL to CDL. Then, the sense amplifier SA considers the memory cell transistors MT, which are extracted for each of the "B" to "G" states, as a target for the reprogramming process in each of the periods DrpgmB to DrpgmG, and applies a voltage VSS to their corresponding bit lines BL to bring them into a reprogramming allowance state. On the other hand, the sense amplifier SA determines the other memory cell transistors MT to be not a target for the reprogramming process, and applies a voltage VDD to the bit lines BL connected to the memory cell transistors MT to bring them into a reprogramming inhibition state. In the periods DrpgmB to DrpgmG, the row decoder 120 applies voltages VPGM_B, VPGM_C, . . . and VPGM_G to the selected word line WL to increase the threshold voltage of the memory cell transistors MT targeted for the reprogramming process.

The foregoing operations make it possible to execute the reprogramming process using a program voltage prepared for each of the "A" to "G" states. Accordingly, threshold voltages close to the lowest voltage of one of the threshold voltage distributions corresponding to each state can be shifted to a high-voltage side.

1.3. Advantages of First Embodiment

According to the first embodiment, when the memory controller 200 reads data out of memory cell transistors MT, it determines how much the distribution of threshold voltages of the memory cell transistors MT is varied due to a variation factor and manages it in a unit of a word line WL. When the memory controller 200 determines that a plurality of memory cell transistors MT connected to a common word line WL satisfy a first condition, it determines to execute one of the reprogramming refresh process, the block refresh process and the like. When the memory controller 200 further determines that the memory cell transistors MT satisfy a second condition as well as the first condition, it determines to execute the reprogramming refresh process in a unit of a word line WL. When the memory controller 200 determines that the memory cell transistors MT do not satisfy the second condition, it determines to execute the block refresh process in a unit of a block BLK that includes the word lines WL. Thus, when the threshold voltage distribution of the memory cell transistors MT is brought close to the ideal state, the block refresh process and the reprogramming refresh process can be used properly.

A supplementary description will be given. The reprogramming refresh process is executed only for a specific word line WL in a block BLK to which data has been written. The reprogramming refresh process can thus be executed in shorter time than the block refresh process to relocate all data in a block BLK to those in another block BLK. Furthermore, the reprogramming refresh process is executed for the word line WL to which data has already been written. Thus, the number of loops can be smaller than that for write process from an erase state, and the reprogramming refresh process can be executed in short time. The reprogramming refresh process can reduce an influence upon another operation to be performed in response to an instruction from the host device 300 and thus can suppress an increase in latency caused by the refresh process. In the reprogramming refresh process, data is reprogrammed and thus the threshold voltage of memory cell transistors MT adjacent to that targeted for reprogramming process may be increased. If, therefore, the reprogramming refresh process is executed again and again, a voltage close to the highest voltage of one of adjacent two threshold voltage distributions and a voltage close to the lowest voltage of the other likely overlap, and the advantage of bringing the threshold voltage distributions close to the ideal state might be decreased.

In the first embodiment, the memory controller 200 manages the error correction conditions of the ECC circuit 260, the number of error bits, the amount of shift of read voltage, the time elapsed from the completion of write, the total number of times of read process on the same page, etc. in a unit of a word line WL, a block BLK or the like as the first condition, and evaluates them. The memory controller 200 can thus determine whether the memory cell transistor MT needs to improve the threshold voltage distribution through any refresh process under the first condition. The memory controller 200 also manages the number of memory cells having a threshold voltage within a predetermined range, the number of error bits on a high-voltage side, the amount of shift from a default read voltage of the read voltage determined through the Vth tracking process, the error correction conditions of the ECC circuit 260, the rate of decrease in the number of error bits, the number of times or frequency of execution of the reprogramming refresh, the locations of word lines WL satisfying the first condition on the NAND string, etc. in a unit of a word line WL as the second condition, and evaluates them. The memory controller 200 can thus evaluate the effectiveness of the reprogramming refresh with respect to the threshold voltage distribution of memory cell transistors MT satisfying the first condition. Specifically, for example, the number of memory cells having a threshold voltage within a predetermined range, the number of error bits on a high-voltage side, the amount of shift from a default read voltage of the read voltage determined through the Vth tracking process, etc. are likely to increase between the threshold voltage distributions corresponding to the "Er" and "A" states in particular, and unlikely to improve through the reprogramming refresh process. Furthermore, for example, the frequency of execution of the reprogramming refresh is likely to become high with the increase of the number of times of execution of the reprogramming refresh process. For example, when the word line WL satisfying the first condition is located at an end portion of the NAND string NS, the threshold voltage distribution of memory cell transistors MT corresponding to the other word lines WL may fall within a normal range (namely, the other words lines WL do not satisfy the first condition). However, when the word line WL satisfying the first condition is not located at an end portion of the NAND string NS, the threshold voltage distribution of memory cell transistors MT corresponding to the other word lines WL may fall outside a normal range (namely, the other words lines WL may satisfy the first condition). If the first and second conditions are properly combined, the memory controller 200 can determine which of the reprogramming refresh process and the block refresh process is suitable for the memory cell transistors MT that need to execute any refresh process. It is therefore possible to suppress the increase in latency due to a failure in read by maintaining a threshold voltage distribution in data readable state through a refresh process and also suppress the increase in latency due to an execution of an inappropriately-selected refresh process.

The number of requirements of each of the foregoing first and second conditions need not be one, but a plurality of requirements may be combined. An appropriate condition can thus be set.

When the memory controller 200 determines to execute a reprogramming refresh process, it issues a series of command sets including a set feature command to designate various settings for the reprogramming refresh process and a command to designate a pre-verify process and a reprogramming process. The NAND flash memory 100 can thus set an amount of correction of a voltage to be applied to a selected word line WL during the pre-verify process and reprogramming process from a default value and thus execute the pre-verify process and reprogramming process based upon the set amount of correction. The amount of correction can be set for each expectation data (corresponding to the "A" to "G" states). That is, the NAND flash memory 100 can apply a verify voltage and a reprogramming voltage to each of the states. Thus, a more appropriate voltage can be applied according to the level of a threshold voltage and thus the threshold voltage distribution can be brought close to the ideal state.

2. Second Embodiment

A memory system according to a second embodiment will be described. The second embodiment differs from the first embodiment in that a reprogramming refresh process is performed only for memory cell transistors MT having a specific state, which are included in the memory cell transistors MT connected to a word line WL in which an execution of the reprogramming refresh process has been determined. The descriptions of the configurations and operations equivalent to those of the first embodiment will be omitted. The configurations and operations different from those of the first embodiment will chiefly be described.

2.1. Command Sequence

Below is a description of a command sequence to set a parameter, which is executed in the reprogramming refresh process in the memory system according to the second embodiment. This command sequence is the same as that of the first embodiment shown in FIG. 21.

FIG. 25 is a conceptual diagram to explain an example of a feature table in the memory system according to the second embodiment. FIG. 25 shows an example of set values stored in the addresses "X1h," "X2h," "X3h" and "X4h" shown in FIG. 20.

As shown in FIG. 25, the information stored in the addresses "X1h" to "X4h" is the same as that of the first embodiment shown in FIG. 21 except information corresponding to data "D3" in the address "X2h".

A section corresponding to data "D3" in address "X2h" stores information indicating for which of the "A" to "G" states a pre-verify process is to be executed.

FIG. 26 is a conceptual diagram to explain an example of a feature table in the memory system according to the second embodiment. In FIG. 26, an example of the set values stored in a section corresponding to data "D3" in the address "X2h" in the conceptual diagram of FIG. 25 is shown further in detail.

As shown in FIG. 26, in the bit 0 of data "D3" in the address "X2h," information indicating whether to allow a pre-verify process for the "A" state is stored. More specifically, a pre-verify process for the "A" state is allowed if "1" is stored in the bit 0 of data "D3" and it is inhibited if "0" is stored therein.

Similarly, in the bits 1 to 6 of data "D3," information indicating whether to allow pre-verify processes for the "B" to "G" states is stored. More specifically, pre-verify processes for the "B" to "G" states are allowed if "1" is stored in the bits 1 to 6 of data "D3" and they are inhibited if "0" is stored therein, respectively.

For example, when only memory cell transistors MT with the "A" to "C" states as expected values are targeted for the reprogramming refresh process, "1" is stored in the bits 0 to 2 of data "D3" in the address "X2h" and "0" is stored in the bits 3 to 6 thereof. Furthermore, for example, when only memory cell transistors MT with the "F" and "G" states as expected values are targeted for the reprogramming refresh process, "1" is stored in the bits 5 to 6 of data "D3" in the address "X2h" and "0" is stored in the bits 0 to 4 thereof.

Thus, a pre-verify process is not executed for the memory cell transistors MT in all the states but can be done only for the memory cell transistors MT with expectation data in a specific state. Accordingly, the execution range of the reprogramming refresh process can be limited to a specific state.

2.2. Timing Chart

A timing chart of the reprogramming refresh process in the memory system according to the second embodiment will be described using some examples.

2.2.1. Case where "A" to "C" States are Designated

First, a case where memory cell transistors MT with expected values in the "A" to "C" states are designated as targets for the reprogramming refresh process will be described with reference to FIG. 27.

Figure 27:
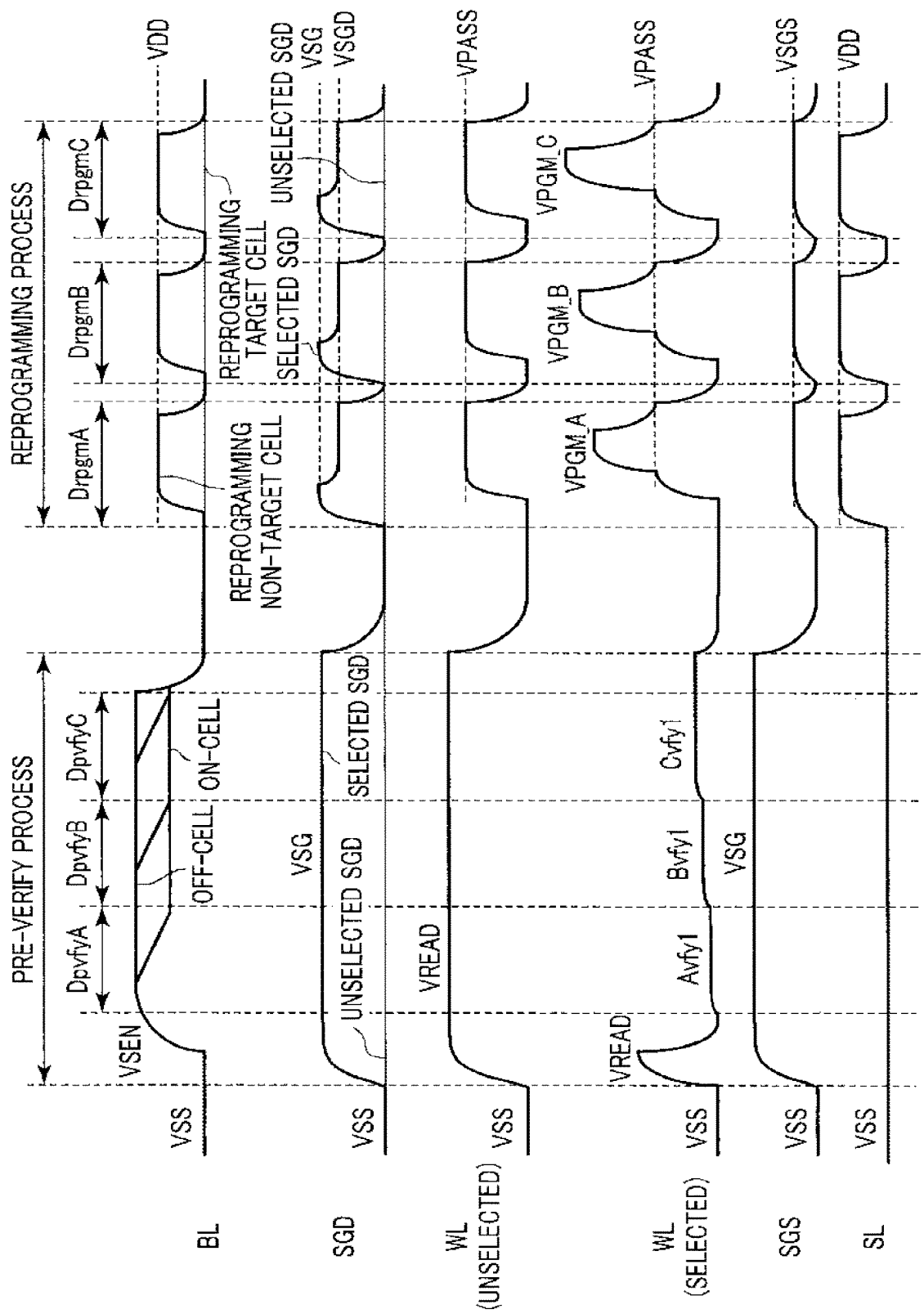
FIG. 27 is a timing chart to explain an example of the reprogramming refresh process in the memory system according to the second embodiment.

FIG. 27 is a timing chart to explain the reprogramming refresh process in the memory system according to the second embodiment. That is, FIG. 27 includes timing charts of the pre-verify process and the reprogramming process, which correspond to FIGS. 23 and 24 in the first embodiment. FIG. 27 shows transitions of voltages to be applied to the bit lines BL, select gate lines SGD and SGS, a selected word line WL, unselected word lines WL and a source line SL. The signal STB is omitted from FIG. 27 for convenience sake.

As shown in FIG. 27, first, the NAND flash memory 100 performs an operation to specify memory cell transistors MT to execute a reprogramming process in the pre-verify process with respect to each of the "A" to "C" states.

The period of the pre-verify process includes periods DpvfyA, DpvfyB and DpvfyC during which the pre-verify processes for the "A" to "C" states are executed, respectively. Like in FIG. 23, the sequencer 170 extracts memory cell transistors MT whose expectation data are in the "A" state and which have passed the pre-verify process for the "A" state, memory cell transistors MT whose expectation data are in the "B" state and which have passed the pre-verify process for the "B" state, and memory cell transistors MT whose expectation data are in the "C" state and which have passed the pre-verify process for the "C" state, for their respective periods DpvfyA, DpvfyB and DpvfyC. Then, the sequencer 170 performs a mask process for the latch circuits such that bit lines BL connected to the memory cell transistors MT that have passed the pre-verify processes for the "A" to "C" states are brought into a reprogramming inhibition state in the subsequent reprogramming process.

The period of the pre-verify process shown in FIG. 27 does not include periods during which the pre-verify processes for the other states (e.g. periods DpvfyD to DpvfyG) are executed. Thus, when the period of the pre-verify process ends, the sequencer 170 performs a mask process for the latch circuits such that all bit lines BL connected to the memory cell transistors MT with expectation data in the "D" to "G" states, for which no pre-verify process is executed, are brought into a reprogramming inhibition state in the subsequent reprogramming process. Therefore, the reprogramming process target can be limited to the memory cell transistors MT that have failed in the pre-verify processes for the "A" to "C" states.

Subsequently, as shown in FIG. 27, the NAND flash memory 100 uses a single program voltage for the reprogramming process for each of the "A" to "C" states.

The period of the reprogramming process includes periods DrpgmA, DrpgmB and DrpgmC during which the reprogramming processes for the "A" to "C" states are executed, respectively. Thus, as in the case of FIG. 24, the sequencer 170 extracts memory cell transistors MT in which data corresponding to the "A" to "C" states is stored in the latch circuits ADL to CDL during the respective periods DrpgmA, DrpgmB, and DrpgmC. Then, the sequencer 170 determines the extracted memory cell transistors MT for each of the "A" to "C" states to be a reprogramming process target during its corresponding one of the periods DrpgmA, DrpgmB and DrpgmC and applies the voltage VSS to the corresponding bit lines BL to bring the memory cell transistors MT into a reprogrammable state. On the other hand, the sense amplifier SA determines the other memory cell transistors MT as not being a reprogramming process target and applies the voltage VDD to the bit lines BL connected to the memory cell transistors MT to bring the memory cell transistors MT into a reprogramming inhibition state. During the periods DrpgmA to DrpgmC, the row decoder 120 applies voltages VPGM_A, VPGM_B and VPGM_C to the selected word line WL, respectively, to increase the threshold voltage of the reprogramming process target memory cell transistors MT.

The foregoing operation makes it possible to execute the reprogramming refresh process only for the "A" to "C" states.

2.2.2. Case where "F" and "G" States are Designated

Next, a case where memory cell transistors MT with expected values in the "F" and "G" states are designated as targets for the reprogramming refresh process will be described with reference to FIG. 28.

Figure 28:
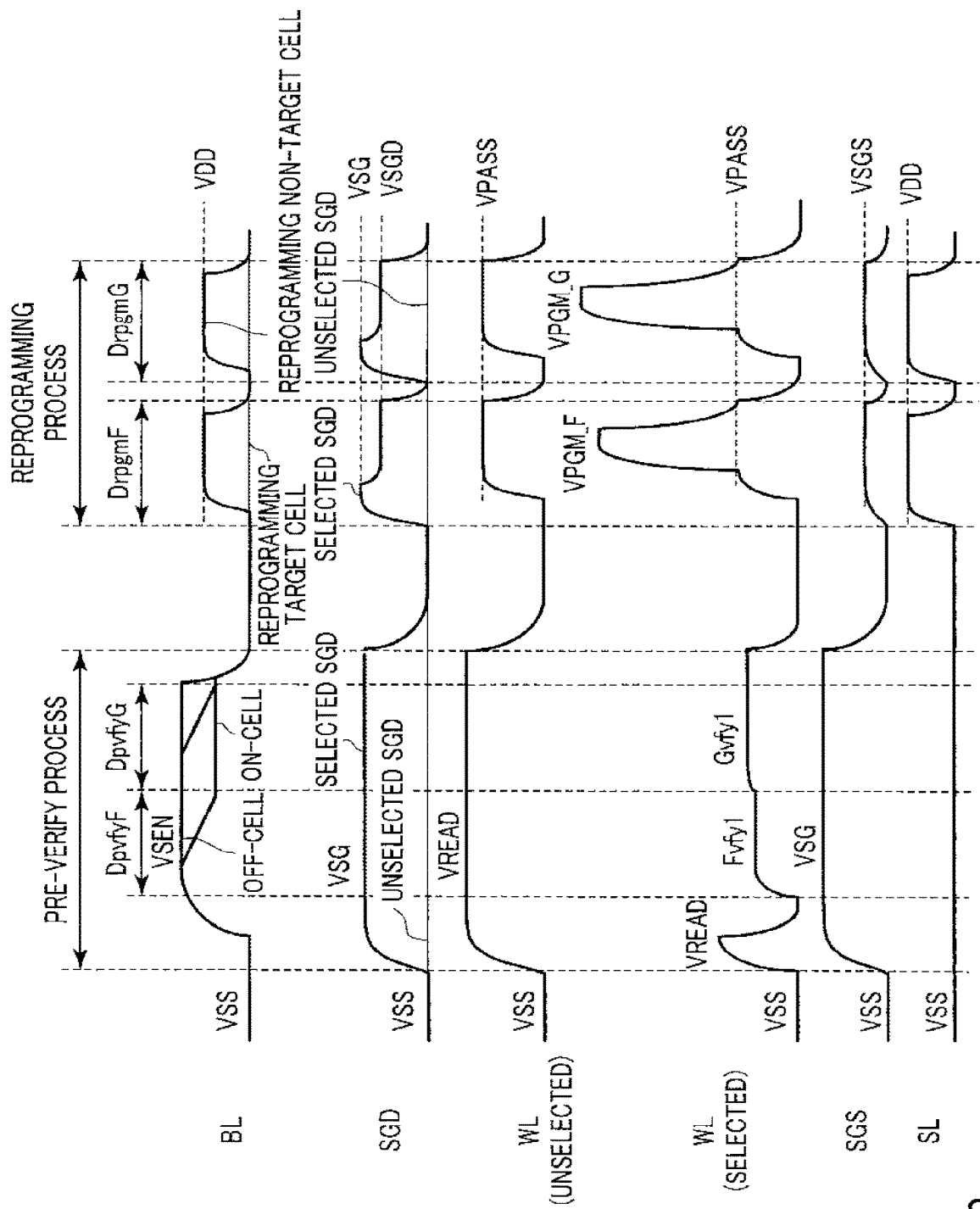
FIG. 28 is a timing chart to explain an example of the reprogramming refresh process in the memory system according to the second embodiment.

FIG. 28 is a timing chart to explain the reprogramming refresh process in the memory system according to the second embodiment. The basic configuration for FIG. 28 is the same as that for FIG. 27.

As shown in FIG. 28, first, the NAND flash memory 100 performs an operation to specify a memory cell transistor MT to execute a reprogramming process in the pre-verify process with respect to each of the "F" and "G" states.

The period of the pre-verify process includes periods DpvfyF and DpvfyG during which the pre-verify processes for the "F" and "G" states are executed. Like a case of FIG. 23, the sequencer 170 extracts memory cell transistors MT whose expectation data are in the "F" state and which have passed the pre-verify process for the "F" state, and memory cell transistors MT whose expectation data are in the "G" state and which have passed the pre-verify process for the "G" state for their respective periods DpvfyF and DpvfyG. Then, the sequencer 170 performs a mask process for the latch circuit such that bit lines BL connected to the memory cell transistors MT that have passed the pre-verify processes for the "F" and "G" states are brought into a reprogramming inhibition state in the subsequent reprogramming process.

The period of the pre-verify process shown in FIG. 28 does not include periods (e.g. periods DpvfyA to DpvfyE) during which the pre-verify processes for the other states are executed. Thus, when the period of the pre-verify process ends, the sequencer 170 performs a mask process for the latch circuit such that all bit lines BL connected to the memory cell transistors MT with expectation data in the "A" to "E" states, for which no pre-verify process is executed, are brought into a reprogramming inhibition state in the subsequent reprogramming process. Therefore, the reprogramming target can be limited to the memory cell transistors MT that have failed in the pre-verify processes for the "F" to "G" states.

Subsequently, as shown in FIG. 27, the NAND flash memory 100 uses a single program voltage for the reprogramming process for each of the "F" and "G" states.

The period of the reprogramming process includes periods DrpgmF and DrpgmG during which the reprogramming processes for the "F" and "G" states are executed, respectively. Thus, as in the case of FIG. 24, the sequencer 170 extracts memory cell transistors MT in which data corresponding to the "F" and "G" states is stored in the latch circuits ADL to CDL. Then, the sequencer 170 determines the extracted memory cell transistors MT for each of the "F" and "G" states to be a reprogramming process target during its corresponding one of the periods DrpgmF and DrpgmG and applies the voltage VSS to the corresponding bit lines BL to bring the memory cell transistors MT into a reprogrammable state. On the other hand, the sense amplifier SA determines the other memory cell transistors MT as not being a reprogramming process target and applies the voltage VDD to the bit lines BL connected to the memory cell transistors MT to bring the memory cell transistors MT into a reprogramming inhibition state. During the periods DrpgmF and DrpgmG, the row decoder 120 applies voltages VPGM_F and VPGM_G to the selected word line WL to increase the threshold voltage of the reprogramming process target memory cell transistors MT.

The foregoing operation makes it possible to execute the reprogramming refresh process only for the "F" and "G" states.

2.3. Advantages of Second Embodiment

According to the second embodiment, the memory controller 200 can designate a state to execute a reprogramming refresh process from the "A" to "G" states in response to a set feature command. Therefore, it can modify the threshold voltage distribution more precisely.

For example, a voltage close to the lowest voltage in high-voltage side lobes of the threshold voltage distribution (e.g. the "F" and "G" states) can be shifted greatly to a low-voltage side by variation factors. In this case, the memory controller 200 can instruct the NAND flash memory 100 to execute a reprogramming refresh process for the "F" and "G" states. If, therefore, a reprogramming refresh process is executed intensively for a state that is greatly influenced by the variation factors, a great improvement can be achieved by applying a small number of pulses.

The reprogramming refresh process involves reprogramming process of written data. Therefore, in the reprogramming refresh process for a memory cell transistor MT with a threshold voltage corresponding to a state on the high-voltage side, for example, the influence of unexpected write to cells connected to unselected word lines WL in the same block BLK might be increased to a non-negligible extent. In this case, the memory controller 200 can instruct the NAND flash memory 100 to execute a reprogramming refresh process for the "A" to "C" states, for example. It is thus possible to improve the threshold voltage distribution with a reduction in the influence of unexpected write to the other cells involved with the reprogramming process.

Even though the reprogramming refresh process is not executed for all of the "A" to "G" states, it is possible to expect an advantage of reducing the number of error bits for a plurality of pages read out of the memory cell transistors MT. For example, when a reprogramming process target is the "A" to "C" states, it is possible to expect an advantage of decreasing the number of error bits for all pages because the "A" state corresponds to the lower page, the "B" state corresponds to the middle page and the "C" state corresponds to the upper page.

3. Third Embodiment

A memory system according to a third embodiment will be described. The third embodiment differs from the first and second embodiments in that a reprogramming process is looped a plurality of times when a reprogramming refresh process is executed. The descriptions of the configurations and operations equivalent to those of the second embodiment will be omitted. The configurations and operations different from those of the second embodiment will chiefly be described.

3.1. Flowchart of Reprogramming Refresh Process

Figure 29:
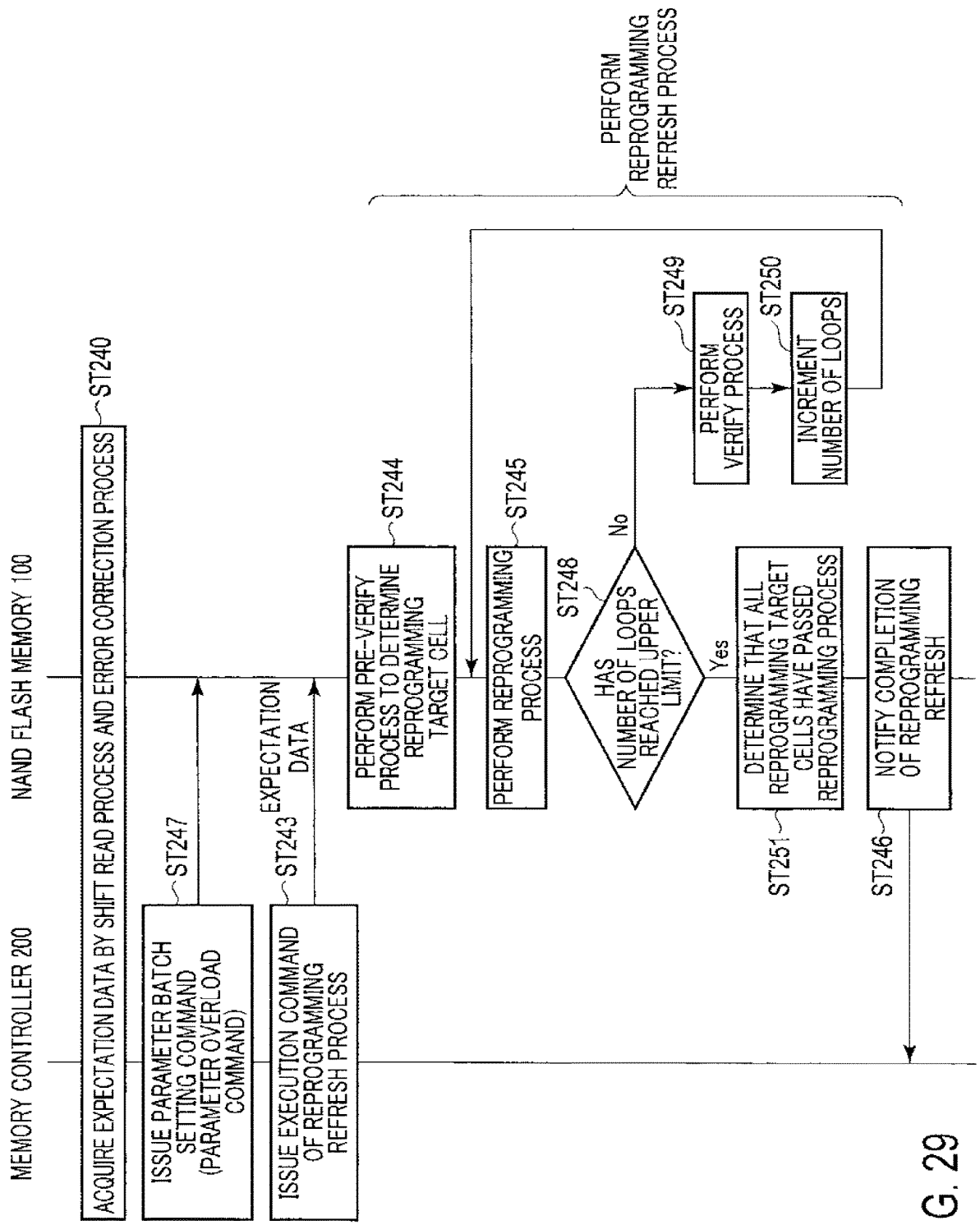
FIG. 29 is a flowchart to explain an overview of a reprogramming refresh process in a memory system according to a third embodiment.

First, an overview of the reprogramming refresh process in the memory system according to the third embodiment will be described with reference to the flowchart shown in FIG. 29, which corresponds to FIG. 18 of the first embodiment. In FIG. 29, step ST247 is executed in place of steps ST241 and ST242 shown in FIG. 18, and steps ST248 to ST251 are added between steps ST245 and ST246.

As shown in FIG. 29, step ST240 is the same as that of FIG. 18 and thus its description will be omitted. In step ST247, the memory controller 200 issues to the NAND flash memory 100 a command to make a batch setting of one or a plurality of parameters, which are applied to the subsequent reprogramming refresh process (also including parameters applied to the pre-verify process and the reprogramming process). That is, in response to the command, all parameters whose settings should be changed at the time of a reprogramming refresh process are set to the NAND flash memory 100 at a time. This parameter batch setting method is also called, for example, a parameter overload process.

The parameters set through the parameter overload process are not limited to the items of information shown in FIG. 25. Other types of parameters can be set.

Specifically, in the third embodiment, a plurality of program pulses can be applied to the same memory cell transistors MT in the reprogramming process as in the normal programming process. Thus, when no parameter is particularly set, it is likely that the same number of loop processes as in the normal programming process will be performed even in the reprogramming process, which is not favorable. In the parameter overload process, therefore, for example, the upper limit of the number of loops is set smaller than that in the normal programming process to make the number of program pulses applied in the reprogramming process smaller than that in the normal programming process. Accordingly, unintentional over-programming can be suppressed.

If the upper limit of the number of loops is set smaller than that in the normal programming process, the reprogramming process is terminated forcibly due to the number of loops that is smaller than usual; thus, a threshold voltage of some memory cell transistors MT might not increase to a verify voltage (i.e., the status of the programming process fails). Since the third embodiment allows such a memory cell transistor MT in which the status of the programming process fails, it is desirable that the status fail be considered as the status pass after the reprogramming refresh process is finished. In the parameter overload process, therefore, for example, the program fail may be considered as the program pass forcibly after the reprogramming refresh process.

Below is a case where the foregoing upper limit of the number of loops, release of status fail of the programming process, etc. are set at a time through the parameter overload process in step ST247.

Since steps ST243 to ST245 are the same as those in FIG. 18, their descriptions will be omitted.

In step ST248, the NAND flash memory 100 determines whether the number of loops in the reprogramming process has reached the upper limit. When the number of loops does not reach the upper limit (No in step ST248), the NAND flash memory 100 determines that the reprogramming process continues to be executed, and the process proceeds to step ST249. On the other hand, when the number of loops reaches the upper limit (Yes in step ST248), the NAND flash memory 100 determines that the reprogramming process is not executed any more, and the process proceeds to step ST251.

In step ST249, the NAND flash memory 100 executes a verify process for the memory cell transistors MT for which the reprogramming process has been executed in step ST245. The verify process is a process to determine whether each of the threshold voltages of the write target memory cell transistors MT has reached a verify voltage to determine whether the memory cell transistors MT have been programmed. Thus, memory cell transistors MT for which the reprogramming process is executed in the next loop are identified. Subsequently, in step ST250, the NAND flash memory 100 increments the number of loops and returns the process to step ST245. The process proceeds to the next loop.

In step ST251, the NAND flash memory 100 releases the status fail of the programming process of the reprogramming process target memory cell transistors MT and determines that the programming processes of all the memory cell transistors MT have passed. As will be described later, in a case where the verify process is not omitted after step ST248, the status fail may be released only if the status fail occurs.

In step ST246, the NAND flash memory 100 notifies the memory controller 200 of the completion of the reprogramming refresh process.

The reprogramming refresh process is thus finished.

3.2. Command Sequence

Below is a description of a sequence of commands for the parameter overload process issued by the memory controller 200.

Figures 30, 31:
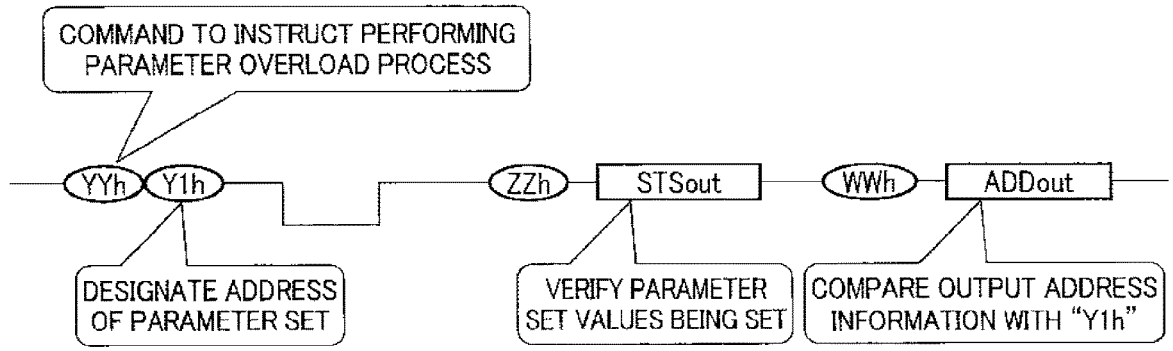
FIG. 30 is a command sequence to explain a parameter overload process in the reprogramming refresh process in the memory system according to the third embodiment.
FIG. 31 is a conceptual diagram to explain an example of a sequence of the reprogramming refresh process in the memory system according to the third embodiment.

FIG. 30 shows a command sequence to explain the parameter overload process in the memory system according to the third embodiment.

As shown in FIG. 30, the memory controller 200 transmits a command "YYh" to the NAND flash memory 100. The command "YYh" is a command to declare the parameter load process on the NAND flash memory 100. Then, the memory controller 200 transmits an address "Y1h." The address "Y1h" is an address to designate a register that stores a plurality of sets each including one or a plurality of set values to be changed by a parameter overload command. Since the register stores a set of set values in advance, the NAND flash memory 100 can change the settings of one or a plurality of parameters included in each of the sets at a time in response to the designated address. When the change in settings is completed, the sequencer 170 sets a signal RBn at an "H" level and notifies the memory controller 200 that the NAND flash memory 100 is in a ready state.

Subsequently, the memory controller 200 issues a command "ZZh" and transmits it to the NAND flash memory 100. The command "ZZh" is a command to provide an instruction to output a status indicating whether the change in setting of the NAND flash memory 100 is successfully completed. Upon receipt of the command "ZZh," the NAND flash memory 100 transmits to the memory controller 200 a status signal STSout indicating whether the change in setting of a set of parameters is successfully completed through the parameter overload process.

When the memory controller 200 confirms that the status signal STSout indicates a successful completion, it issues a command "WWh" and transmits it to the NAND flash memory 100. The command "WWh" is a command to provide an instruction to output an address of the register that stores a set of parameters whose settings have been changed. Upon receipt of the command "WWh," the NAND flash memory 100 transmits to the memory controller 200 an address ADDout of the register that stores a set of parameters currently applied through the parameter overload process.

The memory controller 200 compares the address ADDout and the address "Y1h" designated when the memory controller 200 provides an instruction to execute the parameter overload process to confirm whether they coincide with each other. When the memory controller 200 confirms that they coincide with each other, it determines that it has succeeded in the parameter overload process and performs the subsequent operations.

The parameter overload process is thus finished.

3.3. Timing Chart

A timing chart in the reprogramming refresh process in the memory system according to the third embodiment will be described using some examples.

3.3.1. Case where "A" to "C" States are Designated

First, a case where memory cell transistors MT with expected values in the "A" to "C" states are designated as targets for the reprogramming refresh process will be described.

FIG. 31 is a conceptual diagram to explain a sequence of reprogramming refresh process targeting the "A" to "C" states target in the memory system according to the third embodiment. FIG. 31 shows a case where the upper limit of the number of loops of a reprogramming process is set to four. FIG. 31 also shows an example of the level of a voltage applied to the selected word line WL when a pre-verify process and a verify process are executed.

As shown in FIG. 31, in the pre-verify process, verify voltages corresponding to all of the states designated as a reprogramming refresh process target are applied. That is, in the example of FIG. 31, verify voltages corresponding to the "A" to "C" states are applied in the pre-verify process.

In the first loop, for example, a verify process targeting the "A" state is executed. In the second loop, for example, a verify process targeting the "A" and "B" states is executed. In the third loop, for example, a verify process targeting the "B" and "C" states is executed. In the fourth loop, since the number of loops reaches the upper limit, only the reprogramming process is executed and no verify process is executed. Since, furthermore, the "D" to "G" states are not targets for the reprogramming refresh process, no verify process is executed all over the loops.

Thus, when the low-voltage side including the "A" state is a reprogramming refresh process target, a state targeted for the verify process for each of the loops can be set to the same as in the normal program loop. Note that the example of FIG. 31 is just an example, and a state targeted for the verify process for each of the loops can be set selectively through, for example, the parameter overload process.

FIG. 32 is a timing chart illustrating a reprogramming refresh process targeting the "A" to "C" states in the memory system according to the third embodiment. The timing chart of FIG. 32 corresponds to a pre-verify process, a first-loop reprogramming process and verify process, and a second-loop reprogramming process in the sequence of the reprogramming refresh process shown in FIG. 31.

As shown in FIG. 32, first, the NAND flash memory 100 performs an operation to specify memory cell transistors MT for which a reprogramming process is executed in the pre-verify process, with respect to the "A" to "C" states.

Since the pre-verify process is the same as that shown in FIG. 27 of the second embodiment, its description will be omitted.

Then, the NAND flash memory 100 executes a reprogramming process including a plurality of loops. In the reprogramming process, a program voltage common to the memory cell transistors MT in the "A" to "C" states is stepped up for each of the loops.

During a first-loop reprogramming period, when data in the latch circuits ADL to CDL is not masked by data "111" corresponding to the "Er" state, the sense amplifier SA applies a voltage VSS to its corresponding bit line BL to bring it into a reprogrammable state. When data in the latch circuits ADL to CDL is masked by the data "111," the sense amplifier SA applies a voltage VDD to its corresponding bit line BL to bring it into a reprogramming inhibition state. Then, the row decoder 120 applies a voltage VPGM_A to the selected word line WL. Thus, the reprogramming process using a common voltage VPGM_A is executed for all the memory cell transistors MT that have failed in the pre-verify process.

Then, a first-loop verify process is executed. During the first-loop verify process period, the row decoder 120 applies, for example, a voltage Avfy (namely, a default verify voltage corresponding to the "A" state) to the selected word line WL. The sequencer 170 strobes data while applying the voltage Avfy to the selected word line WL and determines whether memory cell transistors MT in which data "110"

corresponding to the "A" state is stored in the latch circuits ADL to CDL, have passed or failed the verify process. Then, the sequencer 170 executes a mask process for the latch circuits ADL to CDL such that bit lines BL connected to the memory cell transistors MT that have passed the verify process are brought into a reprogram inhibition state during the subsequent reprogramming process.

Then, a second-loop reprogramming process is executed. During the second-loop reprogramming process period, when data in the latch circuits ADL to CDL is not masked by data "111" corresponding to the "Er" state, the sense amplifier SA applies a voltage VSS to its corresponding bit line BL to bring it into a reprogrammable state. When data in the latch circuits ADL to CDL is masked by the data "111," the sense amplifier SA applies a voltage VDD to its corresponding bit line BL to bring it into a reprogramming inhibition state. Then, the row decoder 120 applies a voltage VPGM_A+ΔVPGM to the selected word line WL. The voltage ΔVPGM is a voltage that is equal to a voltage added for each loop during the normal programming process. Thus, the reprogramming process using the voltage VPGM_A+ ΔVPGM is executed for all the memory cell transistors MT that have failed in the pre-verify process.

As described above, when the NAND flash memory 100 executes the pre-verify process, it repeats the loop of the reprogramming process and the verify process, and executes only the reprogramming process in the final loop.

Note that since no verify process is executed in the final loop as described above, memory cell transistors MT for which the status of the verify process is failing may be present. Thus, when the sequencer 170 finishes the reprogramming process of the final loop, it releases the status of fail of the verify process. The reprogramming refresh process is thus finished.

3.3.2. Case where "F" and "G" States are Designated

Next, a case where memory cell transistors MT with expected values in the "F" and "G" states are designated as targets for the reprogramming refresh process will be described.

FIG. 33 is a table to explain a reprogramming refresh process targeting the "F" and "G" states in the memory system according to the third embodiment. Like FIG. 31, FIG. 33 shows a case where the upper limit of the number of loops of a reprogramming process is set to four. FIG. 33 also shows an example of the level of a voltage applied to the selected word line WL when a pre-verify process and a verify process are executed.

As shown in FIG. 33, in the pre-verify process, verify voltages corresponding to all the states designated as a reprogramming refresh process target are applied. That is, in the example of FIG. 33, verify voltages corresponding to the "F" and "G" states are applied in the pre-verify process.

In the first to third loops, for example, an "F" and "G" states target verify process is executed. In the fourth loop, since the number of loops reaches the upper limit, only the reprogramming process is executed and no verify process is executed. Since, furthermore, the "A" to "E" states are not targets for the reprogramming refresh process, no verify process is executed all over the loops.

As described above, it is likely that the threshold voltage distribution on a high-voltage side such as the "F" and "G" states may vary more greatly than that on a low-voltage side such as the "A" state due to variation factors. Thus, when the high-voltage side threshold voltage distribution is a reprogramming refresh process target as shown in FIG. 33, a pre-verify process may be executed for all the states of the reprogramming process in each of the loops. Note that the example of FIG. 33 is just an example, and a state targeted for the verify process for each of the loops can be set selectively through the parameter overload process.

FIG. 34 is a timing chart to explain a reprogramming refresh process targeting the "F" and "G" states in the memory system according to the third embodiment. The timing chart of FIG. 34 corresponds to a pre-verify process, a first-loop reprogramming process and verify process, and a second-loop reprogramming process in the sequence of the reprogramming refresh process shown in FIG. 33.

As shown in FIG. 34, first, the NAND flash memory 100 performs an operation to specify memory cell transistors MT for which a reprogramming process is executed in the pre-verify process, with respect to the "F" and "G" states.

The pre-verify process is the same as that shown in FIG. 28 of the second embodiment. That is, the sequencer 170 extracts memory cell transistors MT whose expectation data are in the "F" state and which have passed the pre-verify process for the "F" state, and memory cell transistors MT whose expectation data are in the "G" state and which have passed the pre-verify process for the "G" state. Then, the sequencer 170 performs a mask process for the latch circuits such that bit lines BL connected to the memory cell transistors MT that have passed the pre-verify processes for the "F" and "G" states are brought into a reprogramming inhibition state in the subsequent reprogramming process. The sequencer 170 also performs a mask process for the latch circuits such that all bit lines BL connected to the memory cell transistors MT with expectation data in the "A" to "E" states are brought into a reprogramming inhibition state in the subsequent reprogramming process. Therefore, a reprogramming process target can be limited to the memory cell transistors MT whose expectation data in the "F" state and which have failed in the pre-verify process for the "F" state and the memory cell transistors MT whose expectation data in the "G" state and which have failed in the pre-verify process for the "G" state.

Then, the NAND flash memory 100 executes a reprogramming process including a plurality of loops. In the reprogramming process, a program voltage common to the memory cell transistors MT in the "F" and "G" states is stepped up for each of the loops.

During a first-loop reprogramming process period, when data in the latch circuits ADL to CDL is not masked by data "111" corresponding to the "Er" state, the sense amplifier SA applies a voltage VSS to its corresponding bit line BL to bring it into a reprogrammable state. When data in the latch circuits ADL to CDL is masked by the data "111," the sense amplifier SA applies a voltage VDD to its corresponding bit line BL to bring it into a reprogramming inhibition state. Then, the row decoder 120 applies a voltage VPGM_F to the selected word line WL. Thus, the reprogramming process using a common voltage VPGM_F is executed for all the memory cell transistors MT that have failed in the pre-verify process, among the memory cell transistors MT having the "F" or "G" state as expectation data.

Then, a first-loop verify process is executed. During the first-loop verify process period, the row decoder 120 applies, for example, a voltage Fvfy (namely, a default verify voltage corresponding to the "F" state) to the selected word line WL. The sequencer 170 strobes data while applying the voltage Fvfy to the selected word line WL and determines whether memory cell transistors MT in which data "001" corresponding to the "F" state is stored in the latch circuits ADL to CDL, have passed or failed the verify process. Similarly, the sequencer 170 strobes data while applying the voltage Gvfy to the selected word line WL and determines whether memory cell transistors MT in which data "101" corresponding to the "G" state is stored in the latch circuits ADL to CDL, have passed or failed the verify process. Then, the sequencer 170 executes a mask process for the latch circuits ADL to CDL such that bit lines BL connected to the memory cell transistors MT that have passed the verify process are brought into a reprogram inhibition state during the subsequent reprogramming process.

Then, a second-loop reprogramming process is executed. During the second-loop reprogramming process period, when data in the latch circuits ADL to CDL is not masked by data "111" corresponding to the "Er" state, the sense amplifier SA applies a voltage VSS to its corresponding bit line BL to bring it into a reprogrammable state. When data in the latch circuits ADL to CDL is masked by the data "111," the sense amplifier SA applies a voltage VDD to its corresponding bit line BL to bring it into a reprogramming inhibition state. Then, the row decoder 120 applies a voltage VPGM_F+ΔVPGM to the selected word line WL. Thus, the reprogramming process using the voltage VPGM_F+ΔVPGM is executed for all the memory cell transistors MT that have failed in the pre-verify process, among the memory cell transistors MT having the "F" or "G" state as expectation data.

As described above, when the NAND flash memory 100 executes the pre-verify process, it repeats the loop of the reprogramming process and the verify process, and executes only the reprogramming process in the final loop.

Note that since no verify process is executed in the final loop as described above, memory cell transistors MT for which the status of the verify process is failing may be present. Thus, when the sequencer 170 finishes the reprogramming process of the final loop, it releases the status of fail of the verify process. The reprogramming refresh process is thus finished.

The foregoing example is directed to the case where the NAND flash memory 100 does not perform the verify process in the final loop. In the final loop, however, the NAND flash memory 100 may perform the verify process after the reprogramming process in order to reduce the number of changes from the normal program process.

3.4. Advantages of Third Embodiment

According to the third embodiment, the memory controller 200 instructs the NAND flash memory 100 about the upper limit of the number of loops of the reprogramming process, the setting to release a status of fail of the verify process, etc. in addition to the correction amount of a voltage applied to the selected word line WL during the pre-verify process and the reprogramming process. The NAND flash memory 100 can thus apply a plurality of pulses to one memory cell transistor MT for the reprogramming process while stepping up the pulses. Therefore, the NAND flash memory 100 can perform a reprogramming process in consideration of, for example, variations in write characteristics among the memory cell transistors MT, which can improve the accuracy of the reprogramming process.

When various parameters should be set to the NAND flash memory 100, the memory controller 200 issues a parameter overload command to allow the parameters to be set at a time. Even though the number of parameters to be set increases, it is possible to suppress the increase in the number of times a set feature command is issued and reduce the load of the memory controller 200.

4. Others

The first, second and third embodiments described above are not restrictive. Various modifications may be applied as appropriate.

For example, in the first and second embodiments, the parameters for use in the reprogramming refresh process are set to the NAND flash memory 100 according to a set feature command; however, a parameter overload command may be used. In the third embodiment, a parameter overload command is used; however, a set feature command may be used alone or both a parameter overload command and a set feature command may be used in combination. The parameters to be set are not limited to those described in the third embodiment, but, for example, the correction amount of voltage applied to the unselected word lines WL and the p-type well region 10 can be set as appropriate.

Furthermore, the second and third embodiments are directed to the case where the reprogramming refresh process is executed for adjacent states of the "A" to "G" states. However, the memory controller 200 may provide an instruction about a reprogramming refresh process with respect to non-adjacent states such as the "A" and "E" states, the "C" and "G" states or the like. More specifically, the foregoing set of states may correspond to a specific page of one of the upper, middle and lower pages. That is, when the set of states corresponds to the middle page, the "B" state, "D" state and "F" state may be selected as reprogramming refresh process targets, and when the set of states corresponds to the upper page, the "C" state and "G" state may be selected as reprogramming refresh process targets.

The third embodiment is directed to the case where a default verify voltage (e.g. voltage Avfy) is applied during the verify process. However, for example, the verify voltage during the verify process may be shifted from the default value as in the case where the verify voltage applied during the pre-verify process is shifted in the first embodiment. In this case, the shift amount may be equal to that in the pre-verify process, and the verify voltage during the verify process may be equal to the verify voltage during the pre-verify process.

The third embodiment is also directed to the case where the verify process is not performed in the final loop. However, it may be performed in the final loop.

While certain embodiments have been described, these embodiments have been presented by way of example only, and are not intended to limit the scope of the inventions. Indeed, the embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit.

What is claimed is:

1. A method of controlling a nonvolatile memory, the nonvolatile memory including a plurality of blocks, each of the blocks including a plurality of groups and each of the groups including a plurality of memory cells, the method comprising:

determining to execute a first refresh process if a first group satisfies a first condition and a second condition, the first refresh process including reprogramming at least one second memory cell among a plurality of first memory cells to which data has been programmed, the plurality of first memory cells being in the first group in a first block, the first condition including a condition that a first value of the first group exceeds a first threshold value, the second condition including a condition that a second value of the first group is not larger than a third threshold value; and determining to execute a second refresh process if the first group satisfies the first condition and does not satisfy the second condition.

2. The method of claim 1, wherein the second refresh process includes relocating data in the first block to a second block.

3. The method of claim 2, wherein the second block is a block in an erased state.

4. The method of claim 2, herein the second block is different from the first block.

5. The method of claim 1, wherein the second refresh process includes erasing data from the first block after reading data out of the first block, and writing the read data to the first block.

6. The method of claim 1, wherein:
the first value of the first group is same as the second value of the first group; and
the third threshold value is lamer than the first threshold value.

7. The method of claim 1, wherein the second value includes a number of times a read process of reading data out of the plurality of first memory cells is executed until an error detected in the plurality of first memory cells is corrected.

8. The method of claim 1, wherein the second value includes a number of memory cells included in the first memory cells having a threshold voltage within a predetermined range.

9. The method of claim 8, wherein the predetermined range is set between peaks of adjacent two states among a plurality of states of threshold voltages formed by the plurality of first memory cells.

10. The method of claim 1, wherein the second value includes a number of error bits of data read out of the plurality of first memory cells or an error correction result of data read out of the plurality of first memory cells.

11. The method of claim 10, wherein the error bits are detected between two adjacent states among a plurality of states of threshold voltages formed by the first memory cells.

12. The method of claim 1, wherein the second value includes a number of times the first refresh process tier the first group has been executed since the second refresh process for the first group is executed.

13. The method of claim 1, wherein each of the plurality of groups is a unit of data programming.

14. The method of claim 1, wherein each of the plurality of groups is smaller than a unit of a data erase.

15. A method of controlling a nonvolatile memory, the nonvolatile memory including a memory cell array, the memory cell array including a plurality of memory cells, each of the plurality of memory cells being configured to store data in accordance with a threshold voltage thereof, the method comprising:
in executing a first refresh process, the first refresh process including reprogramming at least one second memory cell among a plurality of first memory cells to which data has been programmed,
selecting the second memory cell from the plurality of first memory cells by verifying that a threshold voltage of the second memory cell is a voltage obtained by shifting a first voltage by a first correction amount in a case that the second memory cell has been programmed using the first voltage; and
selecting the second memory cell from the plurality of first memory cells by verifying that the threshold voltage of the second memory cell is a voltage obtained by shifting a second voltage by a second correction amount in a case that the second memory cell has been programmed using the second voltage.

16. The method of claim 15, further comprising:
specifying first information including data associated with the first correction amount and the second correction amount based on a first command set to execute the first refresh process; and
selecting the second memory cell from the plurality of first memory cells by using the first information.

17. The method of claim 16, further comprising:
specifying second information including an address of the plurality of first memory cells and third information indicating data programmed to the plurality of first memory cells based on the first command set; and
specifying locations of the plurality of first memory cells in the memory cell array based on the second information and executing the first refresh process for the second memory cell using the third information.

18. The method of claim 17, further comprising:
in executing the first refresh process,
reprogramming the second memory cell using a third correction amount when the second memory cell is programmed using the first voltage; and
reprogramming the second memory cell using a fourth correction amount when the second memory cell is programmed using the second voltage.

19. The method of claim 18, further comprising:
specifying fourth information indicating data associated with the third correction amount and the fourth correction amount based on the first command set; and
executing the first refresh process for the second memory cell using the third information and the fourth information.

20. The method of claim 17, further comprising:
specifying fifth information indicating data associated with an upper limit of a number of program pulses to be applied to the second memory cell based on the first command set; and
in executing the first refresh process, inhibiting program pulses of the number which exceeds the upper limit from being applied to the second memory cell based on the fifth information.

21. The method of claim 15, wherein the first voltage corresponds to a first state and the second voltage corresponds to a second state, and
the method further comprises:
in executing the first refresh process,
selecting at least one third memory cell to which data has been programmed using a third voltage corresponding to a third state different from the first state and the second state; and
selecting the second memory cell from the plurality of first memory cells excluding selected third memory cell.

22. The method of claim 21, wherein the first refresh process includes inhibiting at least the third memory cell of the plurality of first memory cells from being reprogrammed.

23. The method of claim 15,
wherein the memory cell array includes a plurality of groups, each of the plurality of groups includes a plurality of memory cells and is a unit of data programming,
wherein a first group among the plurality of groups includes the first memory cells.

* * * * *

UNITED STATES PATENT AND TRADEMARK OFFICE
CERTIFICATE OF CORRECTION

PATENT NO. : 11,004,523 B2  
APPLICATION NO. : 17/007596  
DATED : May 11, 2021  
INVENTOR(S) : Riki Suzuki et al.

Page 1 of 1

It is certified that error appears in the above-identified patent and that said Letters Patent is hereby corrected as shown below:

On the Title Page

Item (73), should read:  
--Toshiba Memory Corporation, Minato-ku (JP)--

Signed and Sealed this  
Second Day of November, 2021

Drew Hirshfeld  
*Performing the Functions and Duties of the*  
*Under Secretary of Commerce for Intellectual Property and*  
*Director of the United States Patent and Trademark Office*